(12) United States Patent
Katayama et al.

(10) Patent No.: US 11,177,373 B2
(45) Date of Patent: Nov. 16, 2021

(54) METHOD FOR MANUFACTURING SEMICONDUCTOR DEVICE

(71) Applicant: Semiconductor Energy Laboratory Co., Ltd., Atsugi (JP)

(72) Inventors: Masahiro Katayama, Tochigi (JP); Masayoshi Dobashi, Shimotsuga (JP); Masataka Nakada, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 54 days.

(21) Appl. No.: 16/344,177

(22) PCT Filed: Oct. 25, 2017

(86) PCT No.: PCT/IB2017/056606
§ 371 (c)(1),
(2) Date: Apr. 23, 2019

(87) PCT Pub. No.: WO2018/083568
PCT Pub. Date: May 11, 2018

(65) Prior Publication Data
US 2019/0288092 A1    Sep. 19, 2019

(30) Foreign Application Priority Data
Nov. 3, 2016   (JP) .............................. JP2016-215737

(51) Int. Cl.
*H01L 29/66* (2006.01)
*H01L 29/786* (2006.01)
(Continued)

(52) U.S. Cl.
CPC .... *H01L 29/66969* (2013.01); *H01L 27/1225* (2013.01); *H01L 27/1248* (2013.01);
(Continued)

(58) Field of Classification Search
None
See application file for complete search history.

(56) References Cited

U.S. PATENT DOCUMENTS 7,091,070 B2   8/2006  Imai et al.
7,732,262 B2   6/2010  Imai et al.
(Continued)

FOREIGN PATENT DOCUMENTS

CN   102890351 A   1/2013
CN   105474355 A   4/2016
(Continued)

OTHER PUBLICATIONS

International Search Report (Application No. PCT/IB2017/056606) dated Jan. 23, 2018.
(Continued)

*Primary Examiner* — David E Graybill
(74) *Attorney, Agent, or Firm* — Robinson IP Law Office, P.C.; Eric J. Robinson

(57) ABSTRACT

A semiconductor device is manufactured with high mass productivity at low cost. Yield in a manufacturing process of the semiconductor device is improved. An island-shaped metal oxide layer is formed over a substrate, a resin layer is formed over the metal oxide layer to cover an end portion of the metal oxide layer, and the metal oxide layer and the resin layer are separated by light irradiation. After forming the resin layer and before the light irradiation, an insulating layer is formed over the resin layer. For example, the resin layer is formed in an island shape and the insulating layer is formed to cover an end portion of the resin layer. In the case where an adhesive layer is formed over the resin layer, the adhesive layer is preferably formed to be located inward from the end portion of the metal oxide layer.

20 Claims, 29 Drawing Sheets

(51) Int. Cl.
   *H01L 51/00* (2006.01)
   *H01L 27/12* (2006.01)
   *H01L 27/32* (2006.01)

(52) U.S. Cl.
   CPC ...... *H01L 27/1266* (2013.01); *H01L 27/1288* (2013.01); *H01L 27/32* (2013.01); *H01L 29/7869* (2013.01); *H01L 29/78633* (2013.01); *H01L 51/003* (2013.01); *H01L 27/3232* (2013.01); *H01L 27/3244* (2013.01); *H01L 51/0097* (2013.01); *H01L 2227/323* (2013.01); *H01L 2251/303* (2013.01); *H01L 2251/566* (2013.01)

(56) References Cited

U.S. PATENT DOCUMENTS

| | | | | |
|---|---|---|---|---|
| 7,759,629 | B2* | 7/2010 | Yamazaki | H03F 3/08 250/214.1 |
| 9,280,007 | B2* | 3/2016 | Kim | G02F 1/133305 |
| 9,397,001 | B2* | 7/2016 | Tanaka | H01L 29/78603 |
| 9,437,832 | B2* | 9/2016 | Sakuishi | B32B 7/02 |
| 9,710,033 | B2* | 7/2017 | Yamazaki | G06F 3/044 |
| 9,735,398 | B2* | 8/2017 | Aoyama | H01L 51/0024 |
| 9,755,167 | B2* | 9/2017 | Yamazaki | H01L 51/0097 |
| 9,905,589 | B2* | 2/2018 | Yamazaki | H01L 29/78648 |
| 10,141,526 | B2* | 11/2018 | Sakuishi | B32B 17/00 |
| 10,189,048 | B2 | 1/2019 | Yamazaki et al. | |
| 10,331,247 | B2* | 6/2019 | Jinbo | G06F 1/1652 |
| 2008/0230682 | A1 | 9/2008 | Yamazaki et al. | |
| 2010/0282947 | A1 | 11/2010 | Yamazaki et al. | |
| 2013/0020731 | A1 | 1/2013 | Kim et al. | |
| 2015/0044792 | A1 | 2/2015 | Aoyama et al. | |
| 2015/0236280 | A1 | 8/2015 | Sakuishi et al. | |
| 2015/0248149 | A1* | 9/2015 | Yamazaki | G06F 1/263 361/679.27 |
| 2015/0292716 | A1* | 10/2015 | Yamazaki | H01L 51/0097 362/249.08 |
| 2015/0310793 | A1* | 10/2015 | Kawashima | G09G 3/3233 345/174 |
| 2015/0355763 | A1* | 12/2015 | Miyake | G06F 3/04166 345/174 |
| 2016/0103539 | A1* | 4/2016 | Jinbo | G06F 3/0446 345/173 |
| 2016/0155984 | A1* | 6/2016 | Yamazaki | H01L 51/524 257/40 |
| 2016/0172244 | A1 | 6/2016 | Tanaka | |
| 2016/0300865 | A1* | 10/2016 | Yamazaki | H01L 29/78675 |
| 2017/0092885 | A1 | 3/2017 | Sakuishi et al. | |
| 2019/0084003 | A1 | 3/2019 | Yamazaki et al. | |
| 2019/0288092 | A1* | 9/2019 | Katayama | H01L 27/1225 |

FOREIGN PATENT DOCUMENTS

| | | |
|---|---|---|
| DE | 112015000866 | 11/2016 |
| EP | 1453086 A | 9/2004 |
| JP | 2008-263182 A | 10/2008 |
| JP | 2014-048619 A | 3/2014 |
| JP | 2015-053479 A | 3/2015 |
| JP | 2015-173104 A | 10/2015 |
| JP | 2015-223823 A | 12/2015 |
| JP | 2016-115930 A | 6/2016 |
| KR | 2008-0085778 A | 9/2008 |
| KR | 2013-0010146 A | 1/2013 |
| KR | 2016-0040513 A | 4/2016 |
| KR | 2016-0124756 A | 10/2016 |
| TW | 200504847 | 2/2005 |
| TW | 201517140 | 5/2015 |
| TW | 201533790 | 9/2015 |
| TW | 201539779 | 10/2015 |
| TW | 2015-215611 A | 12/2015 |
| TW | 201604739 | 2/2016 |
| WO | WO-2015/019971 | 2/2015 |
| WO | WO-2015/087192 | 6/2015 |
| WO | WO-2015/125046 | 8/2015 |
| WO | WO-2015/162522 | 10/2015 |

OTHER PUBLICATIONS

Written Opinion (Application No. PCT/IB2017/056606) dated Jan. 23, 2018.
Taiwanese Office Action (Application No. 106137516) dated Mar. 23, 2021.

* cited by examiner

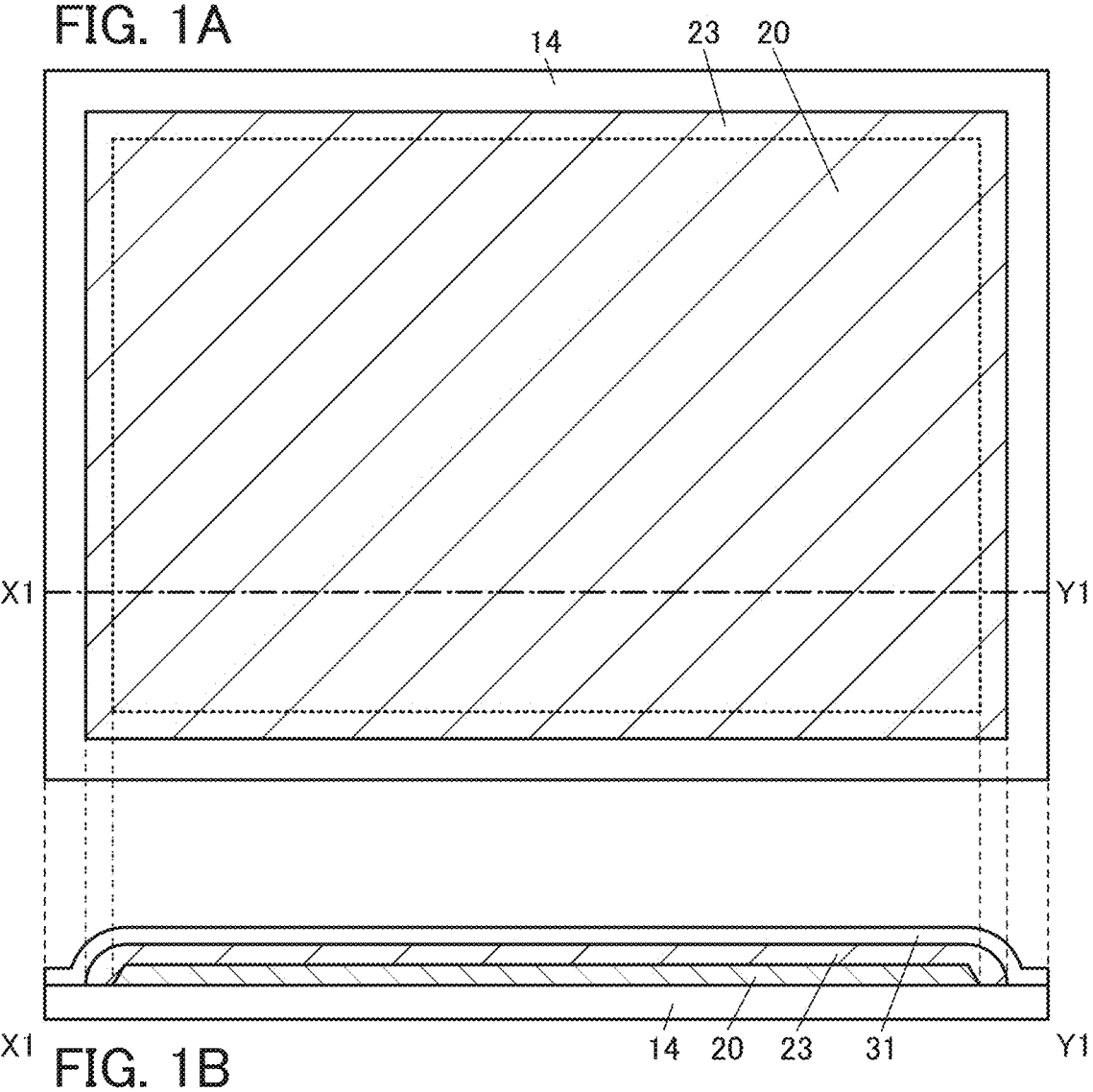

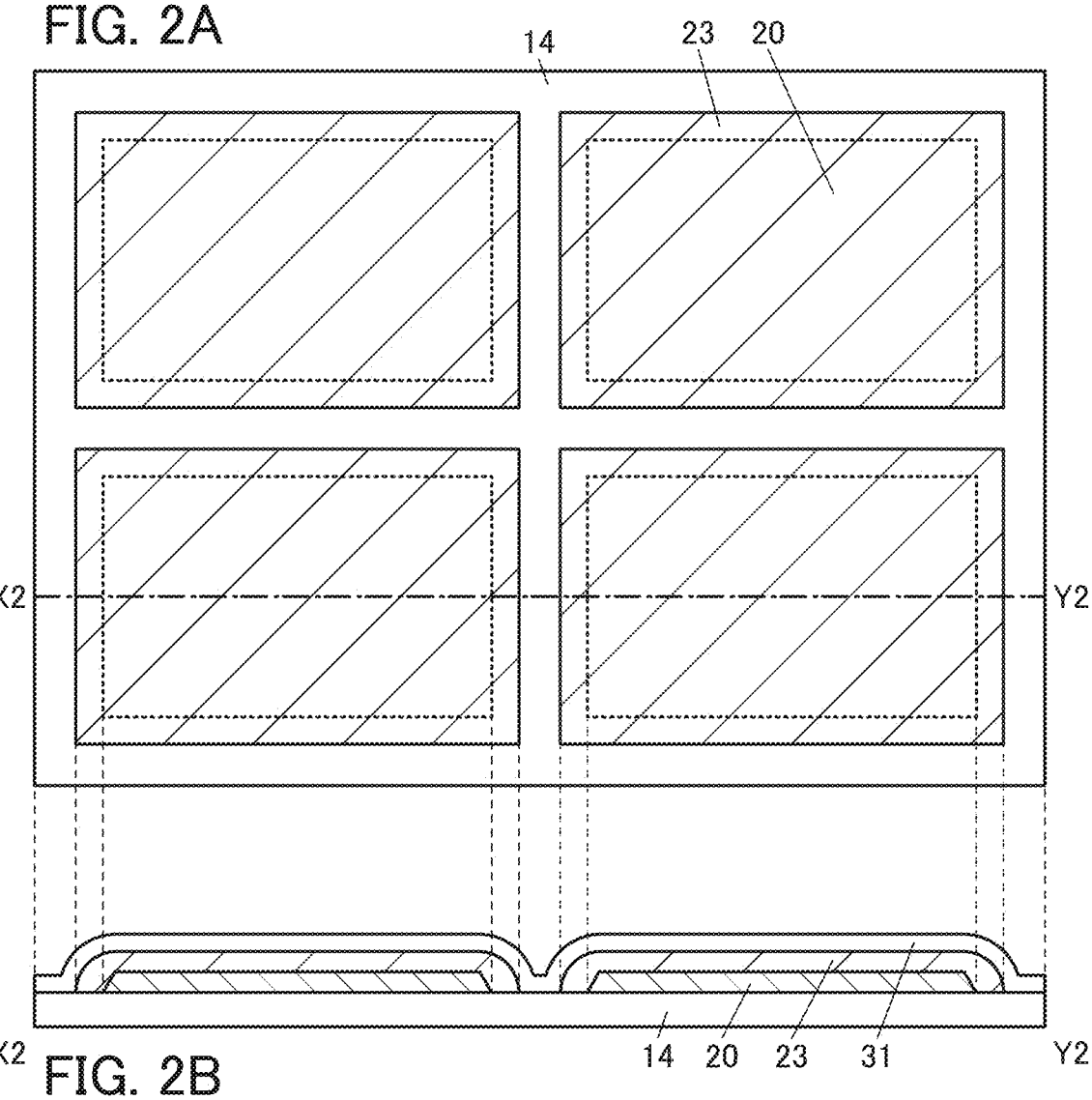

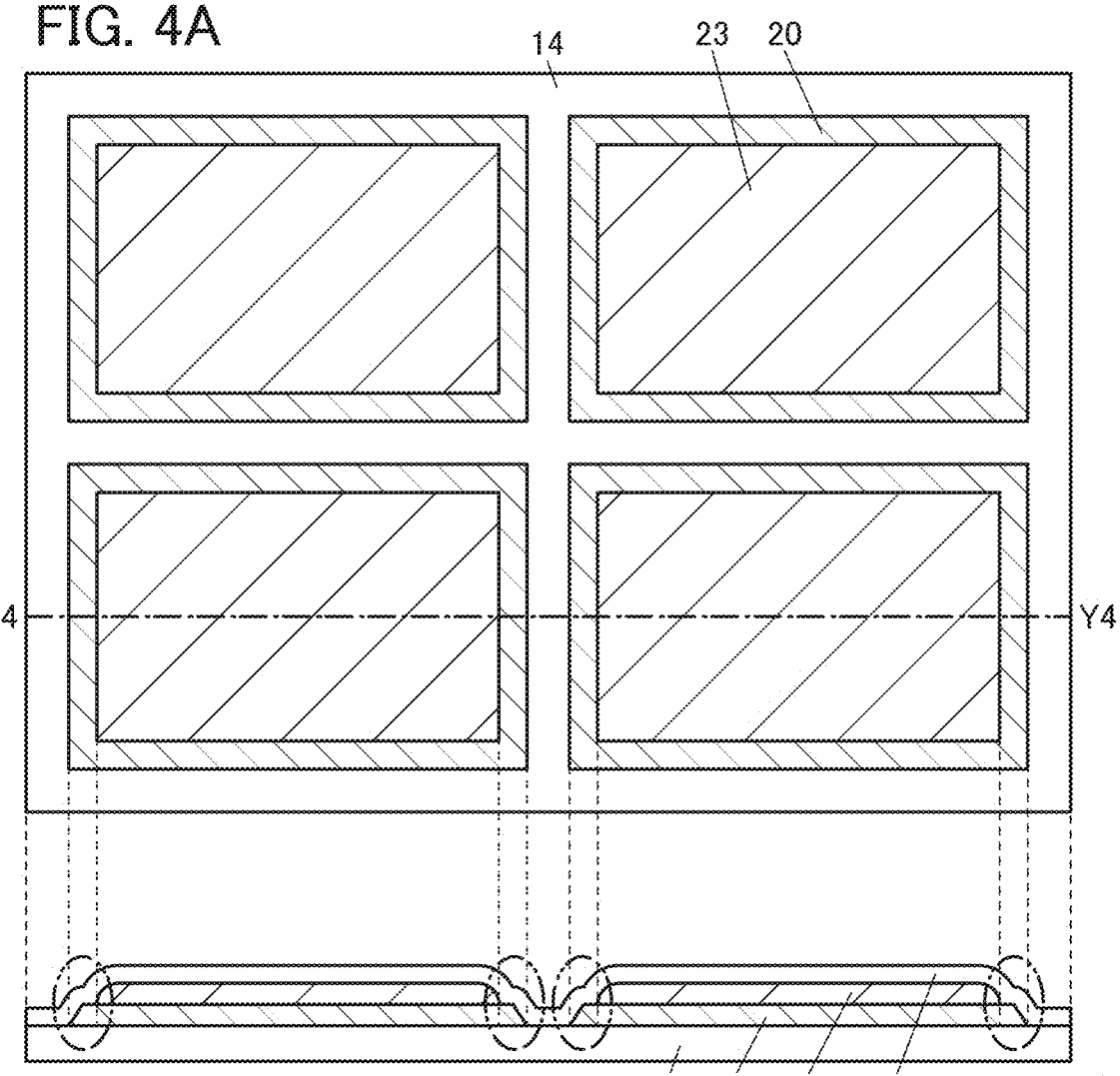

FIG. 5A1
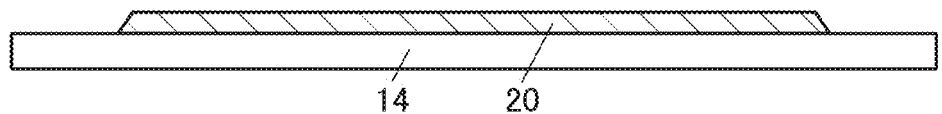
FIG. 5A2
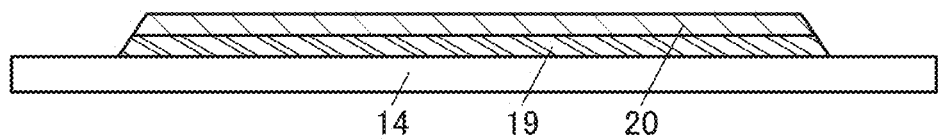
FIG. 5B
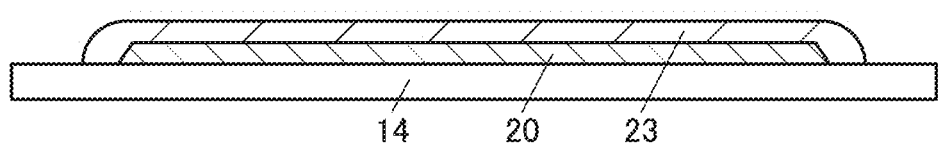
FIG. 5C
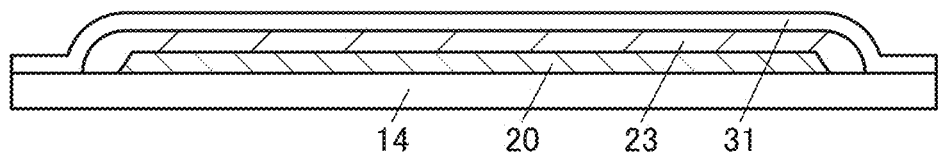
FIG. 5D1
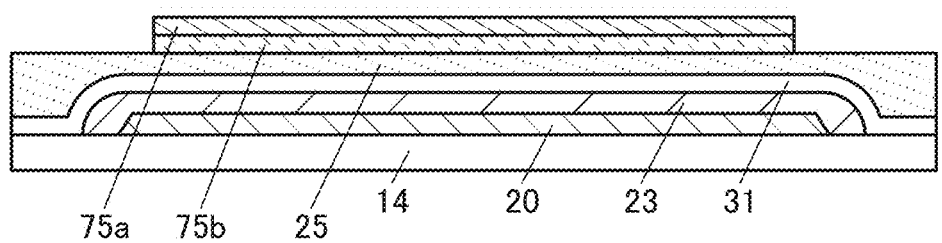
FIG. 5D2
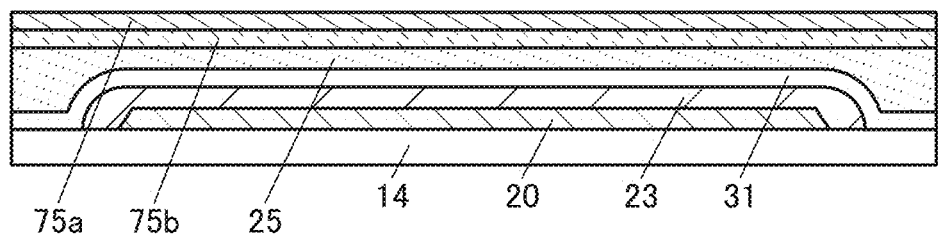

FIG. 9A
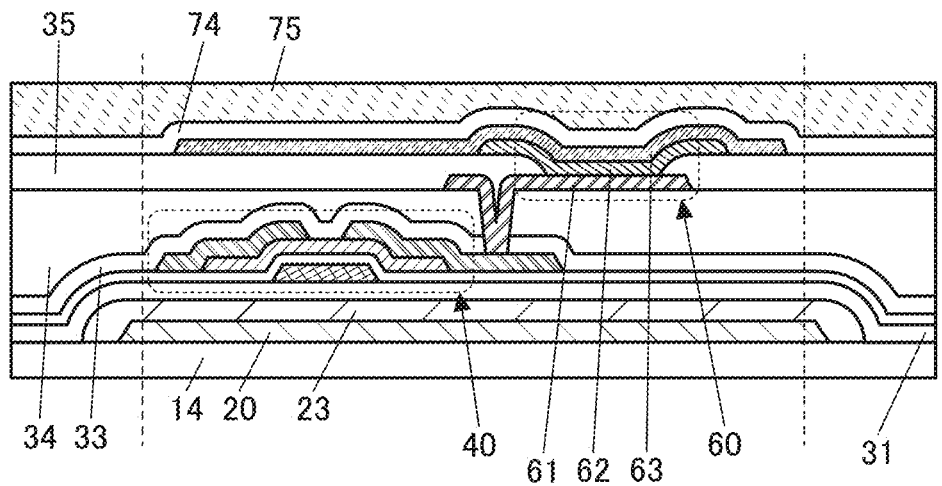
FIG. 9B1
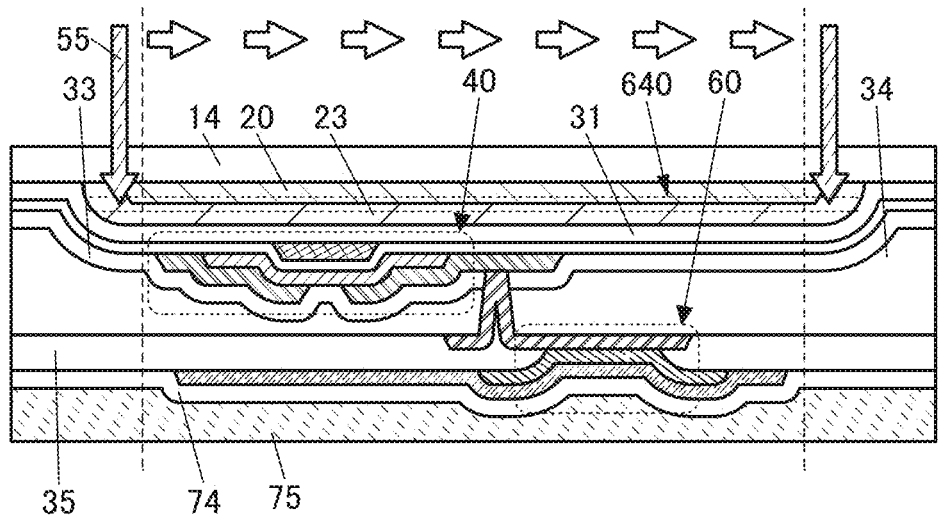
FIG. 9B2
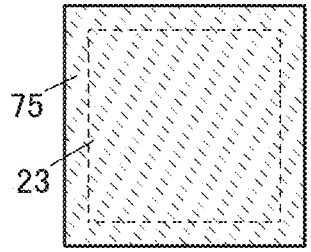
FIG. 9B3
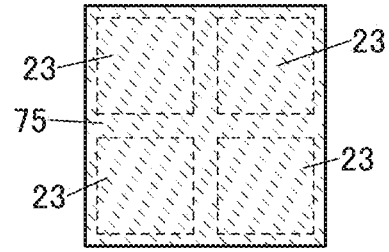
FIG. 9B4
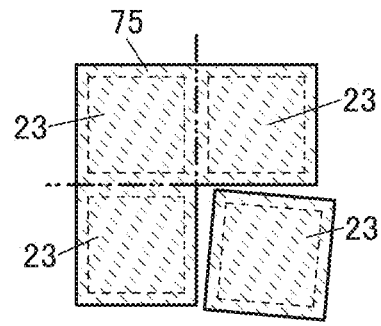

FIG. 14A
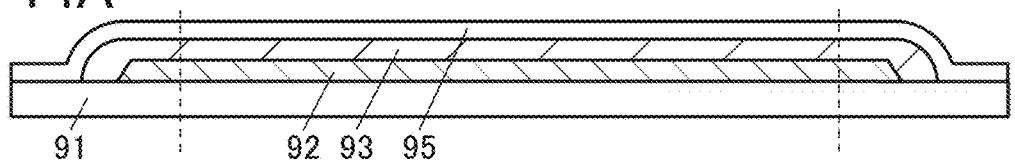
FIG. 14B
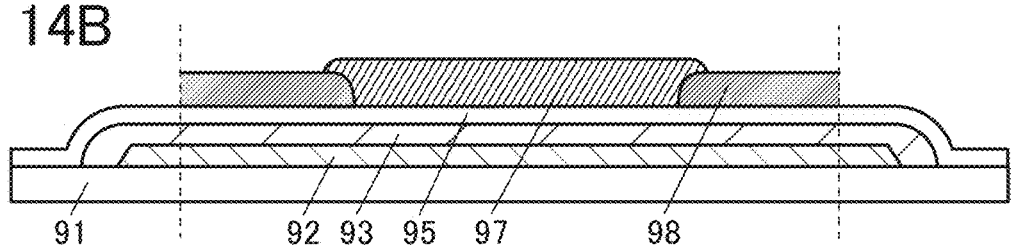
FIG. 14C1
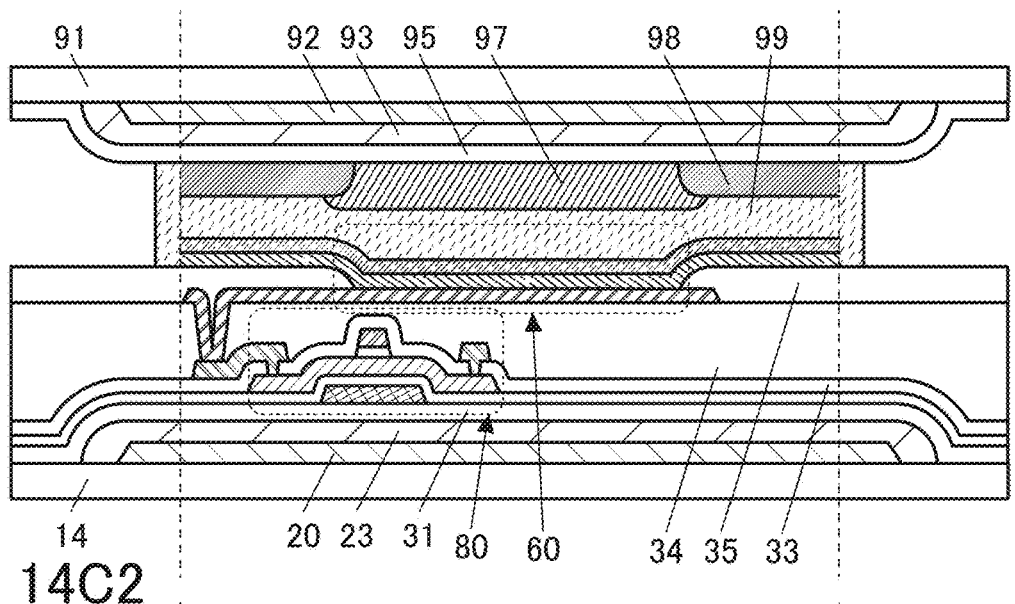
FIG. 14C2
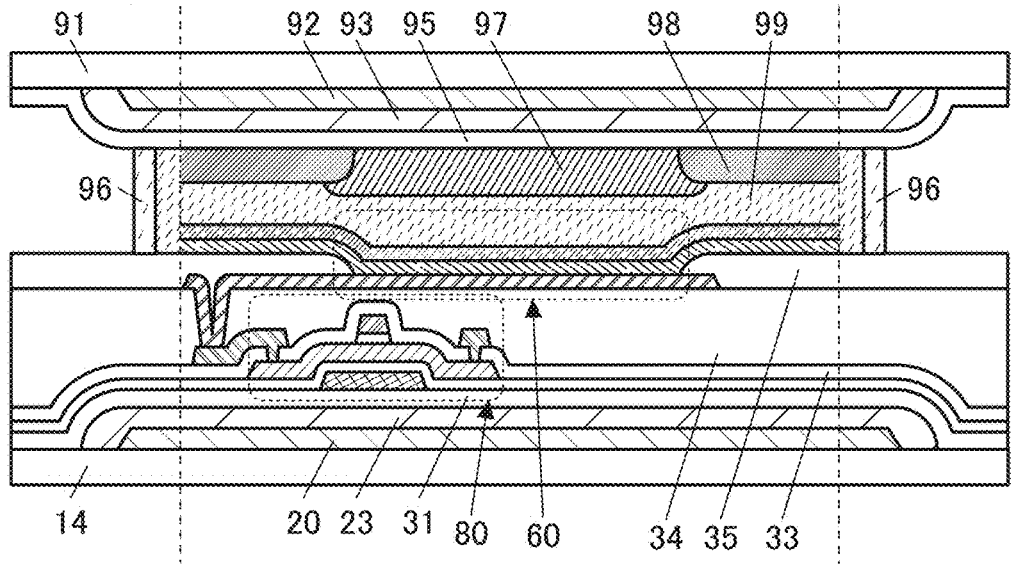

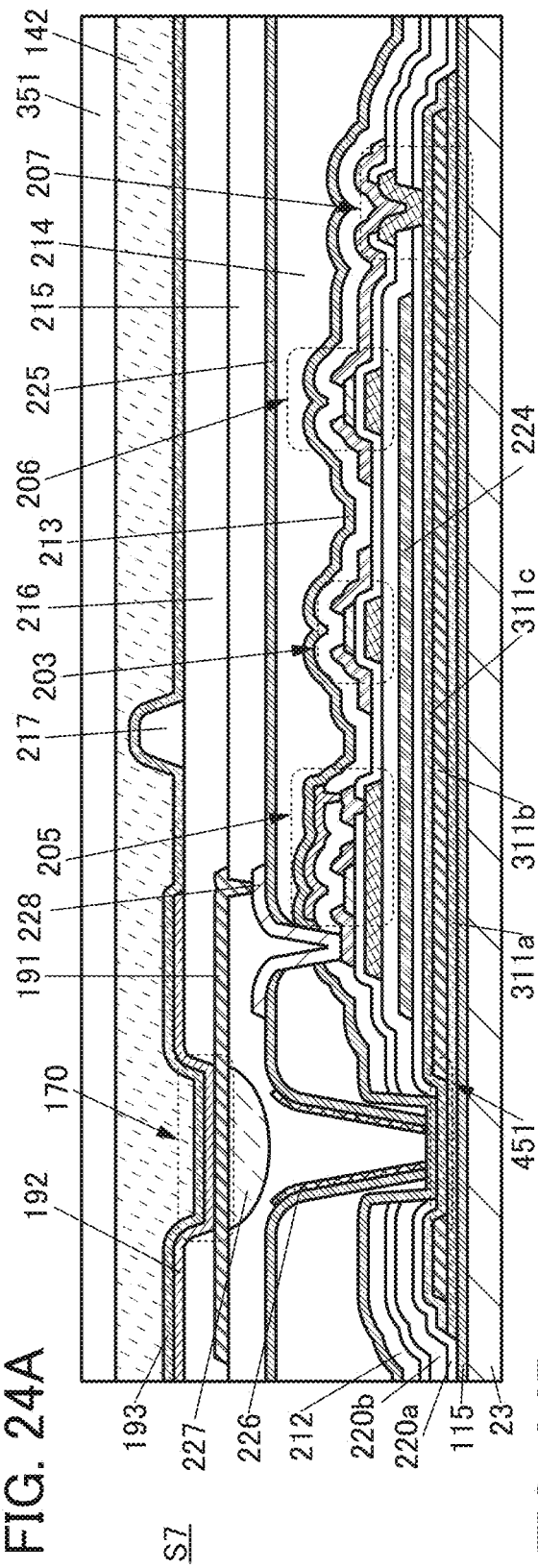
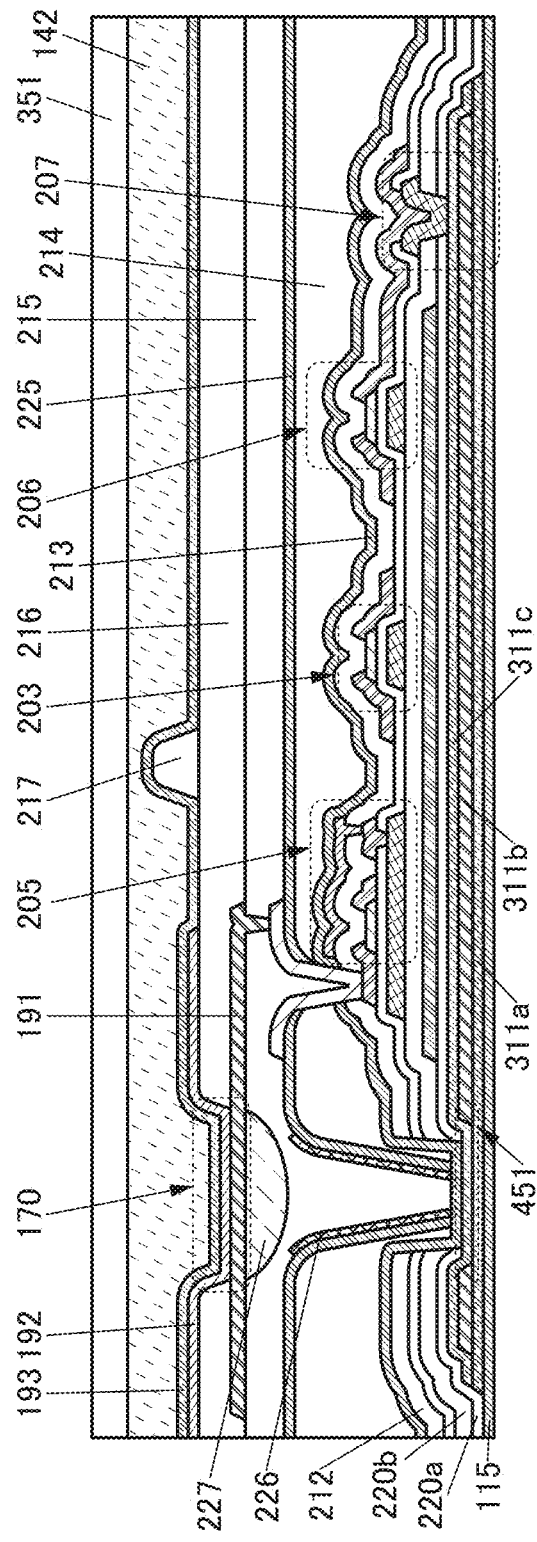

METHOD FOR MANUFACTURING SEMICONDUCTOR DEVICE

TECHNICAL FIELD

One embodiment of the present invention relates to a separation method, a manufacturing method of a semiconductor device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a driving method thereof, and a manufacturing method thereof.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

A flexible display device can be obtained by formation of a semiconductor element such as a transistor or a display element such as an organic EL element over a flexible substrate (film).

In a manufacturing method of a flexible display device that is disclosed in Patent Document 1, laser light irradiation is performed on a supporting substrate (a glass substrate) over which a sacrificial layer, a heat-resistant resin layer, and an electronic element are provided in that order, and the heat-resistant resin layer is then separated from the glass substrate.

REFERENCE

Patent Document

[Patent Document 1] Japanese Published Patent Application No. 2015-223823

DISCLOSURE OF INVENTION

An object of one embodiment of the present invention is to provide a novel separation method, a novel manufacturing method of a semiconductor device, or a novel manufacturing method of a display device. Another object of one embodiment of the present invention is to provide a separation method, a manufacturing method of a semiconductor device, or a manufacturing method of a display device each having a low cost and a high productivity. Another object of one embodiment of the present invention is to provide a high-yield separation method. Another object of one embodiment of the present invention is to manufacture a semiconductor device or a display device using a large-sized substrate. Another object of one embodiment of the present invention is to manufacture a semiconductor device or a display device at low temperatures.

Another object of one embodiment of the present invention is to provide a display device with low power consumption. Another object of one embodiment of the present invention is to provide a display device with high reliability. Another object of one embodiment of the present invention is to reduce the thickness or weight of a display device. Another object of one embodiment of the present invention is to provide a display device having flexibility or a curved surface. Another object of one embodiment of the present invention is to provide a robust display device. Another object of one embodiment of the present invention is to provide a novel display device, a novel input/output device, a novel electronic device, or the like.

Note that the descriptions of these objects do not preclude the existence of other objects. One embodiment of the present invention does not necessarily achieve all the objects. Other objects can be derived from the description of the specification, the drawings, and the claims.

A method for manufacturing a semiconductor device of one embodiment of the present invention includes the steps of forming an island-shaped metal oxide layer over a substrate, forming a resin layer over the metal oxide layer to cover an end portion of the metal oxide layer, and separating the metal oxide layer and the resin layer from each other by performing irradiation with light. Furthermore, the method for manufacturing a semiconductor device may include the step of forming an insulating layer over the resin layer after forming the resin layer and before performing the irradiation with the light. The resin layer is formed to have an island shape. The insulating layer is formed to cover an end portion of the resin layer.

A method for manufacturing a semiconductor device of one embodiment of the present invention includes the steps of forming an island-shaped metal oxide layer over a substrate, forming a resin layer over the metal oxide layer to cover an end portion of the metal oxide layer, forming an adhesive layer to overlap with the metal oxide layer and the resin layer, and separating the metal oxide layer and the resin layer from each other by performing irradiation with light. The adhesive layer is formed to have an end portion located inward from the end portion of the metal oxide layer. In addition, the method for manufacturing a semiconductor device may include the step of forming an insulating layer over the resin layer after forming the resin layer and before forming the adhesive layer. The resin layer is formed to have an island shape. The insulating layer is formed to cover an end portion of the resin layer. Furthermore, the method for manufacturing a semiconductor device may include the step of forming a partition having a frame-like shape over the resin layer before forming the adhesive layer. In this case, the adhesive layer is formed to be located inward from the partition.

The resin layer may be formed to include a region with a thickness of greater than or equal to 0.1 μm and less than or equal to 5 μm.

Laser light may be used as the light. An interface between the metal oxide layer and the resin layer or the vicinity thereof is irradiated with the laser light to separate the metal oxide layer and the resin layer from each other.

The light for the irradiation may have a wavelength of greater than or equal to 180 nm and less than or equal to 450 nm. Alternatively, the light may have a wavelength of 308 nm or around 308 nm. The irradiation with the light may be performed with a linear laser apparatus. An energy density of the light may be greater than or equal to 250 mJ/cm² and less than or equal to 360 mJ/cm².

The metal oxide layer may be formed to include one or more of titanium, molybdenum, aluminum, tungsten, silicon, indium, zinc, gallium, tantalum, and tin. Alternatively, the metal oxide layer may be formed to include either or both of titanium and titanium oxide.

According to one embodiment of the present invention, a novel separation method, a novel manufacturing method of a semiconductor device, or a novel manufacturing method of a display device can be provided. According to one embodiment of the present invention, a separation method, a manufacturing method of a semiconductor device, or a manufacturing method of a display device each having a low cost and a high productivity can be provided. According to one embodiment of the present invention, a separation method with a high yield can be provided. According to one embodiment of the present invention, a semiconductor device or a display device can be manufactured using a large-sized substrate. According to one embodiment of the present invention, a semiconductor device or a display device can be manufactured at low temperatures.

According to one embodiment of the present invention, a display device with low power consumption can be provided. According to one embodiment of the present invention, a display device with high reliability can be provided. According to one embodiment of the present invention, the thickness or weight of a display device can be reduced. According to one embodiment of the present invention, a display device having flexibility or a curved surface can be provided. According to one embodiment of the present invention, a robust display device can be provided. According to one embodiment of the present invention, a novel display device, a novel input/output device, a novel electronic device, or the like can be provided.

Note that the descriptions of these effects do not preclude the existence of other effects. One embodiment of the present invention does not necessarily have all the effects. Other effects can be derived from the description of the specification, the drawings, and the claims.

BRIEF DESCRIPTION OF DRAWINGS

FIGS. 1A and 1B are a top view and a cross-sectional view illustrating a stacked structure including a metal oxide layer and a resin layer.

FIGS. 2A and 2B are a top view and a cross-sectional view illustrating a stacked structure including a metal oxide layer and a resin layer.

FIGS. 4A and 4B are a top view and a cross-sectional view illustrating a stacked structure including a metal oxide layer and a resin layer.

FIGS. 5A1, 5A2, 5B, 5C, 5D1, and 5D2 are cross-sectional views illustrating an example of a manufacturing method of a display device.

FIGS. 9A, 9B1, 9B2, 9B3, and 9B4 are cross-sectional views and top views illustrating examples of a manufacturing method of a display device.

FIGS. 14A, 14B, 14C1, and 14C2 are cross-sectional views illustrating an example of a manufacturing method of a display device.

FIGS. 24A and 24B are cross-sectional views illustrating an example of a manufacturing method of a display device.

BEST MODE FOR CARRYING OUT THE INVENTION

Figures 3A, 3B:
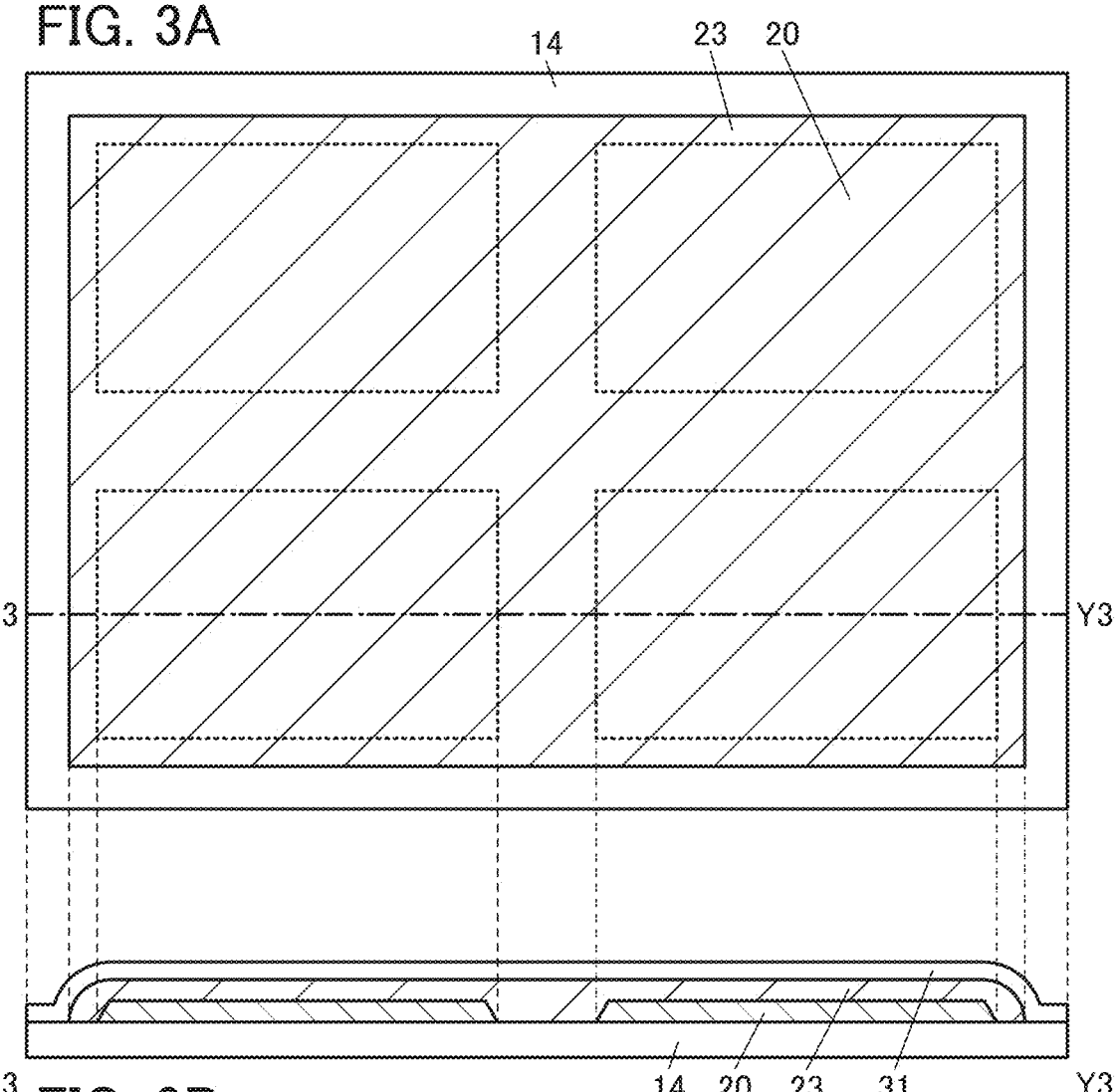
FIGS. 3A and 3B are a top view and a cross-sectional view illustrating a stacked structure including a metal oxide layer and a resin layer.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not denoted by reference numerals in some cases.

The position, size, range, or the like of components illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film," and the term "insulating film" can be changed into the term "insulating layer."

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a separation method of one embodiment of the present invention and a manufacturing method of a display device of one embodiment of the present invention will be described with reference to FIGS. 1A and 1B, FIGS. 2A and 2B, FIGS. 3A and 3B, FIGS. 4A and 4B, FIGS. 5A1 and 5A2, 5B, 5C, and 5D1 and 5D2, FIGS. 6A and 6B, FIGS. 7A to 7C, FIGS. 8A to 8E, FIGS. 9A and 9B1 to B4, FIGS. 10A to 10C, FIGS. 11A and 11B, FIGS. 12A to 12C, FIGS. 13A to 13C, FIGS. 14A and 14B and 14C1 and 14C2, FIGS. 15A and 15B, FIGS. 16A and 16B, FIGS. 17A and 17B, FIGS. 18A and 18B, and FIGS. 19A to 19C.

In this embodiment, a display device that includes a transistor and an organic EL element (also referred to as an active matrix organic EL display device) will be described as an example. The display device can have flexibility by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other kinds of functional elements.

In this embodiment, first, a metal oxide layer is formed over the substrate. Then, the resin layer is formed over the metal oxide layer. After that, the metal oxide layer and the resin layer are separated from each other by light irradiation.

In this embodiment, a layer serving as a base (also referred to as a base layer) is formed between the substrate and the resin layer. Although the metal oxide layer is used as the base layer in an example described in this embodiment, one embodiment of the present invention is not limited to this example.

Light is preferably used for the separation between the metal oxide layer and the resin layer. An interface between the metal oxide layer and the resin layer or the vicinity thereof (also referred to as "an interface or the vicinity of the interface") is preferably irradiated with the light. The inside of the metal oxide layer may be irradiated with the light. The inside of the resin layer may be irradiated with the light. Note that in this specification and the like, "an interface between A and B or the vicinity thereof" and "an interface between A and B or the vicinity of the interface" each include at least the interface between A and B and also include a range from the interface between A and B to within 20% of the thickness of A or B.

The interface between the metal oxide layer and the resin layer (as well as the inside of the metal oxide layer and the inside of the resin layer) is heated by the light irradiation, and the adhesion (or adhesiveness) between the metal oxide layer and the resin layer can be decreased. In addition, the metal oxide layer and the resin layer can be separated from each other.

Here, stacked structures including the metal oxide layer and the resin layer of one embodiment of the present invention are shown in FIGS. 1A and 1B, FIGS. 2A and 2B, FIGS. 3A and 3B, and FIGS. 4A and 4B.

FIG. 1A, FIG. 2A, FIG. 3A, and FIG. 4A are top views of the stacked structures of one embodiment of the present invention. FIG. 1B is a cross-sectional view along dashed-dotted line X1-Y1 of the top view shown in FIG. 1A. FIG. 2B is a cross-sectional view along dashed-dotted line X2-Y2 of the top view shown in FIG. 2A. FIG. 3B is a cross-sectional view along dashed-dotted line X3-Y3 of the top view shown in FIG. 3A. FIG. 4B is a cross-sectional view along dashed-dotted line X4-Y4 of the top view shown in FIG. 4A. Note that in the top views, an insulating layer 31 that will be described later is omitted.

An island-shaped metal oxide layer 20 is provided over a formation substrate 14 in FIGS. 1A and 1B. An island-shaped resin layer 23 is provided over the metal oxide layer 20. The resin layer 23 covers an end portion of the metal oxide layer 20. On any of the four sides of the metal oxide layer 20, an end portion of the resin layer 23 is located outward from the end portion of the metal oxide layer 20. In other words, on any of the four sides of the resin layer 23, the end portion of the metal oxide layer 20 is located inward from the end portion of the resin layer 23. The insulating layer 31 is provided over the resin layer 23 as shown in FIG. 1B. The insulating layer 31 includes a portion in contact with the formation substrate 14 and a portion in contact with the resin layer 23.

Four island-shaped metal oxide layers 20 are provided over the formation substrate 14 in FIG. 2A. The island-shaped resin layers 23 are provided over the metal oxide layers 20. One resin layer 23 is provided over one metal oxide layer 20. The resin layer 23 covers an end portion of the metal oxide layer 20. On any of the four sides of the metal oxide layer 20, an end portion of the resin layer 23 is located outward from the end portion of the metal oxide layer 20. The insulating layer 31 is provided over the resin layer 23 as shown in FIG. 2B. The insulating layer 31 includes a portion in contact with the formation substrate 14 and a portion in contact with the resin layer 23.

Four island-shaped metal oxide layers 20 are provided over the formation substrate 14 in FIG. 3A. One island-shaped resin layer 23 is provided over the four metal oxide layers 20. The resin layer 23 covers end portions of the four metal oxide layers 20. That is, one island-shape resin layer 23 is provided over the plurality of metal oxide layers 20. The end portions of the four metal oxide layers 20 are located inward from end portions of the resin layer 23. The insulating layer 31 is provided over the resin layer 23 as shown in FIG. 3B. The insulating layer 31 includes a portion in contact with the formation substrate 14 and a portion in contact with the resin layer 23.

Four island-shaped metal oxide layers 20 are provided over the formation substrate 14 in FIG. 4A. The island-shaped resin layers 23 are provided over the metal oxide layers 20. One resin layer 23 is provided over one metal oxide layer 20. An end portion of the resin layer 23 is located inward from the end portion of the metal oxide layer 20. The insulating layer 31 is provided over the resin layer 23 as shown in FIG. 4B. The insulating layer 31 includes a portion in contact with the formation substrate 14, a portion in contact with the metal oxide layer 20, and a portion in contact with the resin layer 23.

The insulating layer 31 includes a portion in contact with the metal oxide layer 20 in FIG. 4B. If the adhesion between the metal oxide layer 20 and the insulating layer 31 is low, film separation (also referred to as peeling) unintentionally occurs in a manufacturing process of a device, resulting in a problem of reduced yield. Film separation is observed in some cases when a titanium oxide film is used as the metal oxide layer 20 and an inorganic insulating film such as a silicon oxide film or a silicon oxynitride film is used as the insulating layer 31, for example.

Note that in this specification and the like, "silicon oxynitride" contains more oxygen than nitrogen. In this specification and the like, "silicon nitride oxide" contains more nitrogen than oxygen.

Thus, it is preferable that a region where the insulating layer 31 is in contact with the metal oxide layer 20 be as narrow as possible in the stacked structure shown in FIGS. 4A and 4B. Accordingly, a portion having low adhesion can be prevented from being formed in the stacked structure, so that unintentional film separation can be reduced.

Furthermore, the resin layers 23 are provided to cover the end portions of the metal oxide layers 20 in the stacked structures shown in FIGS. 1A and 1B, FIGS. 2A and 2B, and FIGS. 3A and 3B. The portion where the metal oxide layer 20 is not covered with the resin layer 23 is reduced or even eliminated, whereby the portion where the metal oxide layer 20 and the insulating layer 31 are in contact with each other can be reduced or even eliminated. Thus, a portion having low adhesion can be prevented from being formed in the stacked structure, so that unintentional film separation can be prevented. As a result, yield in the manufacturing process of the device can be improved. Furthermore, the adhesion between the metal oxide layer 20 and the insulating layer 31, and the like does not need to be considered; thus, the range of choices for the materials that can be used for the metal oxide layer 20 and the insulating layer 31 is widened.

Note that in the stacked structure of one embodiment of the present invention, the number of the metal oxide layers 20 formed over the formation substrate 14 and the number of the resin layers 23 formed over the formation substrate 14 are not limited.

One metal oxide layer 20 and one resin layer 23 may be formed over the formation substrate 14 as shown in FIG. 1A. For example, one or more devices can be manufactured over one metal oxide layer 20. With such a structure, even when a plurality of devices is manufactured, the plurality of devices can be separated from the formation substrate 14 by one separation step. After the plurality of devices is separated from the formation substrate 14, the plurality of devices can be divided into individual devices due to division. In the case where the plurality of devices is divided into individual devices after performing the separation step, the formation substrate 14 does not need to be divided; thus, the formation substrate 14 can be reused easily.

Furthermore, a plurality of metal oxide layers 20 can be formed over the formation substrate 14 as shown in FIG. 2A, FIG. 3A, and FIG. 4A. For example, one device can be manufactured over one metal oxide layer 20. In the case where a plurality of devices is manufactured over one metal oxide layer 20, if a defect occurs in a separation step, then the plurality of devices is defective all at once; thus, yield is decreased in some cases. By forming the metal oxide layer 20 in each device, each of the devices can be separated from the formation substrate 14; thus, yield in the separation step can be improved. In addition, the devices can be separated from the formation substrate 14 at different timings. Furthermore, by performing the separation step after dividing the formation substrate 14 and dividing the plurality of devices into individual devices, a separation device can be miniaturized in some cases.

In the case where a plurality of metal oxide layers 20 is formed over the formation substrate 14, one or more resin layers 23 can be formed. FIG. 2A and FIG. 4A show examples of providing the same number of resin layers 23 as the number of metal oxide layers 20. FIG. 3A shows an example of providing one resin layer 23.

When the resin layer 23 covers dividing lines or a variety of markers, defects of separation and failure in alignment may occur. Therefore, the plurality of resin layers 23 is preferably provided so as not to cover dividing lines or variety of markers. This can improve yield of the steps. Specifically, one resin layer 23 is preferably provided over one metal oxide layer 20. Note that one resin layer 23 may be provided depending on the layout.

As described above, one embodiment of the present invention can prevent an interface with low adhesion from being formed and the metal oxide layer and the resin layer can be separated from each other at desired timing. Thus, unintentional film separation during the process can be prevented, so that yield of the process can be improved.

Next, light irradiation will be described.

The light irradiation can be performed with a lamp, a laser apparatus, or the like.

The laser light irradiation is preferably performed with a linear laser apparatus. Laser apparatuses for the manufacturing lines for low temperature polysilicon (LTPS) and the like can be used, which enables effective use of the apparatuses. The linear laser is condensed into a long rectangular shape (the laser light is shaped into a linear laser beam) so that the interface between the metal oxide layer and the resin layer are irradiated with the condensed light.

For the irradiation, light having a wavelength of greater than or equal to 180 nm to less than or equal to 450 nm is preferably used. Further preferably, light with a wavelength of 308 nm or around 308 nm is used.

The energy density of the light is preferably greater than or equal to 250 mJ/cm$^2$ and less than or equal to 400 mJ/cm$^2$, further preferably greater than or equal to 250 mJ/cm$^2$ and less than or equal to 360 mJ/cm$^2$.

In the case where the light irradiation is performed with a laser apparatus, the number of shots of laser light with which one portion is irradiated can be greater than or equal to 1 and less than or equal to 50, preferably greater than 1 and less than or equal to 10, further preferably greater than 1 and less than or equal to 5.

There are portions with low light intensity on both ends of the short axis of the laser beam. Accordingly, it is preferable that one shot and another shot overlap with each other by greater than or equal to the width of the portion with low light intensity. Therefore, the number of laser shots is preferably greater than or equal to 1.1, further preferably greater than or equal to 1.25.

In this specification, the number of laser shots refers to the number of times a point (region) is irradiated with laser light, and is determined by a beam width, scanning speed, a frequency, an overlap percentage, or the like. There is a portion between a pulse and another pulse when a linear beam is moved in a scanning direction, that is, a portion where one shot and another shot partly overlap with each other, and their overlapping ratio is referred to as an overlap percentage. Note that as the overlap percentage becomes closer to 100%, the number of shots is increased, and as the overlap percentage becomes further from 100%, the number of shots is decreased. The higher the scanning speed, the smaller the number of shots.

The expression "the number of shots of the laser light is 1.1" means that there is an overlap equivalent to approximately one-tenth of the beam width between two successive shots, and can mean that the overlap percentage is 10%. Similarly, the expression "the number of shots of the laser light is 1.25" means that there is an overlap equivalent to approximately one-fourth of the beam width between two successive shots, and can mean that the overlap percentage is 25%.

Here, the energy density of light used for irradiation in the laser crystallization step of LTPS is high, e.g., greater than or equal to 350 mJ/cm$^2$ and less than or equal to 400 mJ/cm$^2$. Furthermore, the number of laser shots needs to be large, e.g., greater than or equal to 10 and less than or equal to 100.

Meanwhile, in this embodiment, light irradiation for separating the metal oxide layer 20 and the resin layer 23 from each other can be performed at a lower energy density or with a smaller number of shots than that performed in the laser crystallization step. Accordingly, the number of substrates which can be processed by a laser apparatus can be increased. The running costs of a laser apparatus can be reduced by reducing the frequency of maintenance of the laser apparatus, for example. Consequently, the manufacturing costs of display devices and the like can be reduced.

Since the light irradiation is performed at a lower energy density or with a smaller number of shots than that performed in the laser crystallization step, damage to the substrate caused by the laser light irradiation can be reduced. Thus, the strength of the substrate is less likely to be reduced after the substrate is used once, and the substrate can be reused. Consequently, the costs can be reduced.

In this embodiment, the metal oxide layer 20 is provided between the formation substrate 14 and the resin layer 23. Owing to the metal oxide layer 20, in some cases, the light irradiation can be performed at a lower energy density or with a smaller number of shots than that in the case where the metal oxide layer 20 is not used.

If a foreign matter such as dust is adhered to the light irradiation surface of the formation substrate at the time of the light irradiation through the formation substrate, in some cases, nonuniformity occurs in the light irradiation and part with low separability is generated, leading to a reduction in yield of the step of separating the metal oxide layer and the resin layer from each other. For that reason, it is preferable that the light irradiation surface be cleaned before or during the light irradiation. For example, the light irradiation surface of the formation substrate can be cleaned with an organic solvent such as acetone, water, or the like. The light irradiation may be performed while a gas is sprayed with an air knife. Thus, nonuniformity in the light irradiation can be reduced and yield of the separation can be increased.

There is no particular limitation on the display device manufactured using the separation method of one embodiment of the present invention and the manufacturing method of the display device of one embodiment of the present invention. The following shows an example of the display device that can be manufactured by using one embodiment of the present invention.

The display device of this embodiment preferably includes a metal oxide in the channel formation region of the transistor. A metal oxide can function as an oxide semiconductor.

In the case where low temperature polysilicon (LTPS) is used for a channel formation region of a transistor, the resin layer is required to have heat resistance because heat at a temperature of approximately 500° C. to 550° C. needs to be applied. In some cases, the resin layer is required to have a larger thickness to relieve the damage in a laser crystallization step.

In contrast, a transistor including a metal oxide in a channel formation region can be formed at a temperature lower than or equal to 350° C., or even lower than or equal to 300° C. Therefore, the resin layer is not required to have high heat resistance. Accordingly, the upper temperature limit of the resin layer may be low, and the range of choices for the materials can be widened.

Furthermore, the transistor including a metal oxide in the channel formation region does not need a laser crystallization step. Furthermore, in this embodiment, the light irradiation can be performed at a lower energy density or with a smaller number of shots than that used in the laser crystallization step. The resin layer is irradiated with the laser light without through the substrate in the laser crystallization step, whereas the resin layer is irradiated with the laser light through the formation substrate and the metal oxide layer in this embodiment. Since damage to the resin layer is low as described above, the resin layer can be thin. Since the resin layer is not required to have high heat resistance and can be thinned, the manufacturing costs of a device can be significantly reduced. A metal oxide is preferably used, in which case the process can be simplified as compared with the case where LTPS is used.

Note that the display device of one embodiment of the present invention is not limited to the structure in which the transistor includes a metal oxide in the channel formation region. For example, in the display device of this embodiment, the transistor can include silicon in the channel formation region. As silicon, for example, amorphous silicon or crystalline silicon can be used. Examples of crystalline silicon include microcrystalline silicon, polycrystalline silicon, and single crystal silicon.

LTPS is preferably used for the channel formation region. Polycrystalline silicon, e.g., LTPS, can be formed at a lower temperature than single crystal silicon and has higher field effect mobility and higher reliability than amorphous silicon.

The resin layer 23 may have a thickness of greater than or equal to 0.1 μm and less than or equal to 5 μm. By forming the resin layer 23 thin, the display device can be manufactured at low costs. In addition, the display device can be lightweight and thin. Furthermore, the display device can have higher flexibility.

The visible-light transmitting property of the resin layer 23 is not particularly limited. For example, the resin layer 23 may be a colored layer or a transparent layer. When the resin layer 23 that is colored is positioned on the display surface side of the display device, a problem such as a reduced light extraction efficiency, a change in the color of the light before and after the extraction, or reduced display quality might occur.

The resin layer 23 can be removed with a wet etching apparatus, a dry etching apparatus, an ashing apparatus, or the like. In particular, the resin layer 23 is preferably removed by ashing using oxygen plasma.

In this embodiment, the metal oxide layer 20 is provided between the formation substrate 14 and the resin layer 23.

Since the metal oxide layer 20 has a function of absorbing light, the effect of light irradiation can be obtained even when the resin layer 23 has low light absorptance. Accordingly, the resin layer 23 having high visible-light transmittance may be used. Therefore, even when the resin layer 23 is located on the display surface side of the display device, high display quality can be obtained. Moreover, a step of removing the resin layer 23 which is colored (has a color) to enhance the display quality can be omitted. In addition, the range of choices for the material of the resin layer 23 is widened.

The resin layer 23 preferably has a light transmittance of higher than or equal to 70% and lower than or equal to 100%, further preferably higher than or equal to 80% and lower than or equal to 100%, still further preferably higher than or equal to 90% and lower than or equal to 100% on average at a wavelength of longer than or equal to 450 nm and shorter than or equal to 700 nm.

In this embodiment, the transistor or the like is formed at a temperature lower than or equal to the upper temperature limit of the resin layer. The heat resistance of the resin layer can be measured by, for example, heat-induced weight loss percentage, specifically, 5% weight loss temperature. In the separation method of this embodiment and the manufacturing method of a display device of this embodiment, the maximum temperature in the process can be low. For example, in this embodiment, the 5% weight loss temperature of the resin layer can be higher than or equal to 200° C. and lower than or equal to 650° C. higher than or equal to 200° C. and lower than or equal to 500° C., higher than or equal to 200° C. and lower than or equal to 400° C., or higher than or equal to 200° C. and lower than or equal to 350° C. Thus, the range of choices for materials is widened. Note that the 5% weight loss temperature of the resin layer may be higher than 650° C.

Before or during the separation, a water-containing liquid is preferably fed to the separation interface. Water present at the separation interface further reduces adhesion or adhesiveness between the resin layer 23 and the metal oxide layer 20 and reduces the force required for the separation. Furthermore, feeding a water-containing liquid to the separation interface sometimes weakens or cuts a bond between the resin layer 23 and the metal oxide layer 20. A chemical bond with the liquid is utilized to cut a bond between the resin layer 23 and the metal oxide layer 20, which allows the separation to proceed. For example, in the case where there is a hydrogen bond between the resin layer 23 and the metal oxide layer 20, it can be assumed that feeding the water-containing liquid forms a hydrogen bond between the water and the resin layer 23 or the metal oxide layer 20 to cut the hydrogen bond between the resin layer 23 and the metal oxide layer 20.

The metal oxide layer 20 preferably has low surface tension and high wettability with respect to a water-containing liquid. In that case, the water-containing liquid can be distributed over the entire surface of the metal oxide layer 20 and can be easily fed to the separation interface. Distribution of the water over the entire metal oxide layer 20 leads to uniform separation.

The contact angle between the metal oxide layer 20 and the water-containing liquid is preferably greater than 0° and less than or equal to 60°, further preferably greater than 0° and less than or equal to 50°. When the wettability with respect to the water-containing liquid is extremely high (e.g., when the contact angle is approximately 20° or less), it is sometimes difficult to obtain an accurate value of the contact angle. The higher the wettability of the metal oxide layer 20 with respect to the water-containing liquid, the better. Therefore, the wettability with respect to the water-containing liquid may be high enough to prevent an accurate value of the contact angle from being obtained.

The water-containing liquid present at the separation interface can inhibit an adverse effect of static electricity that is caused at the time of separation on a functional element included in a layer to be separated (e.g., damage to a semiconductor element from static electricity). Static electricity on a surface of the layer to be separated which is exposed by the separation may be removed with an ionizer or the like.

In the case where a liquid is fed to the separation interface, the surface of the layer to be separated which is exposed by the separation may be dried.

The manufacturing method of the display device of this embodiment will be specifically described below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblast method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

Separation Method

First, the metal oxide layer 20 is formed over the formation substrate 14 (FIG. 5A1). Alternatively, a metal layer 19 and the metal oxide layer 20 are stacked over the formation substrate 14 (FIG. 5A2). The metal oxide layer 20 (the metal layer 19 and the metal oxide layer 20) is formed in an island shape.

The formation substrate 14 has rigidity high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

As described above, a base layer is formed between the formation substrate 14 and the resin layer 23 in this embodiment. Although the metal oxide layer 20 is used in an example described in this embodiment, one embodiment of the present invention is not limited to this example.

Specifically, the base layer can be a layer that includes one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium. The base layer can contain a metal, an alloy, and a compound thereof (e.g., a metal oxide). The base layer preferably includes one or more of titanium, molybdenum, aluminum, tungsten, silicon, indium, zinc, gallium, tantalum, and tin.

The metal layer 19 can be formed using any of a variety of metals and alloys, for example.

The metal oxide layer 20 can be formed using an oxide of any of a variety of metals. As examples of the metal oxide, titanium oxide ($TiO_x$), molybdenum oxide, aluminum oxide, tungsten oxide, indium tin oxide containing silicon (ITSO), indium zinc oxide, an In—Ga—Zn oxide, and the like can be given.

As other examples of the metal oxide, indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, niobate, and the like can be given.

There is no particular limitation on a method for forming the metal oxide layer 20. For example, the metal oxide layer 20 can be formed by a sputtering method, a plasma-enhanced CVD method, an evaporation method, a sol-gel method, an electrophoretic method, a spray method, or the like.

The metal oxide layer 20 can be formed in such a manner that a metal layer is formed and then oxygen is introduced into the metal layer. At this time, only a surface of the metal layer or the entire metal layer is oxidized. In the former case, the introduction of oxygen into the metal layer forms a structure in which the metal layer 19 and the metal oxide layer 20 are stacked (FIG. 5A2).

The oxidation of the metal layer can be performed, for example, by heating the metal layer in an oxygen-containing atmosphere. It is preferable that the metal layer be heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably set to lower than or equal to the maximum temperature in manufacturing the transistor. In that case, the maximum temperature in manufacturing the display device can be prevented from increasing. When the temperature at which the metal layer is heated is set to lower than or equal to the maximum temperature in manufacturing the transistor, a manufacturing apparatus for the manufacturing process of the transistor, for example, can also be utilized for the manufacturing method of the display device of this embodiment, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

Alternatively, the metal layer can be oxidized by performing radical treatment on the surface of the metal layer. In the radical treatment, the surface of the metal layer is preferably exposed to an atmosphere containing an oxygen radical and/or a hydroxyl radical. For example, plasma treatment is preferably performed in an atmosphere containing oxygen and/or water vapor ($H_2O$).

Hydrogen, oxygen, a hydrogen radical (H*), an oxygen radical (O*), a hydroxyl radical (OH*), or the like is made to be present on a surface of the metal oxide layer 20 or to be contained in the metal oxide layer 20, whereby the force required for the separation between the metal oxide layer 20 and the resin layer 23 can be reduced. Accordingly, again, it is preferable that the metal oxide layer 20 be formed by performing radical treatment or plasma treatment.

Performing such radical treatment or plasma treatment on the surface of the metal layer to oxidize the metal layer eliminates the need for a step of heating the metal layer at high temperatures. Accordingly, the maximum temperature in manufacturing the display device can be prevented from increasing.

Alternatively, the metal oxide layer 20 can be formed in an oxygen atmosphere. For example, a metal oxide film is formed by a sputtering method while an oxygen-containing gas is supplied, whereby the metal oxide layer 20 can be formed. Also in this case, the surface of the metal oxide layer 20 is preferably subjected to radical treatment. In the radical treatment, the surface of the metal oxide layer 20 is preferably exposed to an atmosphere containing at least one of an oxygen radical, a hydrogen radical, and a hydroxyl radical. For example, plasma treatment is preferably performed in an atmosphere containing one or more of oxygen, hydrogen, and water vapor ($H_2O$).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). Water plasma treatment is particularly preferable because it makes a large amount of moisture present on the surface of the metal oxide layer 20 or in the metal oxide layer 20.

Plasma treatment may be performed in an atmosphere containing two or more of oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas for the plasma treatment is favorable because the metal layer or the metal oxide layer 20 is damaged during the plasma treatment.

Two or more kinds of plasma treatment may be performed sequentially without exposure to the air. For example, argon plasma treatment may be followed by water plasma treatment.

Alternatively, oxygen, hydrogen, water, or the like can be introduced by an ion implantation method, an ion doping method, a plasma immersion ion implantation method, or the like.

The metal layer 19 preferably has a thickness of greater than or equal to 1 nm and less than or equal to 100 nm, further preferably greater than or equal to 1 nm and less than or equal to 50 nm, still further preferably greater than or equal to 1 nm and less than or equal to 20 nm.

The metal oxide layer 20 preferably has a thickness of, for example, greater than or equal to 1 nm and less than or equal to 200 nm, further preferably greater than or equal to 5 nm and less than or equal to 100 nm, still further preferably greater than or equal to 5 nm and less than or equal to 50 nm. In the case where the metal oxide layer 20 is formed using the metal layer, the completed metal oxide layer 20 is sometimes thicker than the initially formed metal layer.

The force required for the separation can be reduced by feeding a water-containing liquid to the interface between the metal oxide layer 20 and the resin layer 23 before or during the separation. The smaller the contact angle between the metal oxide layer 20 and the liquid is, the more effective the liquid feeding is. Specifically, the contact angle between the metal oxide layer 20 and the water-containing liquid is preferably greater than 0° and less than or equal to 60°, further preferably greater than 0° and less than or equal to 50°.

Titanium oxide, tungsten oxide, or the like is suitable for the metal oxide layer 20. Titanium oxide is preferably used because the costs can be lower than that when tungsten oxide is used.

Next, the island-shaped resin layer 23 is formed so as to cover the island-shaped metal oxide layer 20 (FIG. 5B).

The resin layer 23 can be formed using any of a variety of resin materials (including resin precursors).

The resin layer 23 is preferably formed using a thermosetting material.

The resin layer 23 may be formed using a material with photosensitivity or a material without photosensitivity (also called a non-photosensitive material).

When a photosensitive material is used, the resin layer 23 can be formed to have a desired shape by a photolithography method. For example, the resin layer 23 may include an opening or have an uneven shape.

The resin layer 23 is preferably formed using a material containing a polyimide resin or a polyimide resin precursor. The resin layer 23 can be formed using a material including a polyimide resin and a solvent, a material including polyamic acid and a solvent, or the like. A polyimide is a material suitable for a planarization film or the like of a display device; therefore, the film formation apparatus and the material can be shared. Thus, there is no need to prepare another apparatus and another material to obtain the structure of one embodiment of the present invention.

Examples of resin materials which can be used to form the resin layer 23 include an acrylic resin, an epoxy resin, a polyamide resin, a polyimide-amide resin, a siloxane resin, a benzocyclobutene-based resin, a phenol resin, and precursors of these resins.

The resin layer 23 is preferably formed with a spin coater. By a spin coating method, a thin film can be uniformly formed over a large-sized substrate.

The resin layer 23 is preferably formed using a solution having a viscosity of greater than or equal to 5 cP and less than 500 cP, further preferably greater than or equal to 5 cP and less than 100 cP, and still further preferably greater than or equal to 10 cP and less than or equal to 50 cP. The lower the viscosity of the solution is, the easier the coating is. Furthermore, the lower the viscosity of the solution is, the more the entry of bubbles can be prevented, leading to a film with good quality.

Alternatively, the resin layer 23 can be formed by dipping, spray coating, ink-jet printing, dispensing, screen printing, or offset printing, or with a doctor knife, a slit coater, a roll coater, a curtain coater, or a knife coater, for example.

After a film to be the resin layer 23 (also referred to as a first layer) is formed, heat treatment is performed on the film, so that the resin layer 23 can be formed.

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

When heating is performed in an air atmosphere or performed while a gas containing oxygen is supplied, the resin layer 23 is sometimes colored by oxidation to have decreased visible-light transmitting property.

For that reason, heating is preferably performed while a nitrogen gas is supplied. In such a case, the heating atmosphere can contain less oxygen than an air atmosphere; thus, oxidation of the resin layer 23 can be inhibited and the visible-light transmitting property of the resin layer 23 can be increased.

By the heat treatment, released gas components (e.g., hydrogen or water) in the resin layer 23 can be reduced. In particular, the heat treatment is preferably performed at a temperature higher than or equal to the fabricating temperature of each layer formed over the resin layer 23. Thus, a gas released from the resin layer 23 in the manufacturing process of the transistor can be significantly reduced.

For example, in the case where the manufacturing temperature of the transistor is lower than or equal to 350° C., a film to be the resin layer 23 is preferably heated at a temperature higher than or equal to 350° C. and lower than or equal to 480° C., further preferably lower than or equal to 400° C., still further preferably lower than or equal to 375° C. Thus, a gas released from the resin layer 23 in the manufacturing process of the transistor can be significantly reduced.

The temperature of the heat treatment is preferably set to lower than or equal to the maximum temperature in manufacturing the transistor. When the temperature of the heat treatment is set to lower than or equal to the maximum temperature in manufacturing the transistor, a manufacturing apparatus for the manufacturing process of the transistor, for example, can also be utilized for the manufacturing method of the display device of this embodiment, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

The maximum temperature in manufacturing the transistor is preferably equal to the temperature of the heat treatment, in which case it is possible to prevent the heat treatment from increasing the maximum temperature in manufacturing the display device and it is also possible to reduce the released gas components in the resin layer 23.

Even when the heating temperature is relatively low, increasing treatment time enables separability as high as the separability that is obtained at higher heating temperatures in some cases. It is thus preferable that the treatment time be set long when the heating temperature cannot be set high owing to the structure of the heating apparatus.

The duration of the heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the heat treatment is not particularly limited to these examples. For example, the duration of the heat treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the heat treatment.

Before the heat treatment, heat treatment (also referred to as prebaking treatment) for removing the solvent contained in the film to be the resin layer 23 may be performed. The temperature of the prebaking treatment can be set as appropriate according to the material that is used. For example, the temperature of the prebaking treatment can be higher than or equal to 50° C. and lower than or equal to 180° C., higher than or equal to 80° C. and lower than or equal to 150° C., or higher than or equal to 90° C. and lower than or equal to 120° C. The heat treatment may also serve as the pre-baking treatment; that is, the solvent contained in the film to be the resin layer 23 may be removed by the heat treatment.

The resin layer 23 has flexibility. The formation substrate 14 has lower flexibility than the resin layer 23.

The resin layer 23 preferably has a thickness of greater than or equal to 0.01 µm and less than 10 µm, further preferably greater than or equal to 0.1 µm and less than or equal to 5 µm, still further preferably greater than or equal to 0.5 µm and less than or equal to 3 µm. By forming the resin layer thin, the display device can be manufactured at low costs. The display device can be lightweight and thin. The display device can have higher flexibility. The use of a solution having low viscosity facilitates the formation of the resin layer 23 having a small thickness. One embodiment of the present invention is not limited to the above examples, and the thickness of the resin layer 23 may be greater than or equal to 10 µm. For example, the resin layer 23 may have a thickness of greater than or equal to 10 µm and less than or equal to 200 µm. The resin layer 23 preferably has a thickness of greater than or equal to 10 µm because the rigidity of the display device can be increased.

The resin layer 23 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 23 is, the more the generation of a crack in a layer included in a transistor or the like and breakage of a transistor or the like which are caused owing to the heating can be prevented.

Next, the insulating layer 31 is formed over the resin layer 23 (FIG. 5C). The metal oxide layer 20 is covered with the resin layer 23. Thus, a portion where the metal oxide layer 20 and the insulating layer 31 are in contact with each other can be reduced or even eliminated. Thus, film separation during the manufacturing process of the display device can be prevented. According to one embodiment of the present invention, the metal oxide layer 20 is covered with the resin layer 23; thus, the adhesion between the insulating layer 31 and the metal oxide layer 20 is not a matter. Accordingly, the range of choices for the materials of the insulating layer 31 is widened.

The insulating layer 31 preferably has a function of blocking hydrogen, oxygen, and water that are released from the metal oxide layer 20, the resin layer 23, and the like in a later heating step.

The insulating layer 31 preferably includes, for example, a silicon nitride film, a silicon oxynitride film, or a silicon nitride oxide film. For example, a silicon nitride film is formed by a plasma-enhanced CVD method using a deposition gas containing a silane gas, a hydrogen gas, and an ammonia ($NH_3$) gas. There are no particular limitations on the thickness of the insulating layer 31. The thickness can be, for example, greater than or equal to 50 nm and less than or equal to 600 nm, preferably greater than or equal to 100 nm and less than or equal to 300 nm.

Next, a layer 25 to be separated is formed over the resin layer 23 (FIG. 5D1 or 5D2).

An insulating layer or a functional element (e.g., a transistor or a display element), for example, can be provided as the layer 25 to be separated. Note that the insulating layer 31 can be regarded as part of the layer 25 to be separated.

Next, a protective layer is formed over the layer 25 to be separated. The protective layer is a layer positioned on the outermost surface of the display device. The protective layer preferably has a high visible-light-transmitting property. The protective layer preferably includes an organic insulating film because it is possible to prevent the surface of the display device from being damaged or cracked.

FIGS. 5D1 and 5D2 each illustrate an example in which the substrate 75a is bonded to the layer 25 to be separated, with the use of an adhesive layer 75b.

FIG. 5D1 shows an example of an end portion of the adhesive layer 75b located inward from an end portion of the metal oxide layer 20.

When the adhesive layer 75b includes a region that does not overlap with the metal oxide layer 20, separation failure is likely to occur in some cases depending on the area of the region and a degree of adhesion between the adhesive layer 75b and a layer in contact therewith. Thus, the adhesive layer 75b is preferably formed so as not to be located outward from the end portion of the metal oxide layer 20. Accordingly, by light irradiation in a later step, the metal oxide layer 20 and the resin layer 23 can be easily separated from each other. Note that the end portion of the adhesive layer 75b and the end portion of the metal oxide layer 20 may be aligned with each other.

FIG. 5D2 shows an example of an end portion of the adhesive layer 75b located outward from an end portion of the metal oxide layer 20.

The stacked structure shown in FIG. 5D2 includes a region where the formation substrate 14 and the substrate 75a are bonded to each other by the adhesive layer 75b without having the metal oxide layer 20 interposed therebetween. The metal oxide layer 20 is not provided in this region; thus, the adhesion of this region does not decrease significantly even when light irradiation is performed in the later step. Therefore, unintentional separation of the resin layer 23 from the formation substrate 14 after the light irradiation can be inhibited. For example, separation of the resin layer 23 when the formation substrate 14 is transferred from the laser apparatus to another place can be inhibited. In addition, the formation of the separation trigger enables the metal oxide layer 20 and the resin layer 23 to be separated from each other at desired timing. In other words, not only is a small force required for the separation, but the timing of the separation between the metal oxide layer 20 and the resin layer 23 can be controlled. This can improve yield of the step for separating the metal oxide layer 20 and the resin layer 23 from each other and that of the manufacturing process of a display device.

As the adhesive layer 75b, any of a variety of curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a may be formed using any of a variety of materials such as glass, quartz, a resin, a metal, an alloy, and a semiconductor, each of which is thin enough to be flexible.

Figure 6A:
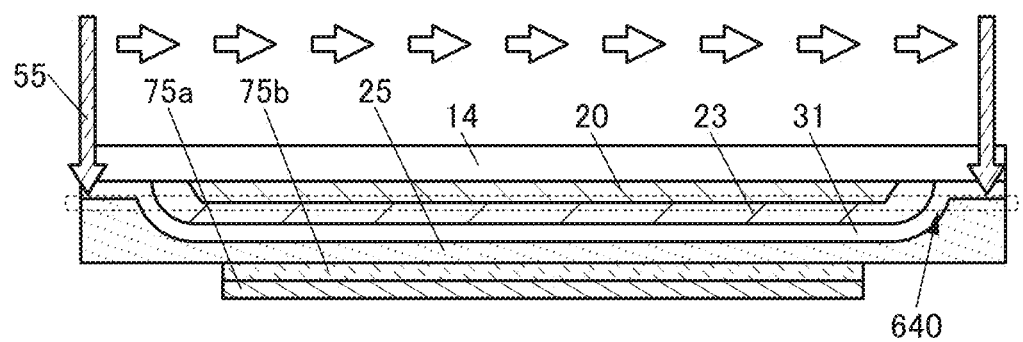
FIGS. 6A and 6B are cross-sectional views illustrating an example of a manufacturing method of a display device.

Next, irradiation with laser light 55 is performed. An example of the stacked structure of FIG. 5D1 irradiated with the laser light 55 is shown in FIG. 6A. An example of the stacked structure of FIG. 5D2 irradiated with the laser light 55 is shown in FIG. 7A.

Figure 7A:
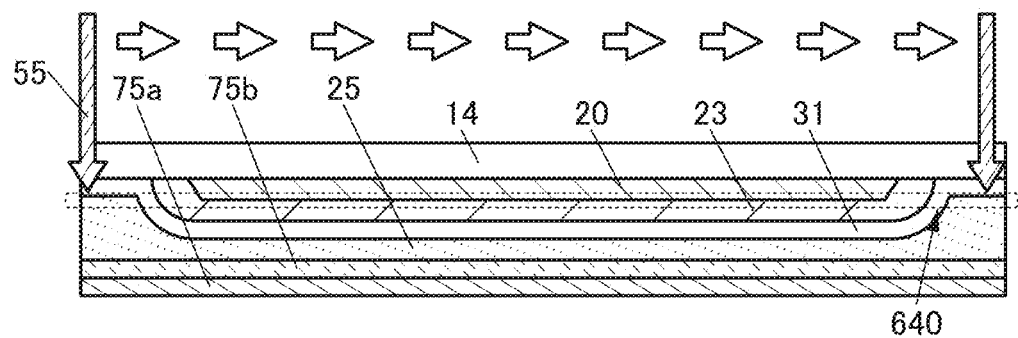
FIGS. 7A to 7C are cross-sectional views illustrating an example of a manufacturing method of a display device.

The laser light 55 is, for example, a linear laser beam with which scanning is performed from the left side to the right side in FIG. 6A and FIG. 7A, and the major axis is perpendicular to the scanning direction and the incident direction (from top to bottom). In the laser apparatus, the stack is placed with the formation substrate 14 facing upward. The stack is irradiated with the laser light 55 from above the stack (formation substrate 14).

The interface between the metal oxide layer 20 and the resin layer 23 or the vicinity thereof is preferably irradiated with the laser light 55 through the formation substrate 14 (see a processing region 640 in FIG. 6A and FIG. 7A). The inside of the metal oxide layer 20 may be irradiated with the laser light 55 or the inside of the resin layer 23 may be irradiated with the laser light 55.

The metal oxide layer 20 absorbs the laser light 55. The resin layer 23 may absorb the laser light 55.

The absorptance of the laser light 55 of the stack including the formation substrate 14 and the metal oxide layer 20 is preferably higher than or equal to 50% and lower than or equal to 100%, further preferably higher than or equal to 75% and lower than or equal to 100%, still further preferably higher than or equal to 80% and lower than or equal to 100%. Most of the laser light 55 is absorbed by the stack, so that the separation can be surely performed at the interface between the metal oxide layer 20 and the resin layer 23. Furthermore, light-induced damage to the resin layer 23 can be reduced.

The irradiation with the laser light 55 reduces adhesion or adhesiveness between the metal oxide layer 20 and the resin layer 23. The resin layer 23 is embrittled by the irradiation with the laser light 55 in some cases.

As the laser light 55, light having a wavelength by which at least part of the laser light 55 is transmitted through the formation substrate 14 and absorbed by the metal oxide layer 20 is selected. The laser light 55 is preferably light in a wavelength range from visible light to ultraviolet light. For example, light in a wavelength of greater than or equal to 180 nm and less than or equal to 450 nm, preferably greater than or equal to 200 nm and less than or equal to 400 nm, further preferably greater than or equal to 250 nm and less than or equal to 350 nm, can be used.

The laser light 55 preferably has energy that is higher than the energy gap of the metal oxide layer 20. For example, the energy gap of titanium oxide is approximately 3.2 eV. In the case where titanium oxide is used for the metal oxide layer 20, light having energy higher than 3.2 eV is preferably used.

In particular, an excimer laser with a wavelength of 308 nm is preferably used because the productivity is increased. The excimer laser is preferable because the excimer laser can be used also for laser crystallization of LTPS, so that the existing LTPS manufacturing line device can be used and new capital investment is not necessary. The energy of the light with a wavelength of 308 nm is approximately 4.0 eV. That is, in the case where titanium oxide is used for the metal oxide layer 20, an excimer laser with a wavelength of 308 nm is preferably used. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with that of an excimer laser. A pulsed laser such as a picosecond laser may be used.

In the case where linear laser light is used as the laser light 55, scanning is performed with the laser light 55 and a region to be separated is entirely irradiated with the laser light 55 by relatively moving the formation substrate 14 and a light source.

Then, the formation substrate 14 and the resin layer 23 are separated from each other. Since the adhesion or adhesiveness between the metal oxide layer 20 and the resin layer 23 is low, the separation occurs at the interface between the metal oxide layer 20 and the resin layer 23. The separation occurs in the embrittled resin layer 23 in some cases.

Figure 6B:
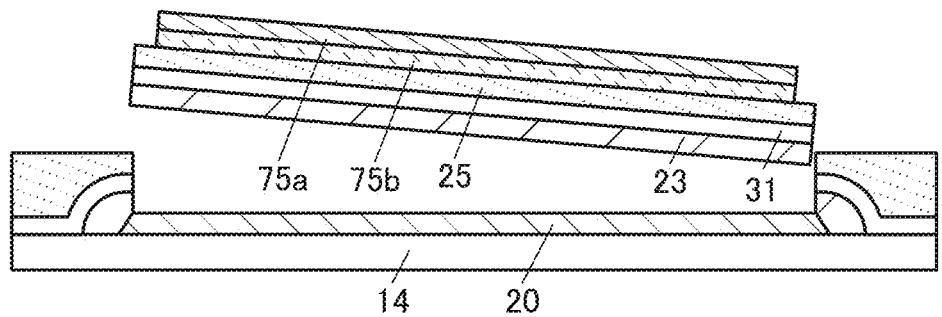

An example in which the stacked structure shown in FIG. 5D1 is separated is shown in FIG. 6B. The end portion of the adhesive layer 75b is located inward from the end portion of the metal oxide layer 20 in this stacked structure; thus, a portion having high adhesion is hardly generated in the portion where the metal oxide layer 20 is not provided. Accordingly, by performing the irradiation with the laser light 55, the metal oxide layer 20 and the resin layer 23 can be easily separated from each other. Although an example in which the layer 25 to be separated and the like of the portion where the metal oxide layer 20 is not provided remains over the formation substrate 14 is shown here, one embodiment of the present invention is not limited thereto. A part of the layer 25 where the metal oxide layer 20 is not provided remains on the substrate 75a side in some cases.

Note that a separation trigger may be formed depending on the conditions or the like of the irradiation with the laser light 55. For example, the separation trigger may be formed by inserting a sharp instrument such as a knife between the formation substrate 14 and the substrate 75a. Alternatively, the separation trigger may be formed by cutting the resin layer 23 from the substrate 75a side with a sharp instrument. Further alternatively, the separation trigger may be formed by a method that uses a laser, such as a laser ablation method.

Figure 7B:
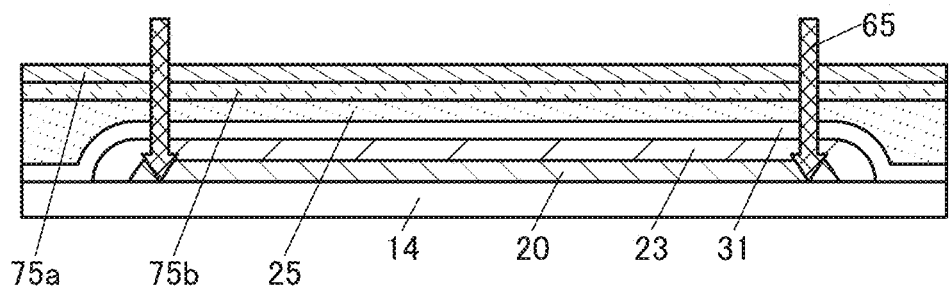
Figure 7C:
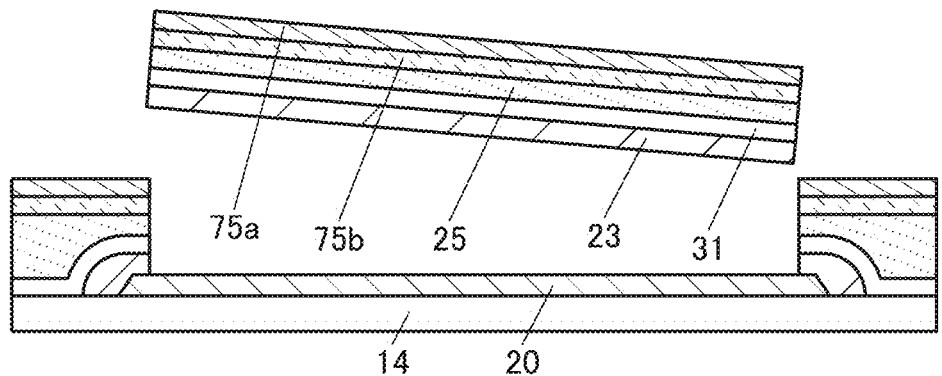

An example of the separation of the stacked structure of FIG. 5D2 is shown in FIGS. 7B and 7C.

The adhesion of a region where the formation substrate 14 and the substrate 75a are bonded to each other without the metal oxide layer 20 interposed therebetween in the stacked structure shown in FIG. 7B does not decrease significantly even when light irradiation is performed. Therefore, unintentional separation of the resin layer 23 from the formation substrate 14 after the irradiation with the laser light 55 can be inhibited. In addition, the formation of the separation trigger (FIG. 7B) enables the metal oxide layer 20 and the resin layer 23 to be separated from each other at desired timing (FIG. 7C).

For example, a sharp instrument 65, e.g., a knife, is inserted from the substrate 75a side into a portion located inward from an end portion of the metal oxide layer 20 to make a cut 64 in a frame-like shape. Alternatively, the substrate 75a may be irradiated with laser light in a frame-like shape.

The formation substrate 14 and the resin layer 23 can be separated from each other by applying a perpendicular tensile force to the resin layer 23, for example. Specifically, the resin layer 23 can be separated from the formation substrate 14 by pulling up the substrate 75a by part of its suction-attached top surface.

Here, if the separation is performed in such a manner that a water-containing liquid such as water or an aqueous solution is added to the separation interface and the liquid penetrates into the separation interface, the ease of the separation can be enhanced. Furthermore, an adverse effect of static electricity caused at the separation on the functional element such as a transistor (e.g., damage to a semiconductor element from static electricity) can be suppressed.

The liquid to be fed can be water (preferably pure water), a neutral, alkaline, or acidic aqueous solution, an aqueous solution in which a salt is dissolved, or the like. Other examples of the liquid include ethanol and acetone. Any of a variety of organic solvents may also be used.

In this embodiment, the metal oxide layer 20 and the resin layer 23 are stacked and irradiated with light. As a result, the adhesion or adhesiveness between the metal oxide layer 20 and the resin layer 23 can be reduced. Accordingly, the formation substrate 14 and the resin layer 23 can be easily separated from each other.

Furthermore, film separation can be inhibited and yield in the manufacturing process of the device can be improved by covering the metal oxide layer 20 with the resin layer 23 and reducing the portion where the metal oxide layer 20 and the insulating layer 31 are in contact with each other.

Furthermore, a structure separated at the same time as the light irradiation and a structure separated at desired timing after the light irradiation can be easily formed by controlling the arrangement of the metal oxide layer 20 and the adhesive layer 75b.

The separation method of this embodiment makes it possible to provide a manufacturing method of a semiconductor device or a separation method each having a low cost and a high mass productivity. For example, since the formation substrate 14 (e.g., a glass substrate) or a stack including the formation substrate 14 and the metal oxide layer 20 can be repeatedly used in the separation method of this embodiment, the manufacturing costs can be reduced.

Manufacturing Method Example 1

Next, manufacturing method examples of the display device of this embodiment will be described. Portions similar to those in the above-described separation method are not described in some cases.

Figure 8A:
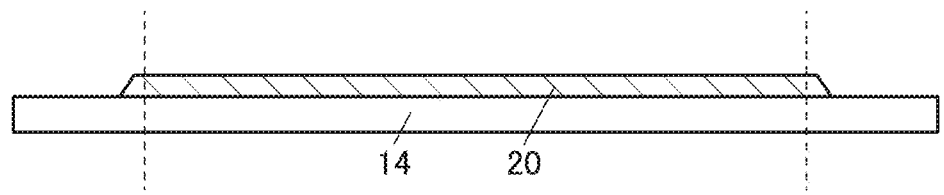
FIGS. 8A to 8E are cross-sectional views illustrating an example of a manufacturing method of a display device.

First, the island-shaped metal oxide layer 20 is formed over the formation substrate 14 (FIG. 8A). For the metal oxide layer 20, the description of the above separation method can be referred to.

Figure 8B:
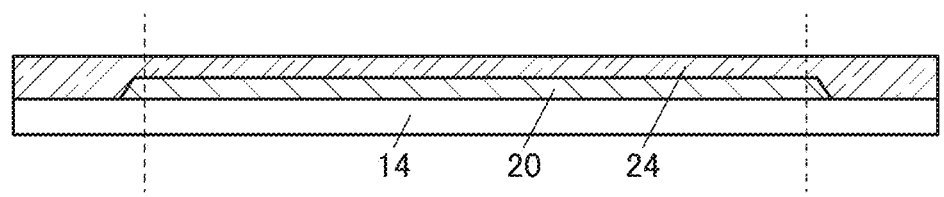

Next, the first layer 24 is formed over the metal oxide layer 20 (FIG. 8B).

In this embodiment, the first layer 24 is formed using a photosensitive and thermosetting material. Note that the first layer 24 may be formed using a non-photosensitive material.

Figure 8C:
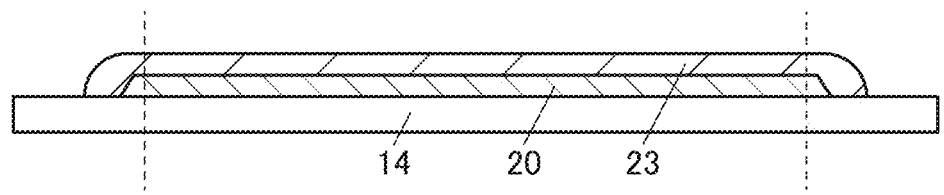

Heat treatment (prebaking treatment) for removing a solvent is performed after formation of the first layer 24, and then light exposure is performed using a photomask. Next, development is performed, whereby an unnecessary portion can be removed. Subsequently, heat treatment is performed on the first layer 24 that has been processed into a desired shape, so that the resin layer 23 is formed (FIG. 8C). In FIG. 8C, the island-shaped resin layer 23 is formed to cover the island-shaped metal oxide layer 20.

Note that the resin layer 23 is not necessarily in the form of a single island and may be in the form of a plurality of islands or have an opening, for example. In addition, unevenness may be formed on the surface of the resin layer 23 by an exposure technique using a half-tone mask or a gray-tone mask, a multiple exposure technique, or the like.

The resin layer 23 with a desired shape can be formed in such a manner that a mask such as a resist mask or a hard mask is formed over the first layer 24 or the resin layer 23 and etching is performed. This method is particularly suitable for the case of using a non-photosensitive material.

For example, an inorganic film is formed over the resin layer 23, and a resist mask is formed over the inorganic film. After the inorganic film is etched with the use of the resist mask, the resin layer 23 can be etched using the inorganic film as a hard mask.

As examples of an inorganic film that can be used as the hard mask, a variety of inorganic insulating films, metal films and alloy films that can be used for a conductive layer, and the like can be given.

It is preferable to form the mask with an extremely small thickness and remove the mask concurrently with the etching, in which case a step of removing the mask can be eliminated.

For details of the heat treatment, the description of the heat treatment in the above separation method can be referred to.

Figure 8D:
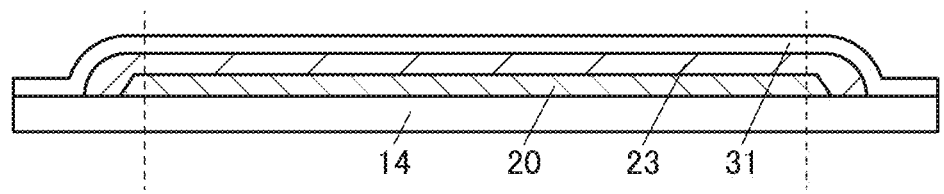

Next, the insulating layer 31 is formed over the resin layer 23 (FIG. 8D). The insulating layer 31 is formed to cover an end portion of the resin layer 23. The metal oxide layer 20 is covered with the resin layer 23. Thus, the portion where the metal oxide layer 20 and the insulating layer 31 are in contact with each other can be reduced or even eliminated. Therefore, film separation during the manufacturing process of the display device can be inhibited.

The insulating layer 31 is formed at a temperature lower than or equal to the upper temperature limit of the resin layer 23. The insulating layer 31 is preferably formed at a temperature lower than the temperature of the heat treatment.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film.

An inorganic insulating film is preferably formed at high temperatures because the film can have higher density and a higher barrier property as the deposition temperature becomes higher.

The substrate temperature during the formation of the insulating layer 31 is preferably higher than or equal to room temperature (25° C.) and lower than or equal to 350° C., further preferably higher than or equal to 100° C. and lower than or equal to 300° C.

Figure 8E:
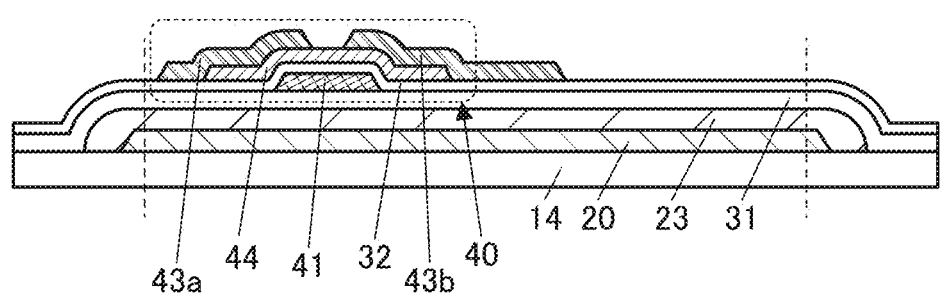

Next, a transistor 40 is formed over the insulating layer 31 (FIG. 8E).

There is no particular limitation on the structure of the transistor included in the display device. For example, a planar transistor, a staggered transistor, or an inverted staggered transistor may be used. A top-gate transistor or a bottom-gate transistor may be used. Gate electrodes may be provided above and below a channel.

In this example, a bottom-gate transistor including a metal oxide layer 44 is formed as the transistor 40. The metal oxide layer 44 can serve as a semiconductor layer of the transistor 40. The metal oxide can serve as an oxide semiconductor.

In this embodiment, an oxide semiconductor is used as a semiconductor of a transistor. A semiconductor material having a wider bandgap and a lower carrier density than silicon is preferably used because off-state current of the transistor can be reduced.

The transistor 40 is formed at a temperature lower than or equal to the upper temperature limit of the resin layer 23. The transistor 40 is preferably formed at a temperature lower than the temperature of the heat treatment.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the formation of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as polycrystalline silicon or an oxide semiconductor whose resistance is reduced by adding an impurity element, for example, or silicide such as nickel silicide may be used. A film including graphene may be used as well. The film including graphene can be formed, for example, by reducing a film including graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using either or both of an inert gas and an oxygen gas. Note that there is no particular limitation on the flow ratio of oxygen (the partial pressure of oxygen) in the step of forming the metal oxide film. In the case where a transistor having high field-effect mobility is obtained, the flow ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. The use of such a metal oxide having a wide energy gap leads to a reduction in off-state current of a transistor.

The metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layer 43a and the conductive layer 43b can be formed in the following manner: a conductive film is formed, a resist mask is formed, the conductive film is etched, and the resist mask is removed. Each of the conductive layers 43a and 43b is connected to the metal oxide layer 44.

Note that during the processing for forming the conductive layer 43a and the conductive layer 43b, the metal oxide layer 44 might be partly etched to be thin in a region not covered by the resist mask.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be fabricated (FIG. 8E). In the transistor 40, part of the conductive layer 41 functions as a gate, part of the insulating layer 32 functions as a gate insulating layer, and the conductive layer 43a and the conductive layer 43b function as a source and a drain.

Next, an insulating layer 33 covering the transistor 40 is formed (FIG. 9A). The insulating layer 33 can be formed using a method similar to that of the insulating layer 31.

It is preferable to use an oxide insulating film, such as a silicon oxide film or a silicon oxynitride film, formed in an oxygen-containing atmosphere for the insulating layer 33. An insulating film with low oxygen diffusibility and oxygen permeability, such as a silicon nitride film, is preferably stacked over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer 44. As a result, oxygen vacancies in the metal oxide layer 44 can be filled and defects at the interface between the metal oxide layer 44 and the insulating layer 33 can be repaired, leading to a reduction in defect levels. Accordingly, a display device with extremely high reliability can be manufactured.

Through the above steps, the insulating layer 31, the transistor 40, and the insulating layer 33 can be formed over the resin layer 23 (FIG. 9A).

If the formation substrate 14 and the transistor 40 are separated from each other at this stage by a method described later, a device including no display element can be manufactured. Forming the transistor 40 or forming a capacitor, a resistor, a wiring, and the like in addition to the transistor 40 can provide a semiconductor device, for example.

Then, an insulating layer 34 is formed over the insulating layer 33 (FIG. 9A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the upper temperature limit of the resin layer 23. The insulating layer 34 is preferably formed at a temperature lower than the temperature of the heat treatment.

In the case of using an organic insulating film for the insulating layer 34, it is preferable that the temperature applied to the resin layer 23 in forming the insulating layer 34 be higher than or equal to room temperature and lower than or equal to 350° C., further preferably higher than or equal to room temperature and lower than or equal to 300° C.

In the case of using an inorganic insulating film as the insulating layer 34, the substrate temperature during the film formation is preferably higher than or equal to room temperature and lower than or equal to 350° C., further preferably higher than or equal to 100° C. and lower than or equal to 300° C.

Next, an opening reaching the conductive layer 43b is formed in the insulating layer 34 and the insulating layer 33.

After that, a conductive layer 61 is formed. The conductive layer 61 partly functions as a pixel electrode of a light-emitting element 60. The conductive layer 61 can be formed in the following manner: a conductive film is formed, a resist mask is formed, the conductive film is etched, and the resist mask is removed.

The conductive layer 61 is formed at a temperature lower than or equal to the upper temperature limit of the resin layer 23. The conductive layer 61 is preferably formed at a temperature lower than the temperature of the heat treatment.

The substrate temperature during the formation of the conductive film is preferably higher than or equal to room temperature and lower than or equal to 350° C., further preferably higher than or equal to room temperature and lower than or equal to 300° C.

Next, an insulating layer 35 is formed to cover an end portion of the conductive layer 61. For the insulating layer 35, the description of the organic insulating film or the inorganic insulating film that can be used for the insulating layer 31 can be referred to.

The insulating layer 35 is formed at a temperature lower than or equal to the upper temperature limit of the resin layer 23. The insulating layer 35 is preferably formed at a temperature lower than the temperature of the heat treatment.

In the case of using an organic insulating film for the insulating layer 35, it is preferable that the temperature applied to the resin layer 23 in forming the insulating layer 35 be higher than or equal to room temperature and lower than or equal to 350° C., further preferably higher than or equal to room temperature and lower than or equal to 300° C.

In the case of using an inorganic insulating film as the insulating layer 35, the substrate temperature during the film formation is preferably higher than or equal to room temperature and lower than or equal to 350° C., further preferably higher than or equal to 100° C. and lower than or equal to 300° C.

Then, an EL layer 62 and a conductive layer 63 are formed. Part of the conductive layer 63 functions as a common electrode of the light-emitting element 60.

The EL layer 62 can be formed by an evaporation method, a coating method, a printing method, a discharge method, or the like. In the case where the EL layer 62 is formed for each individual pixel, an evaporation method using a shadow mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature that is lower than or equal to the upper temperature limit of the resin layer 23 and lower than or equal to the upper temperature limit of the EL layer 62. The conductive layer 63 is preferably formed at a temperature lower than the temperature of the heat treatment.

In the above manner, the light-emitting element 60 can be formed (FIG. 9A). In the light-emitting element 60, the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Next, an insulating layer 74 is formed so as to cover the conductive layer 63 (FIG. 9A). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature that is lower than or equal to the upper temperature limit of the resin layer 23 and lower than or equal to the upper temperature limit of the light-emitting element 60. The insulating layer 74 is preferably formed at a temperature lower than the temperature of the heat treatment.

The insulating layer 74 preferably includes an inorganic insulating film with a high barrier property that can be used for the insulating layer 31, for example. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage with the insulating layer 74 is improved.

Then, a protective layer 75 is formed over the insulating layer 74 (FIG. 9A). The adhesive layer 75b and the substrate 75a may be used as the protective layer 75 as illustrated in FIG. 5D1.

Next, the irradiation with the laser light 55 is performed (FIG. 9B1). The laser light 55 is, for example, a linear laser beam with which scanning is performed from the left side to the right side in FIG. 9B1, and the major axis is perpendicular to the scanning direction and the incident direction (from top to bottom). In the laser apparatus, the stack is provided with the formation substrate 14 facing upward. The stack is irradiated with the laser light 55 from the upper side of the stack (formation substrate 14).

For the laser light irradiation step, the description of the above separation method can be referred to.

In the case where a plurality of display devices are fabricated using one formation substrate (a multiple panel method), the plurality of display devices can be formed using one resin layer 23. Alternatively, a plurality of resin layers 23 may be separately formed for display devices. FIG. 9B2 illustrates an example where one resin layer 23 is provided over the formation substrate. FIGS. 9B3 and 9B4 illustrate an example where four resin layers 23 are provided over a formation substrate.

A laser apparatus is difficult to use for a process of a large-sized substrate or is expensive in some cases. Therefore, depending on the size of the formation substrate, as illustrated in FIG. 9B4, the formation substrate may be divided and the resulting formation substrates may each be irradiated with laser light.

Figure 10A:
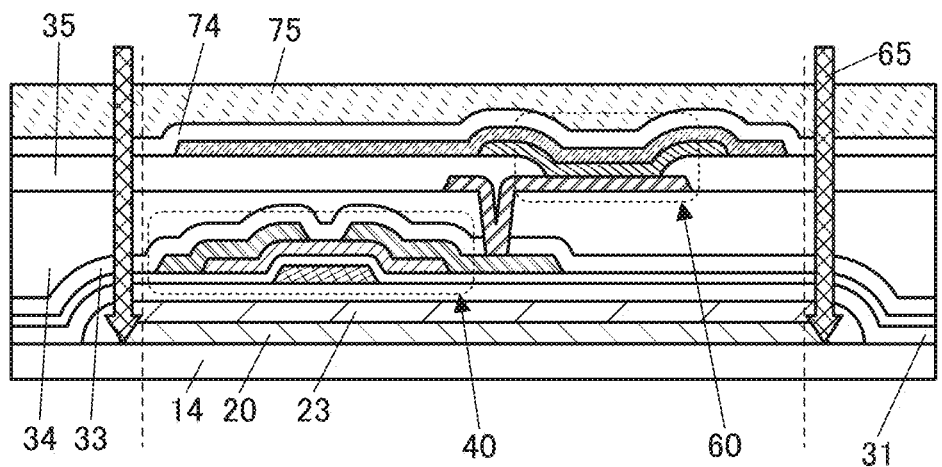
FIGS. 10A to 10C are a cross-sectional view and top views illustrating examples of a manufacturing method of a display device.
Figure 10B:
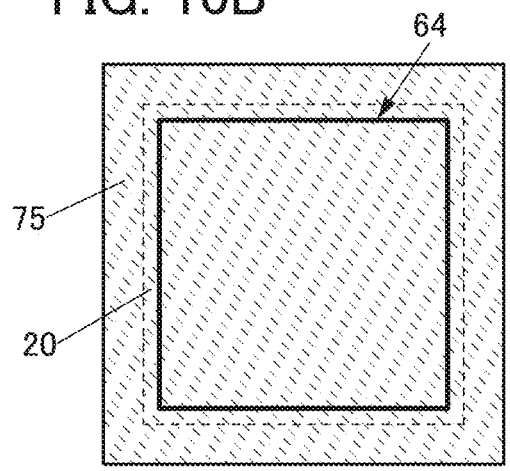
Figure 10C:
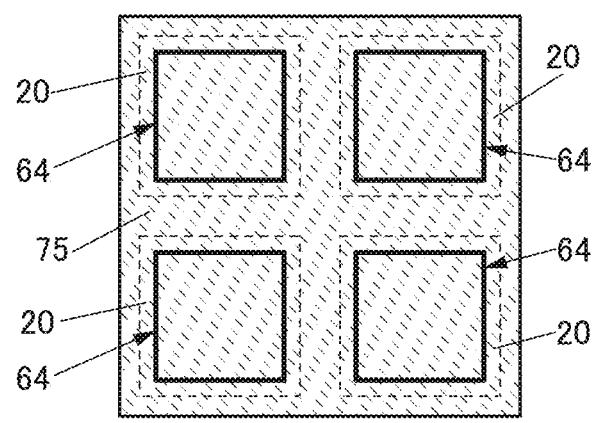

Next, a separation trigger is formed in the resin layer 23 (FIGS. 10A to 10C).

For example, a sharp instrument 65, e.g., a knife, is inserted from the protective layer 75 side into a portion located inward from an end portion of the resin layer 23 to make a cut 64 in a frame-like shape.

Alternatively, the resin layer 23 may be irradiated with laser light in a frame-like shape.

As described above, a plurality of display devices can be formed using one resin layer 23 by a multiple panel method. For example, the plurality of display devices are provided inside the cut 64 shown in FIG. 10B. In that case, the plurality of display devices can be separated from the formation substrate at a time.

Alternatively, a plurality of resin layers 23 may be separately formed for display devices. In the example illustrated in FIG. 10C, four resin layers 23 are formed over a formation substrate. The cut 64 is made in a frame-like shape in each of the four resin layers 23, whereby the display devices can be separated from the formation substrate at different timings.

In the manufacturing method example 1, a portion where the formation substrate 14 and the metal oxide layer 20 are in contact with each other and a portion where the formation substrate 14 and the insulating layer 31 are in contact with each other are provided over the formation substrate 14. In the portion where the formation substrate 14 and the insulating layer 31 are in contact with each other, the formation substrate 14 and the substrate 75a are bonded to each other without the metal oxide layer 20 interposed therebetween and the adhesion thereof does not decrease significantly even when the light irradiation is performed. Therefore, unintentional separation of the resin layer 23 from the metal oxide layer 20 can be inhibited. In addition, the formation of the separation trigger enables the metal oxide layer 20 and the resin layer 23 to be separated from each other at desired timing. Accordingly, the timing of the separation can be controlled and the force required for the separation is small. This can improve yield of the separation step and that of the manufacturing process of a display device.

Figure 11A:
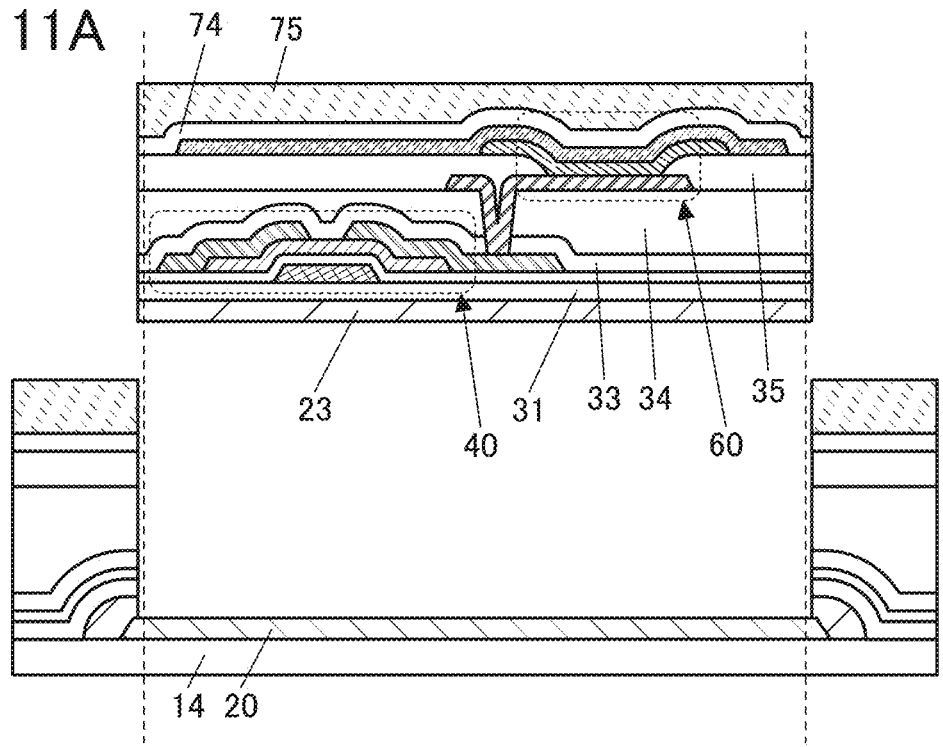
FIGS. 11A and 11B are cross-sectional views illustrating examples of a manufacturing method of a display device.

Then, the metal oxide layer 20 and the resin layer 23 are separated from each other (FIG. 11A).

Figure 11B:
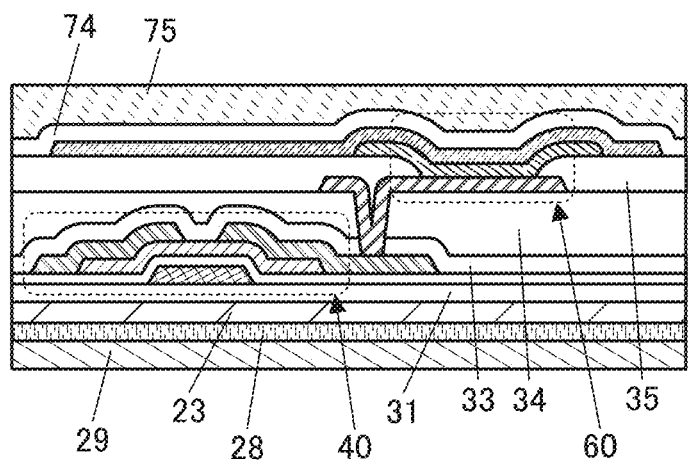

After that, a substrate 29 is bonded to the exposed resin layer 23 with an adhesive layer 28 (FIG. 11B).

The substrate 29 can function as a supporting substrate of the display device. The substrate 29 is preferably a film, further preferably a resin film. In that case, the display device can be reduced in weight and thickness. The display device using a film substrate is more robust than a display device using glass, metal, or the like. The display device can have higher flexibility.

With the use of the separation method described in this embodiment, the transistor 40, the light-emitting element 60, and the like that are fabricated over the formation substrate 14 can be separated from the formation substrate 14 and transferred onto the substrate 29.

The adhesive layer 28 can be formed using the material that can be used for the adhesive layer 75b. The substrate 29 can be formed using the material that can be used for the substrate 75a.

In the manufacturing method example 1, the metal oxide layer 20 and the resin layer 23 are stacked and irradiated with light. As a result, the adhesion or adhesiveness between the metal oxide layer 20 and the resin layer 23 can be reduced. Accordingly, the formation substrate 14 and the resin layer 23 can be easily separated from each other.

Furthermore, film separation can be inhibited and yield in the manufacturing process of the device can be improved by covering the metal oxide layer 20 with the resin layer 23 and reducing the portion where the metal oxide layer 20 and the insulating layer 31 are in contact with each other.

Structure Example 1 of Display Device

Figure 12A:
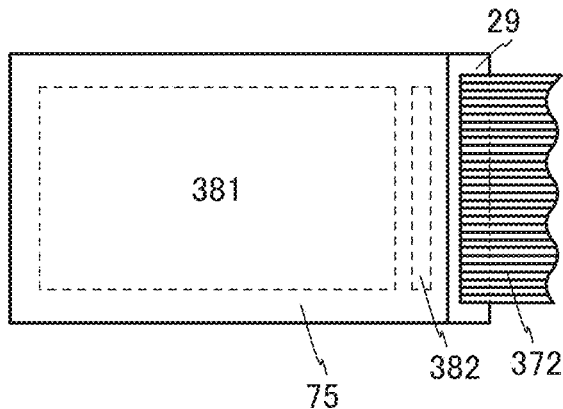
FIGS. 12A to 12C are a top view and cross-sectional views illustrating examples of a display device.
Figure 12B:
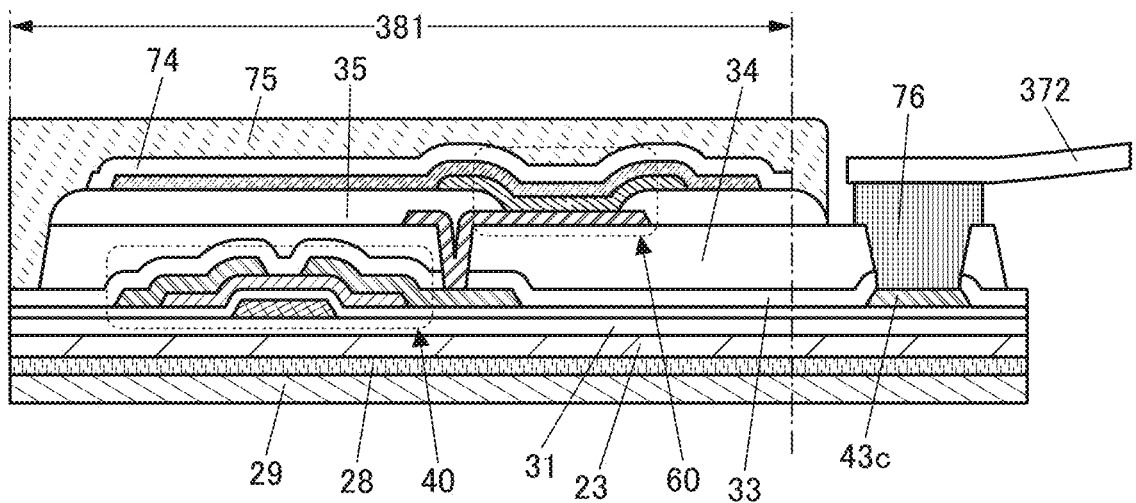
Figure 12C:
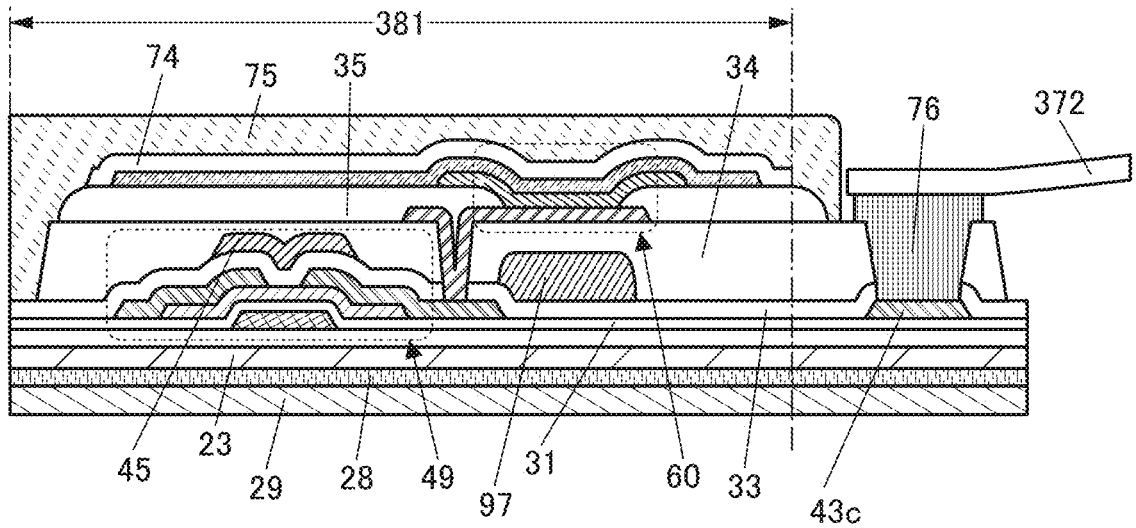

FIG. 12A is a top view of a display device 10A. FIGS. 12B and 12C are each an example of a cross-sectional view illustrating a display portion 381 of the display device 10A and a portion for connection to an FPC 372.

The display device 10A can be manufactured with the use of the above manufacturing method example 1. The display device 10A can be held in a bent state and can be bent repeatedly, for example.

The display device 10A includes a protective layer 75 and a substrate 29. The protective layer 75 side is the display surface side of the display device. The display device 10A includes the display portion 381 and a driver circuit portion 382. The FPC 372 is attached to the display device 10A.

A conductive layer 43c and the FPC 372 are electrically connected through a connector 76 (FIGS. 12B and 12C). The conductive layer 43c can be formed using the same material and the same step as those of the source and the drain of the transistor.

As the connector 76, any of a variety of anisotropic conductive films (ACF), anisotropic conductive pastes (ACP), and the like can be used.

The display device illustrated in FIG. 12C is different from the structure illustrated in FIG. 12B in that not the transistor 40 but a transistor 49 is provided and that a coloring layer 97 is provided over the insulating layer 33. In the case where the light-emitting element 60 has a bottom-emission structure, the coloring layer 97 may be provided closer to the substrate 29 than the light-emitting element 60 is. In the above manufacturing method example 1, a material having high transmittance of visible light can be used for the resin layer 23. Thus, even a display device in which light from the light-emitting element 60 is extracted through the resin layer 23 can have high display quality.

The transistor 49 illustrated in FIG. 12C includes a conductive layer 45 serving as a gate, as well as the components of the transistor 40 in FIG. 12B.

The transistor 49 has a structure in which the semiconductor layer where a channel is formed is provided between two gates. Such a structure enables the control of the threshold voltage of the transistor. The two gates may be connected to each other and supplied with the same signal to operate the transistor. Such a transistor can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

Manufacturing Method Example 2

Figure 13A:
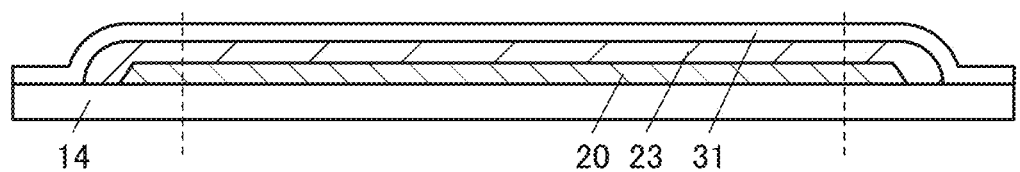
FIGS. 13A to 13C are cross-sectional views illustrating an example of a manufacturing method of a display device.

First, the components from the metal oxide layer 20 to the insulating layer 31 are formed over the formation substrate 14 as in the above separation method (FIG. 13A). As shown in FIG. 13A, the metal oxide layer 20 is covered with the resin layer 23. Thus, the portion where the metal oxide layer 20 and the insulating layer 31 are in contact with each other can be reduced or even eliminated. Therefore, film separation during the manufacturing process of the display device can be inhibited.

Figure 13B:
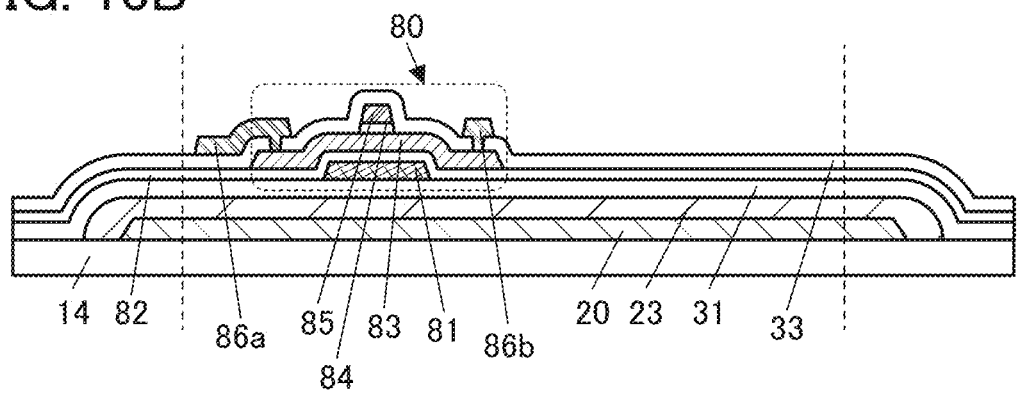

Next, a transistor 80 is formed over the insulating layer 31 (FIG. 13B).

In this example, a transistor including a metal oxide layer 83 and two gates is fabricated as the transistor 80.

The transistor 80 is formed at a temperature lower than or equal to the upper temperature limit of the resin layer 23. The transistor 80 is preferably formed at a temperature lower than the temperature of the heat treatment.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used for the insulating layer 31 can be referred to.

Then, the metal oxide layer 83 is formed. The metal oxide layer 83 can be formed in the following manner: a metal oxide film is formed, a resist mask is formed, the metal oxide film is etched, and the resist mask is removed. For materials for the metal oxide layer 83, the description of the materials that can be used for the metal oxide layer 44 can be referred to.

Then, an insulating layer 84 and a conductive layer 85 are formed. For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 is formed. The insulating layer 33 can be formed using a method similar to that of the insulating layer 31.

The insulating layer 33 preferably contains hydrogen. The hydrogen contained in the insulating layer 33 is diffused to the metal oxide layer 83 in contact with the insulating layer 33, so that part of the metal oxide layer 83 has reduced resistance. Since part of the metal oxide layer 83 serves as a low-resistance region, the on-state current and the field-effect mobility of the transistor 80 can be increased.

Next, openings reaching the metal oxide layer 83 are formed in the insulating layer 33.

Next, a conductive layer 86a and a conductive layer 86b are formed. The conductive layer 86a and the conductive layer 86b can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33.

In the above manner, the transistor 80 can be fabricated (FIG. 13B). In the transistor 80, part of the conductive layer 81 serves as a gate, part of the insulating layer 84 serves as a gate insulating layer, part of the insulating layer 82 serves as a gate insulating layer, and part of the conductive layer 85 serves as a gate. The metal oxide layer 83 includes a channel region and a low-resistance region. The channel region and the conductive layer 85 overlap with each other with the insulating layer 84 provided therebetween. The low-resistance region has a portion connected to the conductive layer 86a and a portion connected to the conductive layer 86b.

Figure 13C:
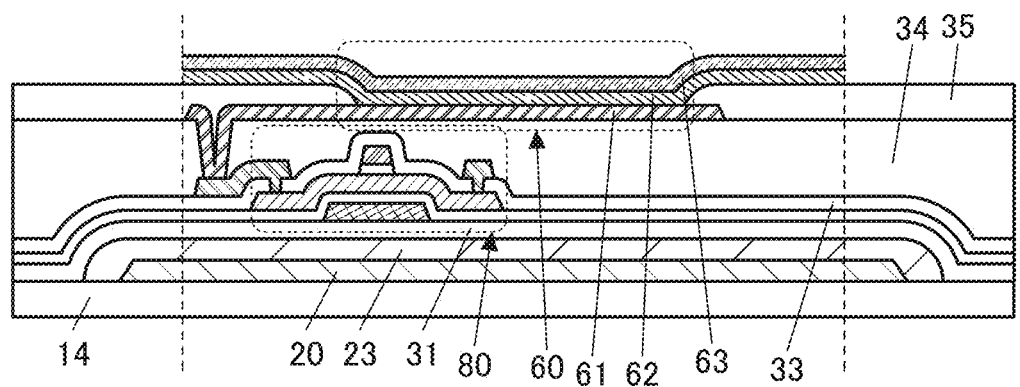

Next, the components from the insulating layer 34 to the light-emitting element 60 are formed over the insulating layer 33 (FIG. 13C). For the steps, the manufacturing method example 1 can be referred to.

Furthermore, the steps illustrated in FIGS. 14A and 14B are performed independently of steps illustrated in FIGS. 13A to 13C. First, an island-shaped metal oxide layer 92 is formed over a formation substrate 91 in a manner similar to that of the step of forming the island-shaped metal oxide layer 20 over the formation substrate 14. Next, an island-shaped resin layer 93 covering an end portion of the metal oxide layer 92 is formed over the island-shaped metal oxide layer 92 in a manner similar to the step of forming the island-shaped resin layer 23 over the island-shaped metal oxide layer 20. Then, in a manner similar to that of the step of forming the insulating layer 31 over the resin layer 23, an insulating layer 95 is formed over the resin layer 93 (FIG. 14A). The metal oxide layer 92 is covered with the resin layer 93. Thus, the portion where the metal oxide layer 92 and the insulating layer 95 are in contact with each other can be reduced or even eliminated. Therefore, film separation during the manufacturing process of the display device can be inhibited.

Next, the coloring layer 97 and a light-blocking layer 98 are formed over the insulating layer 95 (FIG. 14B).

A color filter or the like can be used as the coloring layer 97. The coloring layer 97 is provided to overlap with a display region of the light-emitting element 60.

As the light-blocking layer 98, a black matrix or the like can be used. The light-blocking layer 98 is provided to overlap with the insulating layer 35.

Then, with the use of an adhesive layer 99, the formation substrate 14 and the formation substrate 91 are bonded to each other such that the surface of the formation substrate 14 over which the transistor 80 and the like are formed faces the surface of the formation substrate 91 over which the resin layer 93 and the like are formed (FIGS. 14C1 and 14C2).

When there is a region where the adhesive layer 99 does not overlap with the metal oxide layer 20 and the metal oxide layer 92, separation failure is likely to occur in some cases depending on the area of the region and a degree of adhesion between the adhesive layer 99 and a layer in contact therewith.

Therefore, the adhesive layer 99 preferably overlaps with only a portion where both the metal oxide layer 20 and the metal oxide layer 92 are provided as shown in FIGS. 14C1 and 14C2. In other words, the adhesive layer 99 is not provided in a portion where neither the metal oxide layer 20 nor the metal oxide layer 92 is provided.

When an adhesive or an adhesive sheet having a low fluidity, for example, is used for the adhesive layer 99, the adhesive layer 99 can be easily formed to have an island-like shape (FIG. 14C1).

Alternatively, a partition 96 having a frame-like shape may be formed and the space surrounded by the partition 96 may be filled with the adhesive layer 99 (FIG. 14C2).

In the case where the partition 96 overlaps with the portion where the metal oxide layer 20 and the metal oxide layer 92 are not provided, the partition 96 is preferably formed using an uncured resin or a semi-cured resin. Therefore, an increase in the adhesion of the portion where the metal oxide layer 20 and the metal oxide layer 92 are not provided is suppressed and separation can be conducted easily.

In the case where the partition 96 is used as a component of a display device, the partition 96 is preferably formed using a cured resin. Here, the partition 96 preferably overlaps with only the portion where the metal oxide layer 20 and the metal oxide layer 92 are provided.

Note that in the case where the adhesive layer 99 includes a region where the adhesive layer 99 does not overlap with the metal oxide layer 20 or the metal oxide layer 92, the formation of a separation trigger enables separation at desired timing.

The following steps are described with reference to the stacked structure shown in FIG. 14C1.

Figure 15A:
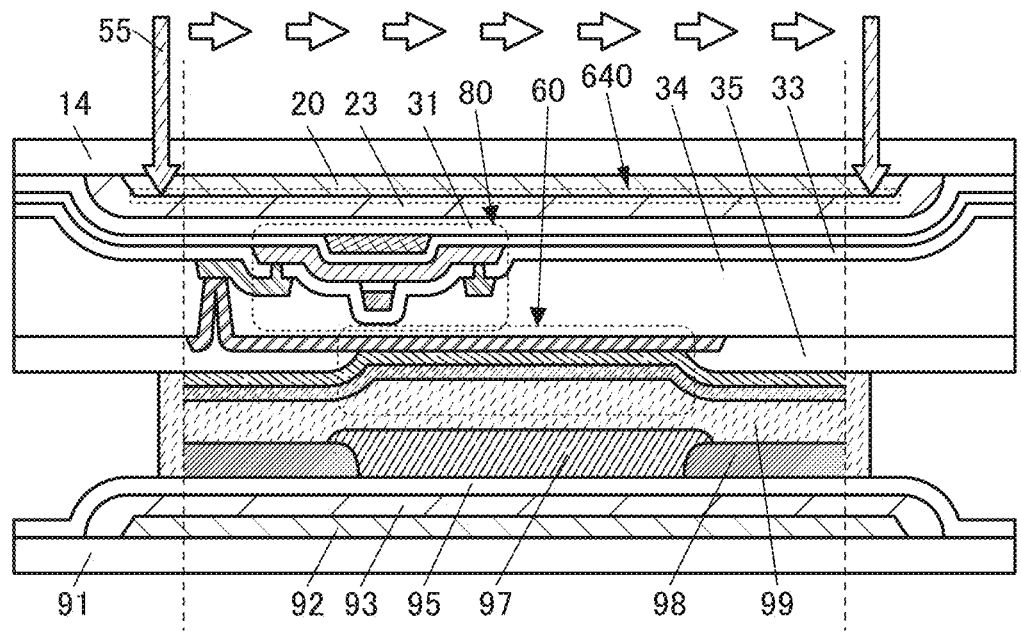
FIGS. 15A and 15B are cross-sectional views illustrating an example of a manufacturing method of a display device.

Next, the irradiation with the laser light 55 is performed (FIG. 15A). The laser light 55 is, for example, a linear laser beam with which scanning is performed from the left side to the right side in FIG. 15A, and the major axis is perpendicular to the scanning direction and the incident direction (from top to bottom). In the laser apparatus, the stack is placed with the formation substrate 14 facing upward. The stack is irradiated with the laser light 55 from above the stack (formation substrate 14).

Any of the formation substrate 14 and the formation substrate 91 may be separated first. In this example, separation of the formation substrate 14 precedes that of the formation substrate 91.

The interface between the metal oxide layer 20 and the resin layer 23 or the vicinity thereof is preferably irradiated with the laser light 55 through the formation substrate 14. The inside of the metal oxide layer 20 may be irradiated with the laser light 55 or the inside of the resin layer 23 may be irradiated with the laser light 55.

The metal oxide layer 20 absorbs the laser light 55. The resin layer 23 may absorb the laser light 55.

The irradiation with the laser light 55 reduces adhesion or adhesiveness between the metal oxide layer 20 and the resin layer 23. The resin layer 23 is embrittled by irradiation with the laser light 55 in some cases.

For the laser light irradiation step, the description of the above separation method can be referred to.

Figure 15B:
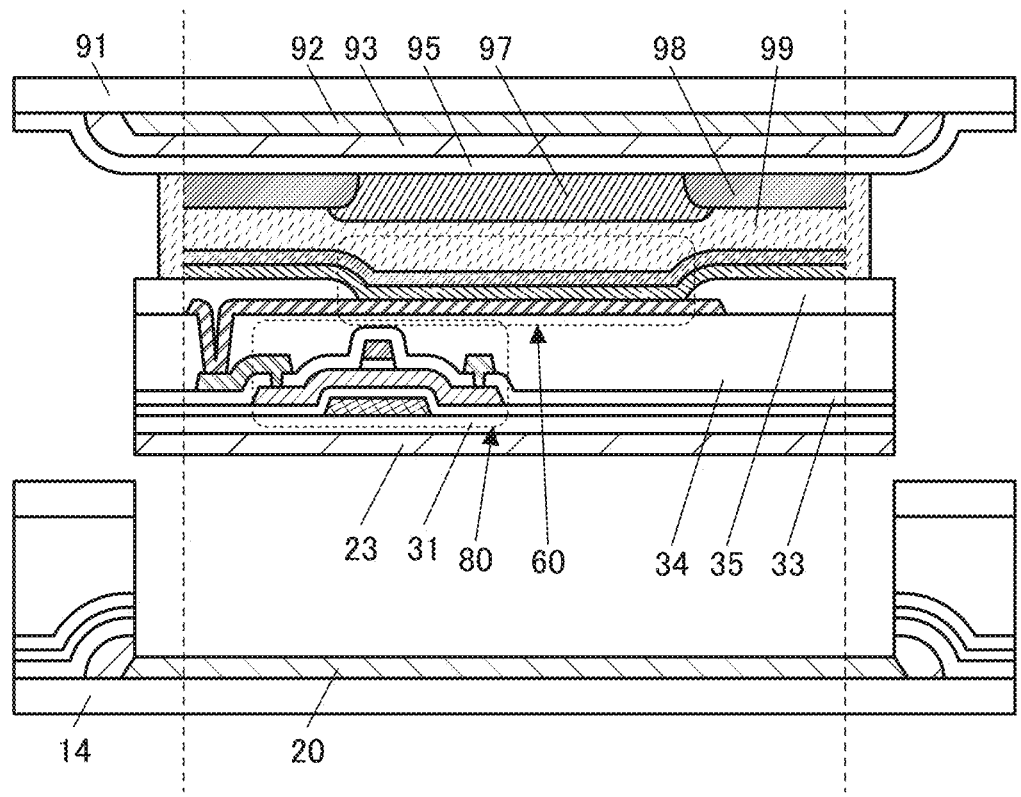

Next, the formation substrate 14 and the transistor 80 are separated from each other (FIG. 15B). An end portion of the adhesive layer 99 is located inward from an end portion of the metal oxide layer 20; thus, yield of the separation step can be improved. Although an example in which a layer to be separated in a portion where the metal oxide layer 20 is not provided remains over the formation substrate 14 is shown here, one embodiment of the present invention is not limited thereto. A part of the layer to be separated remains on the substrate 91 side in some cases.

In the manufacturing method example 2, the metal oxide layer 20 and the resin layer 23 are stacked and irradiated with light. As a result, the adhesion or adhesiveness between the metal oxide layer 20 and the resin layer 23 can be reduced. Accordingly, the formation substrate 14 and the resin layer 23 can be easily separated from each other.

Figure 16A:
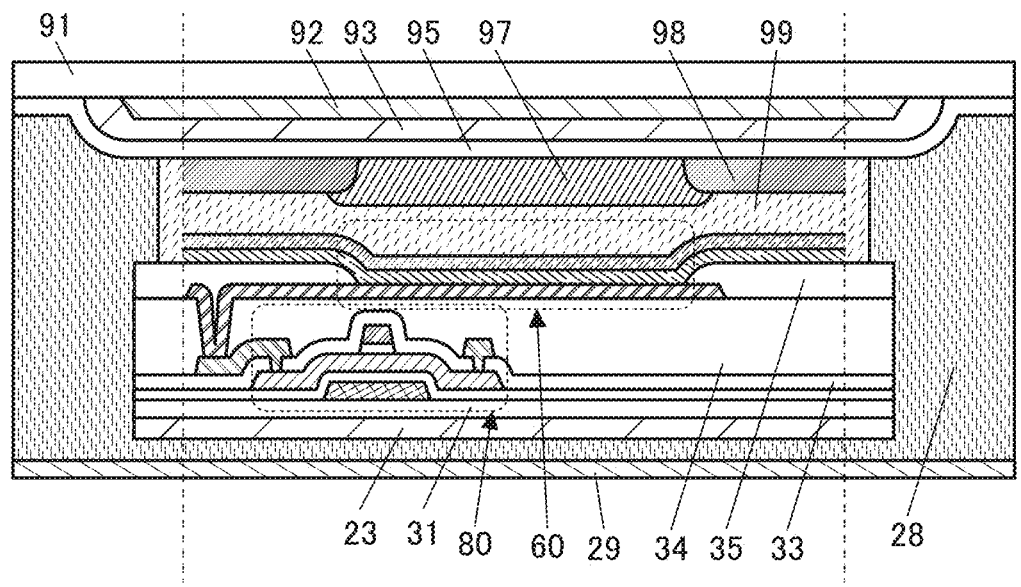
FIGS. 16A and 16B are cross-sectional views illustrating an example of a manufacturing method of a display device.

Next, the substrate 29 and the resin layer 23 that is exposed by being separated from the formation substrate 14 are bonded to each other using the adhesive layer 28 (FIG. 16A). The substrate 29 can serve as a supporting substrate of the display device.

Figure 16B:
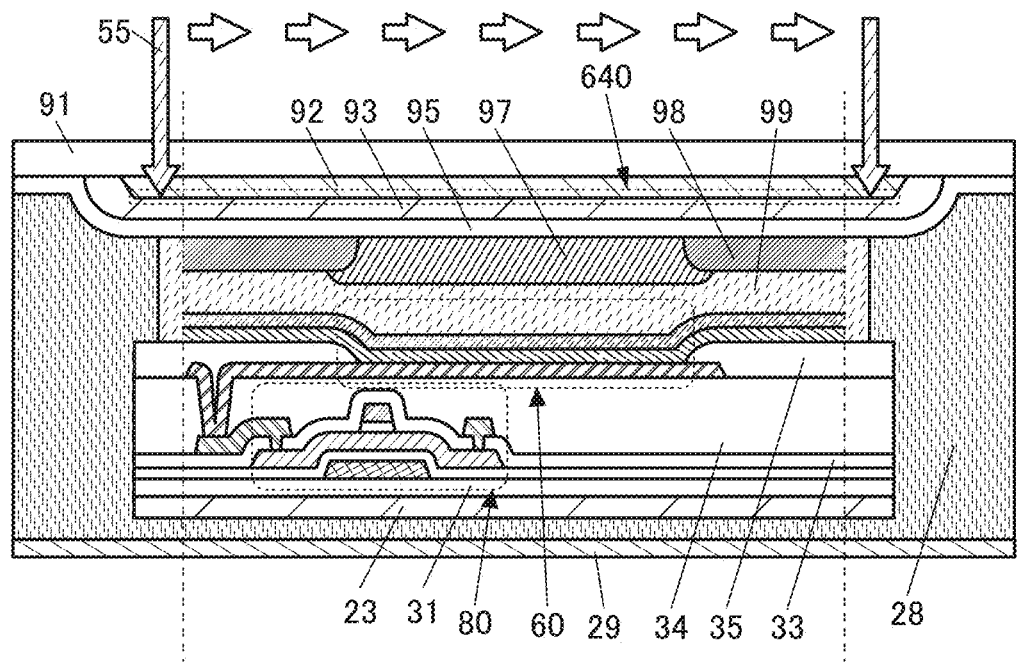

Next, the irradiation with the laser light 55 is performed (FIG. 16B). The laser light 55 is, for example, a linear laser beam with which scanning is performed from the left side to the right side in FIG. 16B, and the major axis is perpendicular to the scanning direction and the incident direction (from top to bottom). In the laser apparatus, the stack is provided with the formation substrate 91 facing upward. The stack is irradiated with the laser light 55 from the upper side of the stack (formation substrate 91).

The interface between the metal oxide layer 92 and the resin layer 93 or the vicinity thereof is preferably irradiated with the laser light 55 through the formation substrate 91. The inside of the metal oxide layer 92 may be irradiated with the laser light 55 or the inside of the resin layer 93 may be irradiated with the laser light 55.

The metal oxide layer 92 absorbs the laser light 55. The resin layer 93 may absorb the laser light 55.

The irradiation with the laser light 55 reduces adhesion or adhesiveness between the metal oxide layer 92 and the resin layer 93. The resin layer 93 is embrittled by irradiation with the laser light 55 in some cases.

For the laser light irradiation step, the description of the above separation method can be referred to.

Figure 17A:
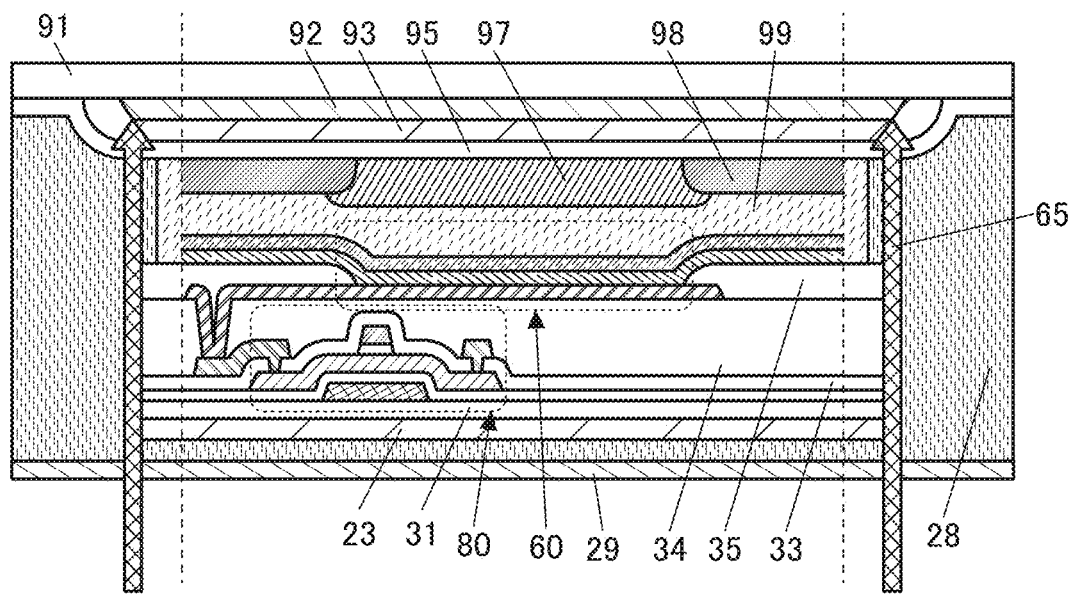
FIGS. 17A and 17B are cross-sectional views illustrating an example of a manufacturing method of a display device.

Next, a separation trigger is formed in the resin layer 93 (FIG. 17A).

In the example illustrated in FIG. 17A, the sharp instrument 65, e.g., a knife, is inserted from the substrate 29 side into a portion located inward from an end portion of the resin layer 93 to make a cut in a frame-like shape. This method is suitable for the case where a resin is used for the substrate 29.

Alternatively, the substrate 29 may be irradiated with laser light in a frame-like shape.

The formation of the separation trigger enables the formation substrate 91 and the resin layer 93 to be separated from each other at desired timing. Accordingly, the timing of the separation can be controlled and the force required for the separation is small. This can improve yield of the separation step and that of the manufacturing process of a display device.

Figure 17B:
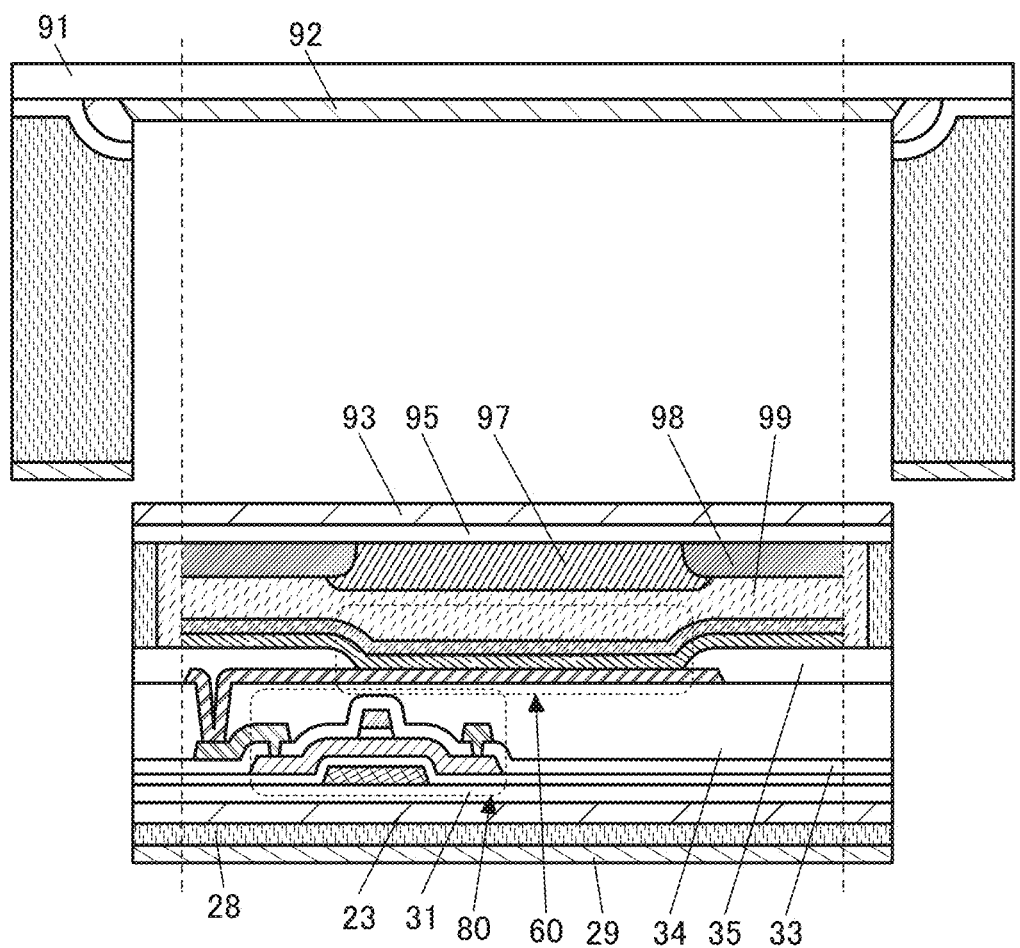

Next, the formation substrate 91 and the transistor 80 are separated from each other (FIG. 17B). In this example, the formation substrate 91 and a portion inside the frame-like cut are separated from each other.

In the manufacturing method example 2, the metal oxide layer 92 and the resin layer 93 are stacked and irradiated with light. As a result, the adhesion or adhesiveness between the metal oxide layer 92 and the resin layer 93 can be reduced. Accordingly, the formation substrate 91 and the resin layer 93 can be easily separated from each other.

Figure 18A:
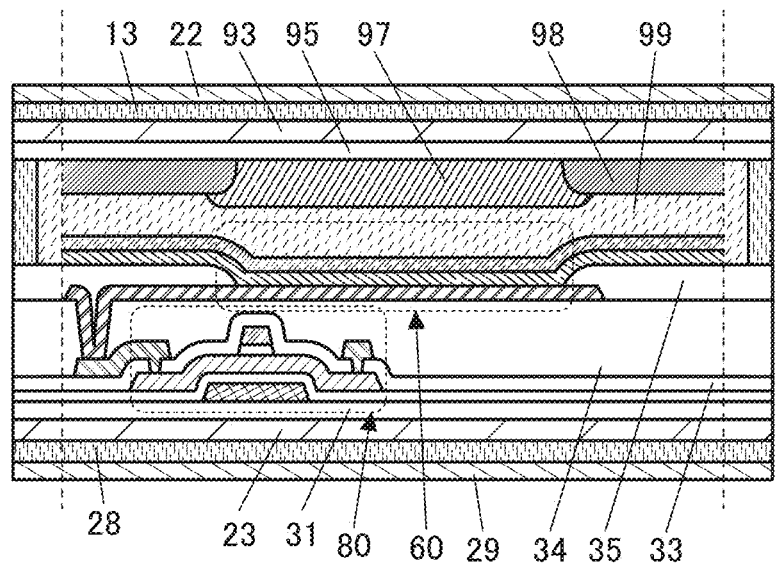
FIGS. 18A and 18B are cross-sectional views illustrating an example of a manufacturing method of a display device.

Next, the substrate 22 and the resin layer 93 that is exposed by being separated from the formation substrate 91 are bonded to each other using an adhesive layer 13 (FIG. 18A). The substrate 22 can serve as a supporting substrate of the display device.

In the example illustrated in FIG. 18A, light emitted from the light-emitting element 60 is extracted to the outside of the display device through the coloring layer 97, the insulating layer 95, and the resin layer 93. It is thus preferable that the resin layer 93 have a high visible light transmittance. In one embodiment of the present invention, the resin layer 93 can have a small thickness. Accordingly, the resin layer 93 can have a high visible light transmittance, which inhibits a reduction in light extraction efficiency of the light-emitting element 60.

Furthermore, in one embodiment of the present invention, the interface between the metal oxide layer 92 and the resin layer 93 or the vicinity thereof is irradiated with light, and the metal oxide layer 92 absorbs part of the light. Thus, even when the resin layer 93 has low light absorptance, the metal oxide layer 92 and the resin layer 93 can be easily separated from each other. Therefore, a material having high visible-light transmittance can be used for the resin layer 93. Consequently, a decrease in light extraction efficiency of the light-emitting element 60 can be prevented.

Figure 18B:
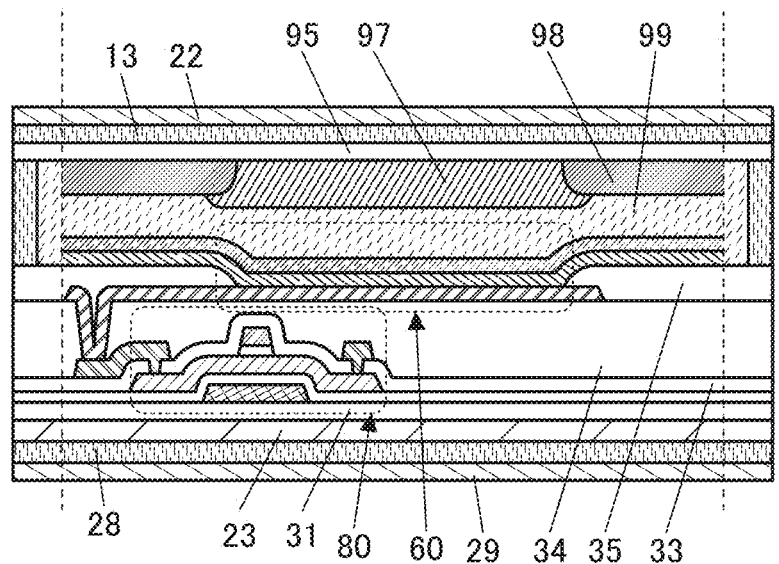

The resin layer 93 may be removed. In that case, the light extraction efficiency of the light-emitting element 60 can be further increased. FIG. 18B illustrates an example in which the resin layer 93 is removed and the substrate 22 is bonded to the insulating layer 95 with the adhesive layer 13.

The adhesive layer 13 can be formed using the material that can be used for the adhesive layer 75b.

The substrate 22 can be formed using the material that can be used for the substrate 75a.

In the manufacturing method example 2, the separation method of one embodiment of the present invention is conducted twice to manufacture a display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

Structure Example 2 of Display Device

Figure 19A:
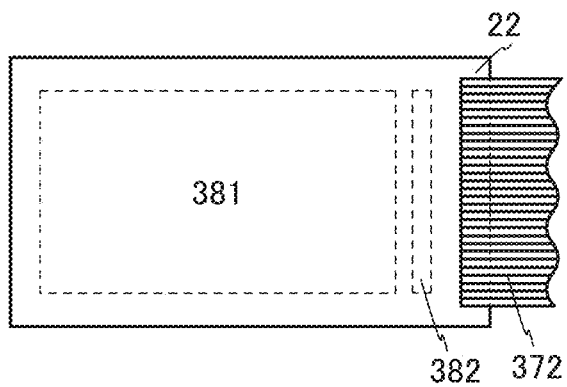
FIG. 19A is a top view illustrating an example of a display device.
Figure 19B:
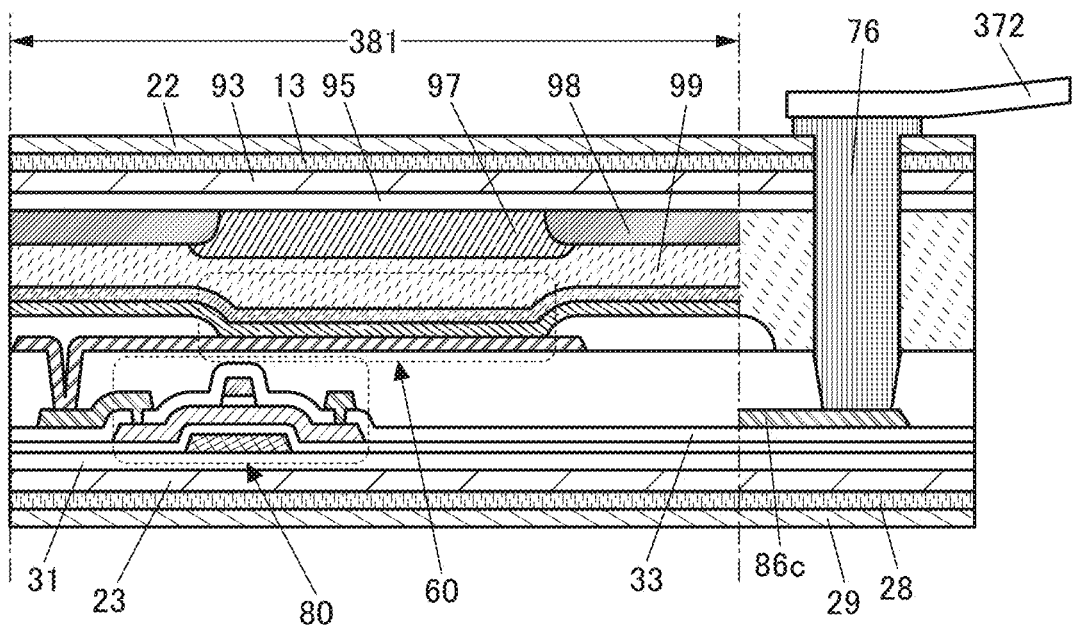
FIGS. 19B and 19C are cross-sectional views illustrating the same.

FIG. 19A is a top view of a display device 10B. FIG. 19B is an example of a cross-sectional view illustrating the display portion 381 of the display device 10B and a portion for connection to the FPC 372.

The display device 10B can be manufactured with the use of the above manufacturing method example 2. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

Each of the substrate 22 and the substrate 29 is preferably a film, further preferably a resin film. In that case, the display device can be reduced in weight and thickness. The display device using a film substrate is more robust than a display device using glass, metal, or the like. In addition, the display device can have higher flexibility.

A conductive layer 86c and the FPC 372 are electrically connected through the connector 76 (FIG. 19B). The conductive layer 86c can be formed using the same material and the same step as those of the source and the drain of the transistor.

Figure 19C:
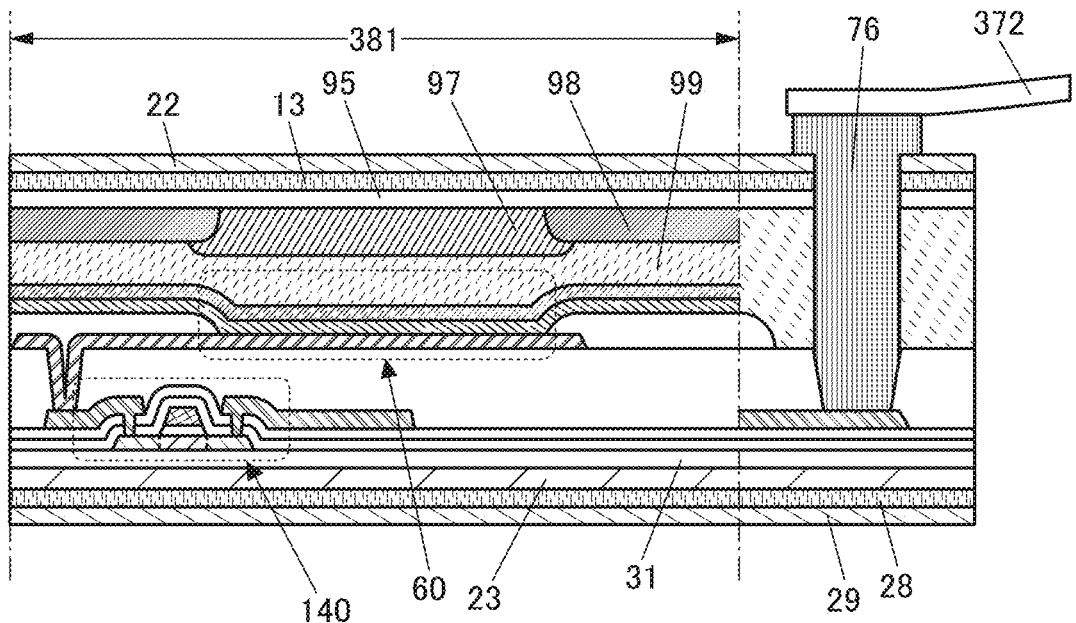

There is no limitation on the structure of the transistors included in the display device of this embodiment. For example, the display device may include a transistor 140 with a top gate structure as shown in FIG. 19C.

In this embodiment, the island-shaped metal oxide layer is formed over the formation substrate, the metal oxide layer is covered with the resin layer, and the portion where the metal oxide layer and an inorganic insulating layer are in contact with each other is reduced. Thus, film separation can be inhibited and yield in the manufacturing process of the device can be improved. Furthermore, the interface between the metal oxide layer and the resin layer or the vicinity thereof is irradiated with light, and the adhesion or adhesiveness between the metal oxide layer and the resin layer can be reduced. Accordingly, the metal oxide layer and the resin layer can be easily separated from each other at desired timing.

This embodiment can be combined with any other embodiment as appropriate. In the case where a plurality of structure examples are described in one embodiment in this specification, some of the structure examples can be combined as appropriate.

Embodiment 2

In this embodiment, a display device that can be manufacturing by applying one embodiment of the present invention will be described with reference to FIG. 20, FIG. 21, FIG. 22, FIG. 23, FIGS. 24A and 24B, and FIG. 25.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than a microelectromechanical systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, a highly convenient display device with high visibility regardless of the ambient brightness can be fabricated. Specifically, a highly convenient display device with high visibility under external light and indoors can be fabricated.

Note that the third mode can be referred to as a mode employing a hybrid display method.

The display device and the input/output device described in this embodiment can be referred to as a hybrid display device.

Hybrid display is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display device performing hybrid display is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above descriptions.

Furthermore, a hybrid display device includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display device has a function of displaying a letter and/or an image using one or both of reflected light and self-emitted light in a display portion.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

In the display device of this embodiment, the first pixels can display a full-color image and the second pixels can display a full-color image. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Figure 20:
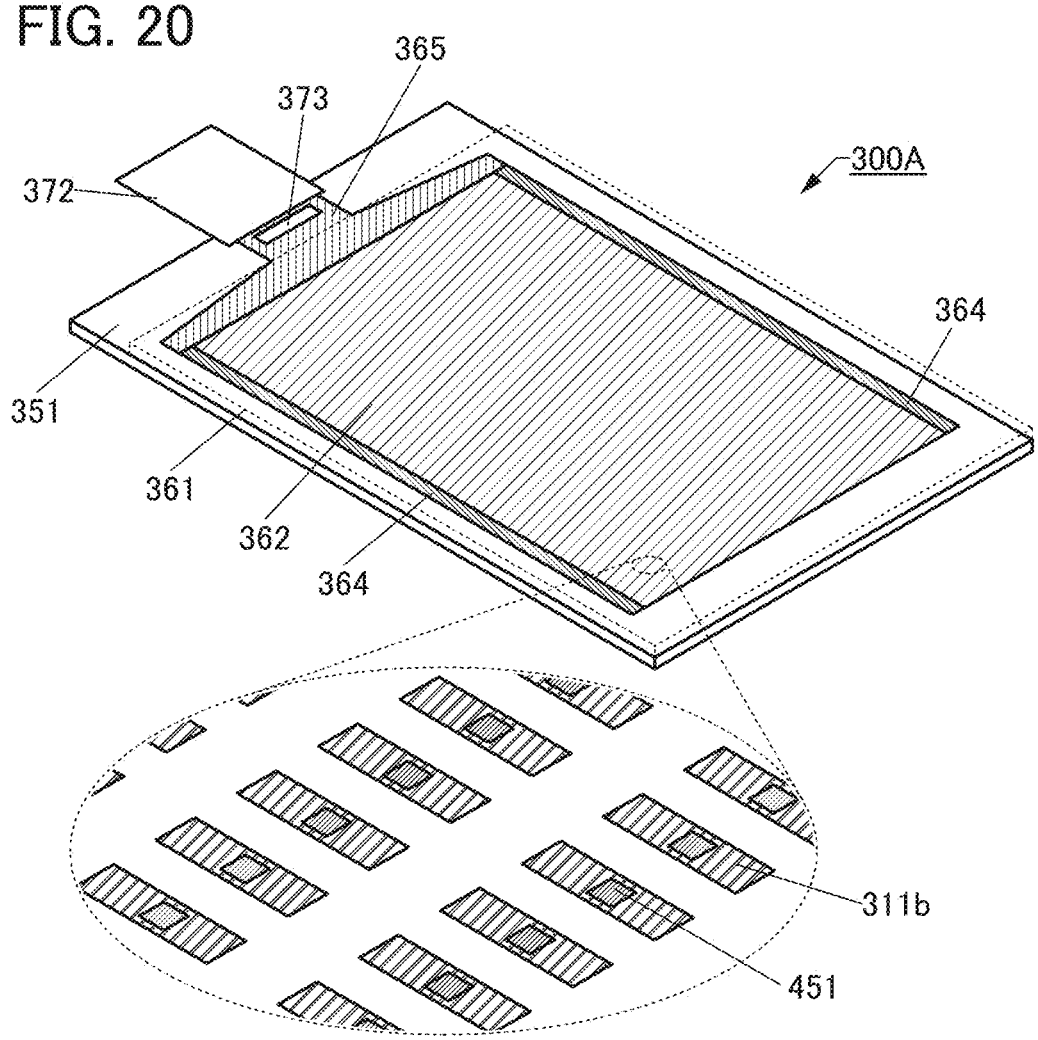
FIG. 20 is a perspective view illustrating an example of a display device.

FIG. 20 is a schematic perspective view of a display device 300A. In the display device 300A, the substrate 351 and the substrate 361 are bonded to each other. In FIG. 20, the substrate 361 is denoted by a dashed line.

The display device 300A includes a display portion 362, a circuit 364, a wiring 365, and the like. FIG. 20 illustrates an example in which the display device 300A is provided with an integrated circuit (IC) 373 and an FPC 372. Thus, the structure illustrated in FIG. 20 can be regarded as a display module including the display device 300A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 20 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300A and the display module are not necessarily provided with an IC. The IC may be provided over the FPC by a COF method or the like.

FIG. 20 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 20, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311b and cannot be extracted to the outside, in some cases. The opening 451 with a sufficiently large area can reduce waste of light emitted from the light-emitting element 170.

Figure 21:
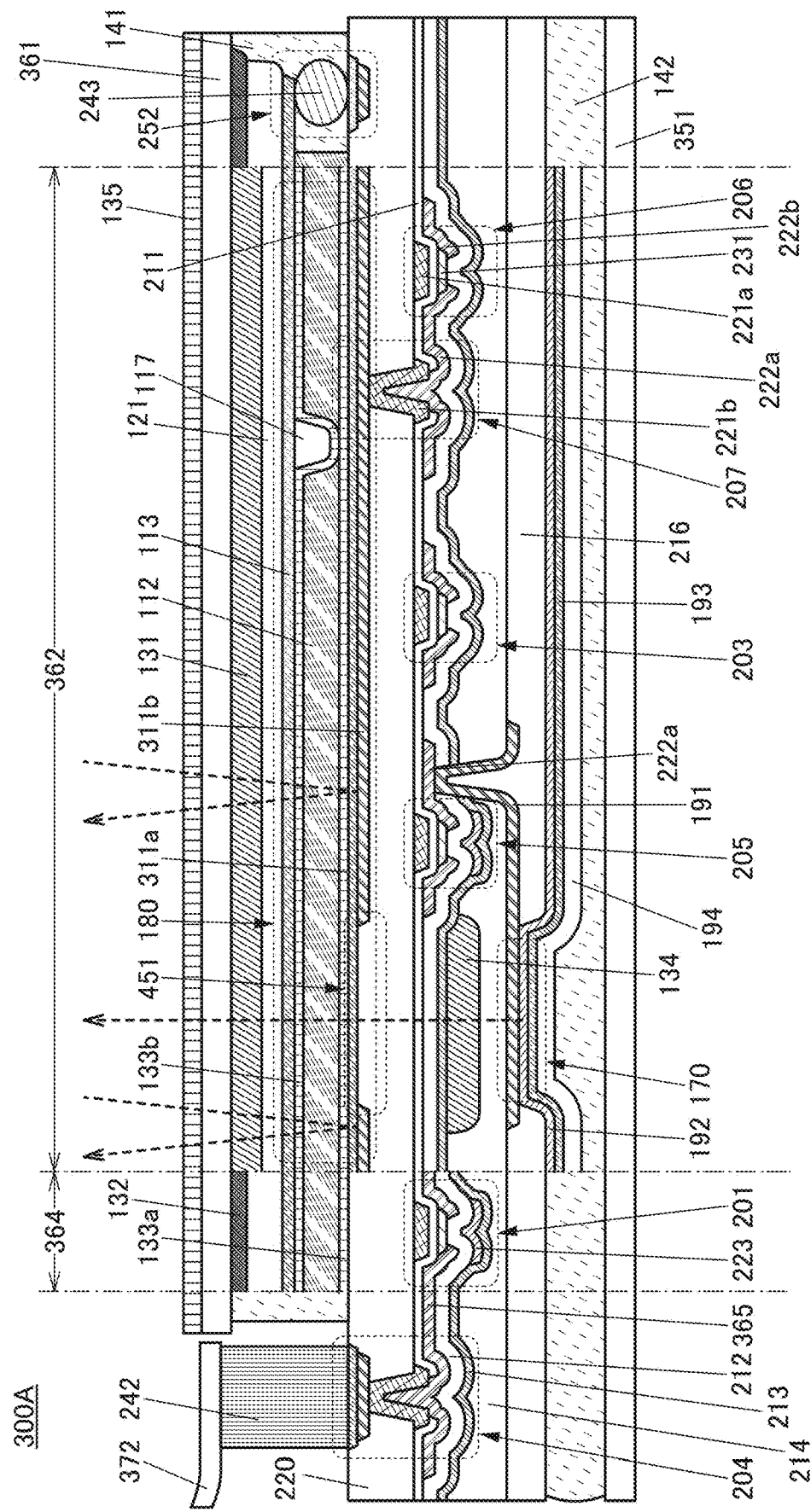
FIG. 21 is a cross-sectional view illustrating an example of a display device.

FIG. 21 illustrates an example of cross-sections of part of a region including the FPC 372, part of a region including the circuit 364, and part of a region including the display portion 362 of the display device 300A illustrated in FIG. 20.

The display device 300A illustrated in FIG. 21 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with an adhesive layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a serving as a pixel electrode, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength range is absorbed by the coloring layer 131 and thus, emitted light is red light, for example.

As illustrated in FIG. 21, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals in a boundary portion of these regions is prevented and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 311a is electrically connected to part of the electrode 113 with a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 21, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The light-emitting element 170 is a bottom-emission light-emitting element. The light-emitting element 170 has a stacked-layer structure in which an electrode 191 functioning as a pixel electrode, an EL layer 192, and an electrode 193 functioning as a common electrode are stacked in this order from the insulating layer 220 side. The electrode 191 is connected to the conductive layer 222a included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit a variety of colors when the color of the coloring layer varies among pixels. The display device 300A can display a color image using the liquid crystal element 180. The display device 300A can display a color image using the light-emitting element 170.

The transistor 201, the transistor 203, the transistor 205, and the transistor 206 are formed on a plane of the insulating layer 220 on the substrate 351 side. These transistors can be fabricated through the same step.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same step, a manufacturing process can be simplified as compared to the case where two transistors are formed on different planes.

The pixel electrode of the liquid crystal element 180 is positioned on the opposite side of a gate insulating layer included in the transistor from the pixel electrode of the light-emitting element 170.

In the case where a transistor including a metal oxide in its channel formation region and having an extremely low off-state current is used as the transistor 206 or in the case where a memory element electrically connected to the transistor 206 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material including an oxide for the conductive layer 223. A conductive film used for the conductive layer 223 is formed in an oxygen-containing atmosphere, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance metal oxide for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a super twisted nematic (STN) mode, a transverse bend alignment (TBA) mode, an electrically controlled birefringence (ECB) mode, a guest-host mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

For the materials that can be used for the light-emitting element, the transistors, the insulating layers, the conductive layers, the adhesive layers, the connection layer, and the like, the description in Embodiment 1 can be referred to.

Application Example

In one embodiment of the present invention, a display device provided with a touch sensor (hereinafter also referred to as an input/output device or a touch panel) can be manufactured.

There is no particular limitation on a sensor element included in the input/output device of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, an input/output device including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The input/output device of one embodiment of the present invention can have any of a variety of structures, including a structure in which a display device and a sensor element that are separately formed are bonded to each other and a structure in which an electrode and the like included in a sensor element are provided over one or both of a pair of substrates included in the display panel.

Figure 22:
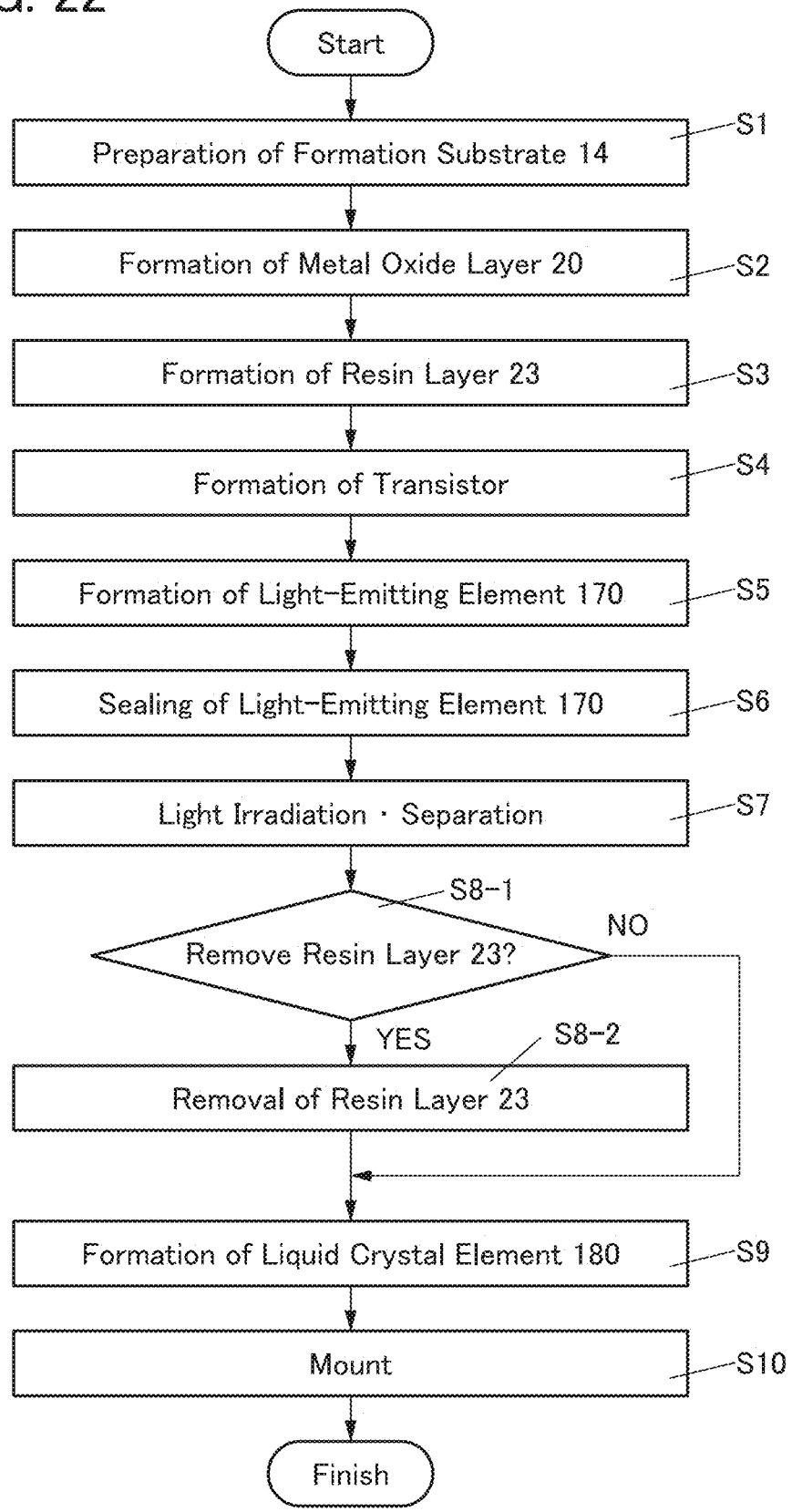
FIG. 22 is a flowchart showing an example of a manufacturing method of a display device.
Figure 23:
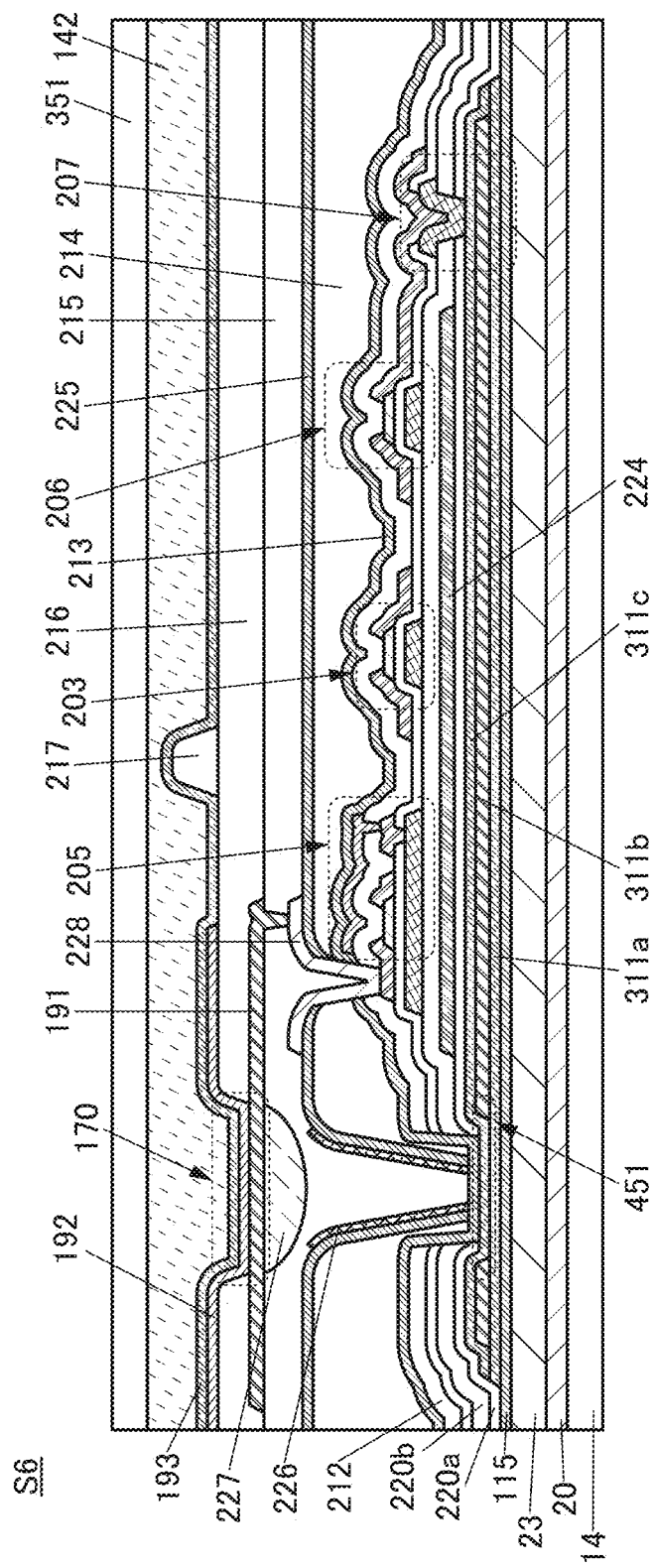
FIG. 23 is a cross-sectional view illustrating an example of a manufacturing method of a display device.

An input/output device having a structure in which a display device and a sensor element that are separately formed are bonded to each other will be described below. FIG. 22 shows a flowchart of a method for manufacturing the display device of one embodiment of the present invention. FIG. 23 and FIGS. 24A and 24B are cross-sectional views of the display device during manufacture. FIG. 23 corresponds to Step S6 in FIG. 22. Similarly, FIG. 24A and FIG. 24B correspond to Step S7 and Step S8-2, respectively.

First, the formation substrate 14 is prepared as shown in FIG. 22 (Step S1). Then, the metal oxide layer 20 is formed over the formation substrate 14 (Step S2). Here, the metal film is oxidized by performing $H_2O$ plasma treatment after the metal film is formed, so that the metal oxide layer 20 is formed. For the method for forming the metal oxide layer 20, Embodiment 1 can be referred to.

Next, the resin layer 23 is formed over the metal oxide layer 20 (Step S3). For the method for forming the resin layer 23, Embodiment 1 can be referred to.

In one embodiment of the present invention, the resin layer 23 is formed so as to cover the end portion of the metal oxide layer 20. Thus, the resin layer 23 covers the metal oxide layer 20 and the portion where the metal oxide layer 20 is not covered with the resin layer 23 is reduced or even eliminated. Therefore, even when the film with low adhesion between the metal oxide layer 20 is formed over the resin layer 23, the portion where the film and the metal oxide layer 20 are in contact with each other can be reduced or even eliminated. Thus, film separation during the process can be inhibited and yield of the manufacturing of the display device can be improved.

Next, the transistor and the like are formed over the resin layer 23 (Step S4). Next, the light-emitting element electrically connected to the transistor is formed (Step S5) and sealing of the light-emitting element is performed (Step S6). Components formed over the resin layer 23 are described with reference to FIG. 23. Note that for the components that are already described, the above description can be referred to.

As illustrated in FIG. 23, the metal oxide layer 20 is formed over the formation substrate 14, and the resin layer 23 is formed over the metal oxide layer 20. An insulating layer 115 is formed over the resin layer 23. Thus, the insulating layer 115 preferably has a high barrier property. A silicon nitride film is suitable for the insulating layer 115. The electrode 311a, the electrode 311b, and an electrode 311c are stacked in this order over the insulating layer 115. An end portion of the electrode 311a and an end portion of the electrode 311c are located outward from an end portion of the electrode 311b and are in contact with each other. Conductive films that transmit visible light are used for the electrodes 311a and 311c. A conductive film that reflects visible light is used for the electrode 311b. The electrode 311b has an opening 451. The opening 451 overlaps with the light-emitting region of the light-emitting element 170. An insulating layer 220a is provided over the electrode 311c, a conductive layer 224 is provided over the insulating layer 220a, and an insulating layer 220b is provided over the conductive layer 224. The conductive layer 224 functions as one electrode of a capacitor. The transistor 203, the transistor 205, and the transistor 206 are provided over the insulating layer 220b. One of the source and the drain of the transistor 206 is electrically connected to the electrode 311c in the connection portion 207. The transistor 205 includes two gates. The two gates are electrically connected to each other. One of the source and the drain of the transistor 205 is electrically connected to the electrode 191 of the light-emitting element 170 through a conductive layer 228. The transistors each are covered with the insulating layers 212 to 215 and an insulating layer 225. One or more of these insulating layers preferably have a high barrier property. FIG. 23 illustrates an example where a material having a high barrier property is used for the insulating layer 213 and the insulating layer 225. The insulating layer 213 is provided to cover end portions of the insulating layer 220a, the insulating layer 220b, the insulating layer 212, and the like. The insulating layer 225 is provided to cover an end portion of the insulating layer 214. The covering film 226 is a film that reflects visible light. The covering film 226 has a function of reflecting part of light from the light-emitting element 170 to supply the part of the light to the opening 451 side. The lens 227 has a function of transmitting the light from the light-emitting element 170. The lens 227 overlaps with the light-emitting region of the light-emitting element 170. The light-emitting element 170 includes the electrode 191, the EL layer 192, and the electrode 193. The EL layer 192 is colored separately for each subpixel. The end portion of the electrode 191 is covered with the insulating layer 216.

The insulating layer 217 functions as a spacer. The light-emitting element 170 and the substrate 351 are bonded to each other with the adhesive layer 142.

Next, the transistor and the like are separated from the formation substrate 14 and transferred to the substrate 351 side (Step S7). Here, an interface between the metal oxide layer 20 and the resin layer 23 or the vicinity thereof is irradiated with laser light through the formation substrate 14. Separation occurs at the interface between the metal oxide layer 20 and the resin layer 23, so that the resin layer 23 is exposed (FIG. 24A).

In Step S8-1, whether the resin layer 23 is removed or not is determined. After separation, in the case where the resin layer 23 is removed, the process moves on to Step S8-2. In the case where the resin layer 23 is not removed, the process moves to Step 9. Here, the case where the resin layer 23 is removed is described.

Next, the insulating layer 115 is exposed by removing the resin layer 23 (Step S8-2). Note that the electrode 311a may be exposed by removing part or the whole of the insulating layer 115. When the insulating layer 115 having a high barrier property remains, entry of water into the transistor or the light-emitting element 170 can be prevented, which can increase the reliability of the display device. Here, the resin layer 23 is removed by ashing (FIG. 24B).

Figure 25:
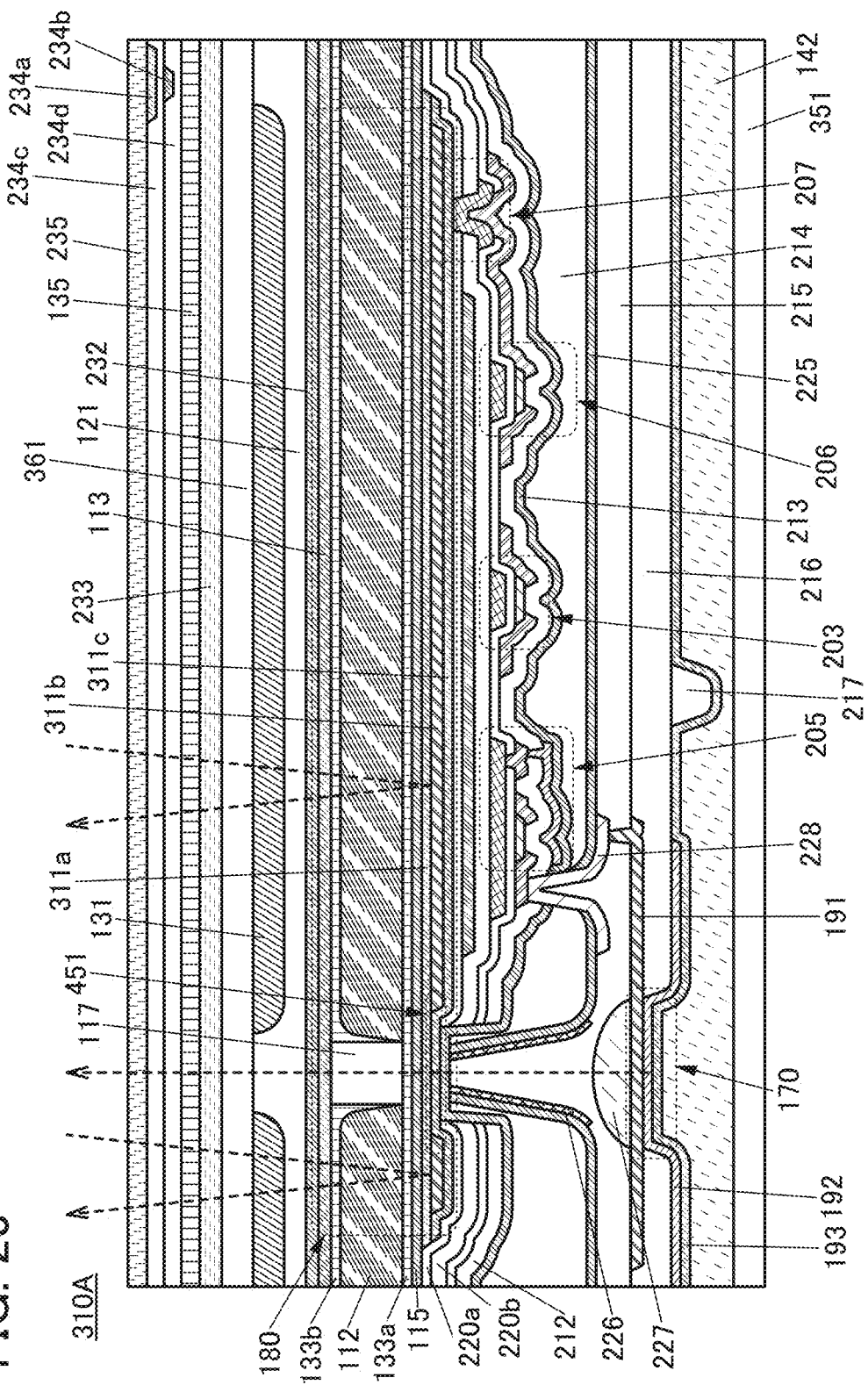
FIG. 25 is a cross-sectional view illustrating an example of an input/output device.

Next, the liquid crystal element 180 is formed (Step S9). The alignment film 133a is formed over the insulating layer 115 (or the electrode 311a). The coloring layer 131, the insulating layer 121, an insulating layer 232, the electrode 113, the insulating layer 117, and the alignment film 133b are formed in this order on one surface of the substrate 361. FIG. 25 illustrates an example where the coloring layer 131 does not overlap with the light-emitting region of the light-emitting element 170, but the coloring layer 131 may overlap with the light-emitting region of the light-emitting element 170. The insulating layer 121 serves as an overcoat. As the insulating layer 232, an insulating film having a high barrier property is suitably used. The electrode 113 serves as a common electrode of the liquid crystal element 180. The insulating layer 117 serves as a spacer for maintaining a cell gap of the liquid crystal element 180. The insulating layer 117 transmits visible light.

The liquid crystal element 180 is formed by bonding the substrate 351 and the substrate 361 so that the liquid crystal layer 112 is sandwiched between the alignment film 133a and the alignment film 133b. The liquid crystal element 180 includes the electrode 311a, the electrode 311b, the electrode 311c, the liquid crystal layer 112, and the electrode 113.

Furthermore, a diffusion film 233 and the polarizing plate 135 are bonded to the other surface of the substrate 361. The substrate 235 one surface of which is provided with a touch sensor is bonded to the polarizing plate 135. Note that an adhesive layer is not illustrated in some portions in FIG. 25. It is preferable that anti-reflective processing be performed on the other surface of the substrate 235. For example, anti-glare treatment is preferably performed. Reflected light can be scattered by roughness of the surface so as to reduce reflection. An insulating layer 234c is provided between a conductive layer 234a and a conductive layer 234b of the touch sensor. The conductive layer 234b is covered with an insulating layer 234d.

Through the above steps, an input/output device 310A in FIG. 25 can be formed. Then, an FPC, an IC, and the like are mounted in the device (Step S10).

The display device of this embodiment includes two types of display elements as described above; thus, switching between a plurality of display modes is possible. Accordingly, the display device can have high visibility regardless of the ambient brightness, leading to high convenience.

This embodiment can be combined with any other embodiment as appropriate.

Embodiment 3

Described in this embodiment is a metal oxide applicable to a transistor disclosed in one embodiment of the present invention. In particular, details about a metal oxide and a cloud-aligned composite (CAC)-OS are described below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ and $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X1}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This embodiment can be combined with any other embodiment as appropriate.

Embodiment 4

In this embodiment, electronic devices of one embodiment of the present invention will be described.

According to one embodiment of the present invention, highly reliable electronic devices having flat surfaces can be manufactured. Furthermore, highly reliable electronic devices with curved surfaces can be fabricated by one embodiment of the present invention. In addition, flexible and highly reliable electronic devices can be fabricated by one embodiment of the present invention.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 26A:
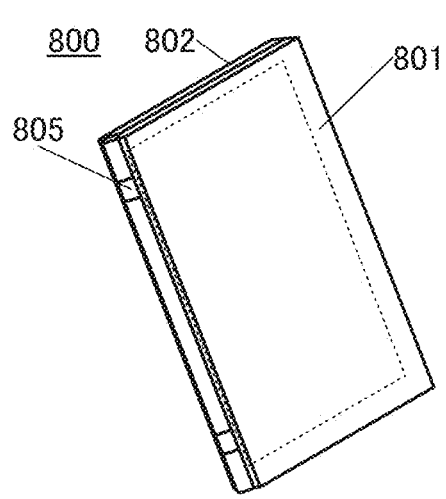
FIGS. 26A to 26D illustrate examples of electronic devices.
Figure 26B:
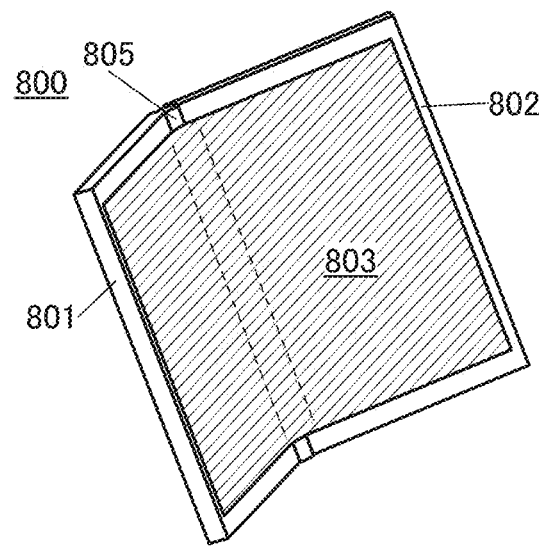

A portable information terminal 800 illustrated in FIGS. 26A and 26B includes a housing 801, a housing 802, a display portion 803, a hinge portion 805, and the like.

The housing 801 and the housing 802 are joined together with the hinge portion 805. The portable information terminal 800 can be opened as illustrated in FIG. 26B from a closed state (FIG. 26A). Thus, the portable information terminal 800 has high portability when carried and excellent visibility when used because of its large display region.

In the portable information terminal 800, the flexible display portion 803 is provided across the housing 801 and the housing 802 which are joined to each other by the hinge portion 805.

The display device manufactured using one embodiment of the present invention can be used for the display portion 803. Thus, the portable information terminal can be manufactured with high yield.

The display portion 803 can display at least one of a text, a still image, a moving image, and the like. When a text is displayed on the display portion, the portable information terminal 800 can be used as an e-book reader.

When the portable information terminal 800 is opened, the display portion 803 is significantly curved. For example, the display portion 803 is held while including a curved portion with a radius of curvature of greater than or equal to 1 mm and less than or equal to 50 mm, preferably greater than or equal to 5 mm and less than or equal to 30 mm. Part of the display portion 803 can display an image while being bent since pixels are continuously arranged from the housing 801 to the housing 802.

The display portion 803 functions as a touch panel and can be controlled with a finger, a stylus, or the like.

The display portion 803 is preferably formed using one flexible display. Thus, a continuous image can be displayed between the housing 801 and the housing 802. Note that each of the housing 801 and the housing 802 may be provided with a display.

The hinge portion 805 preferably includes a locking mechanism so that an angle formed between the housing 801 and the housing 802 does not become larger than a predetermined angle when the portable information terminal 800 is opened. For example, an angle at which the housing 801 and the housing 802 become locked (they are not opened any further) is preferably greater than or equal to 90° and less than 180° and can be typically 90°, 120°, 135°, 150°, 175°, or the like. In that case, the convenience, safety, and reliability of the portable information terminal 800 can be improved.

When the hinge portion 805 includes a locking mechanism, excessive force is not applied to the display portion 803; thus, breakage of the display portion 803 can be prevented. Therefore, a highly reliable portable information terminal can be provided.

A power button, an operation button, an external connection port, a speaker, a microphone, or the like may be provided for the housing 801 and the housing 802.

Either of the housing 801 and the housing 802 is provided with a wireless communication module, and data can be transmitted and received through a computer network such as the Internet, a local area network (LAN), or Wi-Fi (registered trademark).

Figure 26C:
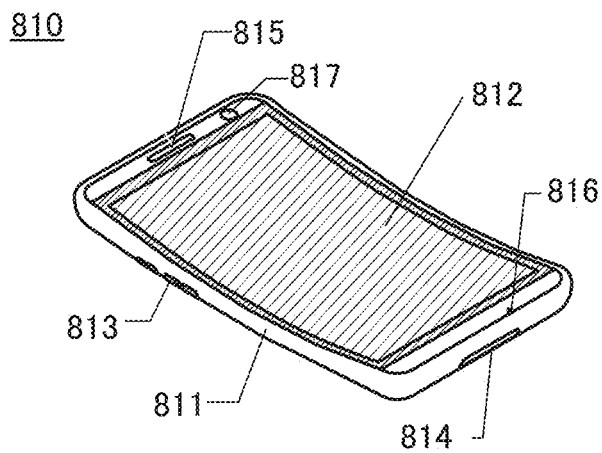

A portable information terminal 810 illustrated in FIG. 26C includes a housing 811, a display portion 812, an operation button 813, an external connection port 814, a speaker 815, a microphone 816, a camera 817, and the like.

The display device manufactured using one embodiment of the present invention can be used for the display portion 812. Thus, the portable information terminal can be manufactured with high yield.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 26D:
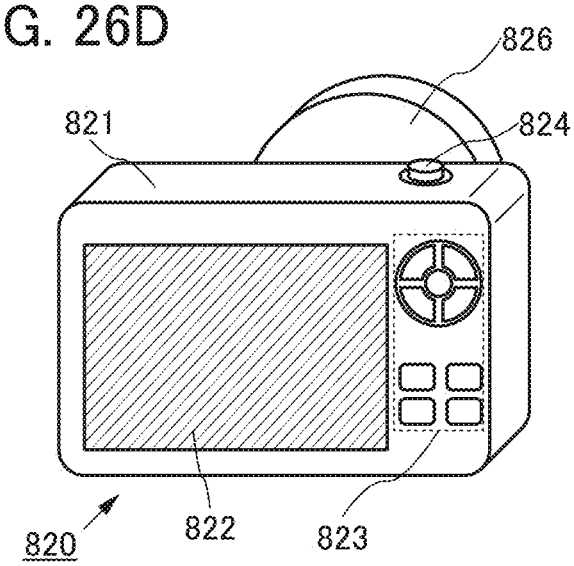

A camera 820 illustrated in FIG. 26D includes a housing 821, a display portion 822, operation buttons 823, a shutter button 824, and the like. Furthermore, an attachable lens 826 is attached to the camera 820.

The display device manufactured using one embodiment of the present invention can be used for the display portion 822. Thus, the camera can be manufactured with high yield.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which has a function of a touch panel.

Note that a stroboscope, a viewfinder, or the like can be additionally attached to the camera 820. Alternatively, these may be incorporated into the housing 821.

FIGS. 27A to 27E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using one embodiment of the present invention can be favorably used for the display portion 9001. Thus, the electronic devices can be manufactured with high yield.

The electronic devices illustrated in FIGS. 27A to 27E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 27A to 27E are not limited to the above, and the electronic devices may have other functions.

Figure 27A:
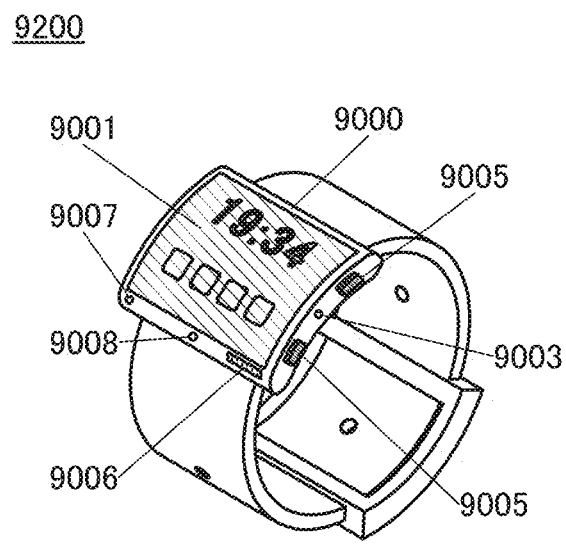
FIGS. 27A to 27E illustrate examples of electronic devices.
Figure 27B:
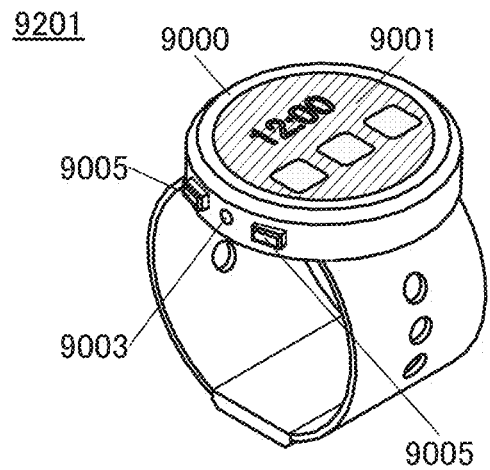

FIG. 27A is a perspective view of a watch-type portable information terminal 9200. FIG. 27B is a perspective view of a watch-type portable information terminal 9201.

The portable information terminal 9200 illustrated in FIG. 27A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 27A, the display surface of the display portion 9001 is not curved in the portable information terminal 9201 illustrated in FIG. 27B. Furthermore, the external state of the display portion of the portable information terminal 9201 is a non-rectangular shape (a circular shape in FIG. 27B).

Figure 27C:
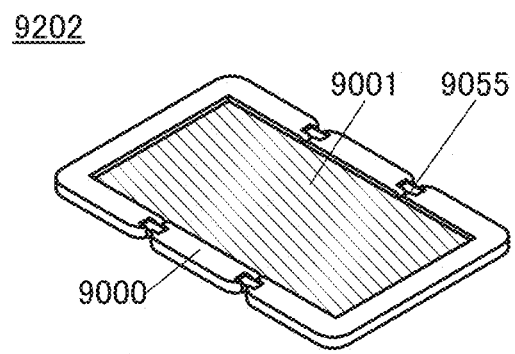
Figure 27D:
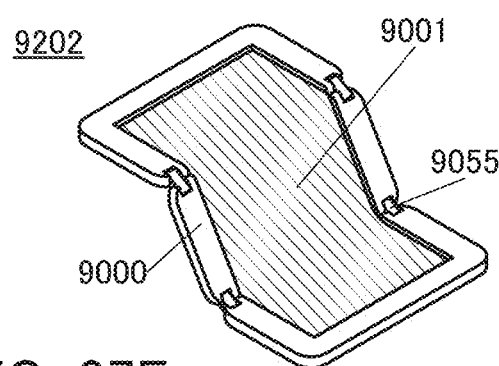
Figure 27E:
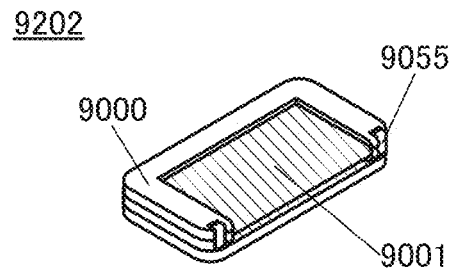

FIGS. 27C to 27E are perspective views of a foldable portable information terminal 9202. FIG. 27C is a perspective view illustrating the portable information terminal 9202 that is opened. FIG. 27D is a perspective view illustrating the portable information terminal 9202 that is being opened or being folded. FIG. 27E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

Example 1

In this example, results of actually manufacturing a device to which one embodiment of the present invention is applied and a device for a comparative example will be described.

Figure 28A:
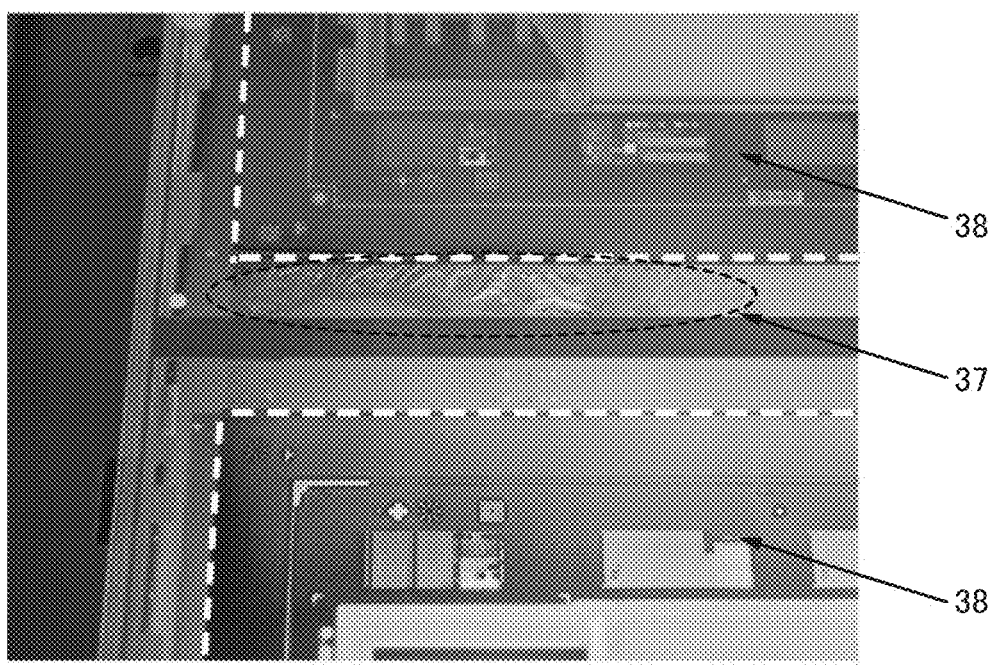
FIG. 28A is a photograph of an appearance of a device manufactured in an example and FIG. 28B is an observation photograph of a cross section of the device.

FIG. 28A is a photograph of the appearance of the device for the comparative example. A region 38 surrounded by a white dotted line is a region where the metal oxide layer 20 and the resin layer 23 are in contact with each other. The region outside the region 38 is a region where the metal oxide layer 20 and the insulating layer 31 are in contact with each other. The device for the comparative example has a feature of being widely provided with a region where the metal oxide layer 20 and the insulating layer 31 are in contact with each other. Film separation occurred in a region 37 surrounded by a dashed line in this region.

Film separation did not occur in the region 38 but in the region 37. In view of this, the film separation occurred probably because the adhesion between the metal oxide layer 20 and the insulating layer 31 was low.

Figure 28B:
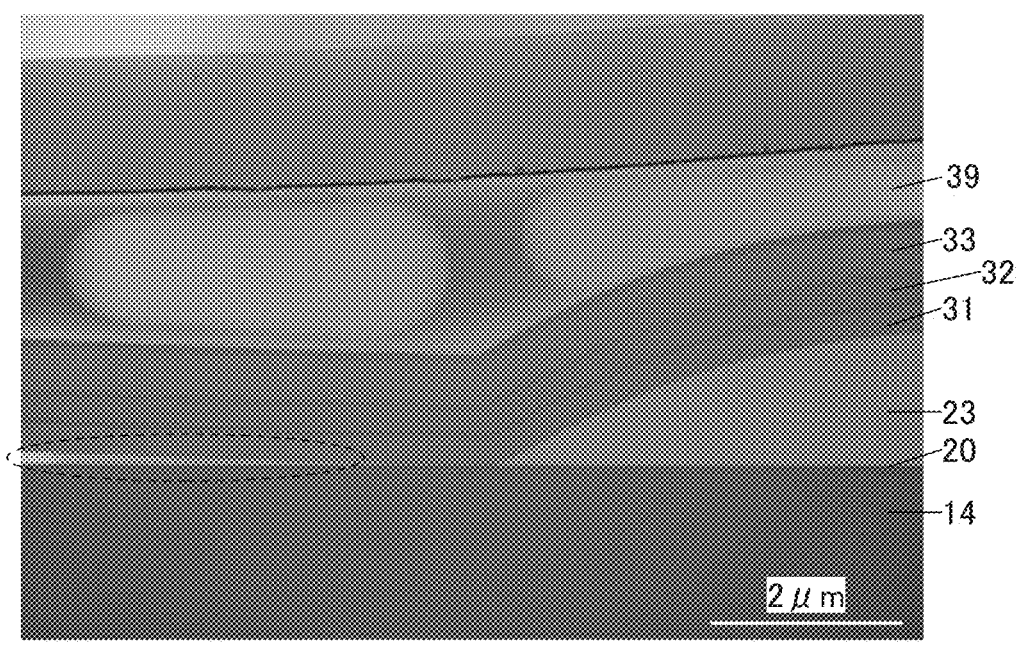

FIG. 28B is an observation photograph of a cross section of the device for the comparative example.

In the stacked-layer structure in FIG. 28B, the metal oxide layer 20 is provided over the formation substrate 14 and the island-shaped resin layer 23 is provided over the metal oxide layer 20. The insulating layer 31 is provided over the metal oxide layer 20 and the resin layer 23. The insulating layer 32 and the insulating layer 33 are provided over the insulating layer 31 and a protective film 39 for cross-sectional observation is provided over the insulating layer 33.

FIG. 28B shows that the insulating layer 31 was separated at the interface between the metal oxide layer 20 and the insulating layer 31. Furthermore, the insulating layer 31 was not separated in a portion where the insulating layer 31 is in contact with the resin layer 23.

Here, the metal oxide layer 20 is a titanium oxide film, the resin layer 23 is a polyimide resin film, and the insulating layer 31 is a silicon oxynitride film. Thus, it is considered that the adhesion between the titanium oxide film and the silicon oxynitride film is lower than the adhesion between the polyimide resin film and the silicon oxynitride film.

These results showed that when the region where the metal oxide layer 20 and the insulating layer 31 are in contact with each other was provided widely, the film separation occurred because of the low adhesion between the metal oxide layer 20 and the insulating layer 31, thereby causing reduced yield.

Next, results of manufacture of the device including the stacked structure of one embodiment of the present invention, which is shown in FIGS. 2A and 2B is described. The device has a structure in which a transistor and the like are formed over the stacked structure shown in FIGS. 2A and 2B.

Figure 29:
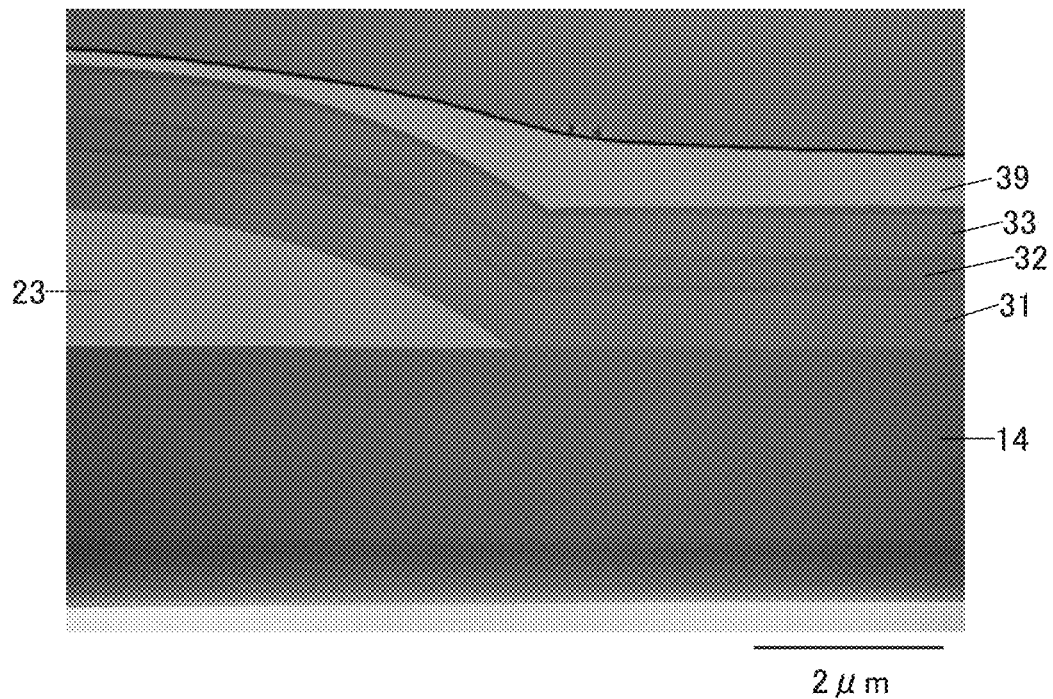
FIG. 29 is an observation photograph of a cross section of a device manufactured in an example.

An observation photograph of a cross section of the device to which one embodiment of the present invention is applied is shown in FIG. 29.

The device to which one embodiment of the present invention was applied was provided with the island-shaped metal oxide layer and the island-shaped resin layer 23 over the formation substrate 14 like the device for the comparative example. The resin layer 23 was provided to cover an end portion of the metal oxide layer. FIG. 29 shows an observation photograph of a cross section of an end portion of the resin layer 23 and the vicinity thereof. The end portion of the resin layer 23 was sufficiently located outward from the end portion of the metal oxide layer; thus, the metal oxide layer was not observed in FIG. 29. Furthermore, the device to which one embodiment of the present invention was applied was provided with the insulating layer 31 over the resin layer 23 like the device for the comparative example. The insulating layer 32 and the insulating layer 33 were provided over the insulating layer 31 and the protective film 39 for cross-sectional observation was provided over the insulating layer 33.

In the manufacture of the device to which one embodiment of the present invention was applied, the process was completed normally without the occurrence of film separation even in the step in a manufacture of the device for the comparative example in which film separation occurred.

In one embodiment of the present invention, by covering the end portion of the metal oxide layer 20 with the resin layer 23, the region where the metal oxide layer 20 is in contact with the insulating layer 31 was reduced. It was found that this can prevent generation of an interface with low adhesion and film separation. Accordingly, it was found that the device can be manufactured with high yield.

REFERENCE NUMERALS

10A: display device, 10B: display device, 13: adhesive layer, 14: formation substrate, 19: metal layer, 20: metal oxide layer, 22: substrate, 23: resin layer, 24: first layer, 25: layer to be separated, 28 adhesive layer, 29: substrate, 31: insulating layer, 32: insulating layer, 33: insulating layer, 34: insulating layer, 35: insulating layer, 37: region, 38: region, 39: protective film, 40: transistor, 41: conductive layer, 43a: conductive layer, 43b: conductive layer, 43c: conductive layer, 44: metal oxide layer, 45: conductive layer, 49: transistor, 55: laser light, 60: light-emitting element, 61: conductive layer, 62: EL layer, 63: conductive layer, 64: cut, 65: instrument, 74: insulating layer, 75: protective layer, 75a: substrate, 75b: adhesive layer, 76: connector, 80: transistor, 81: conductive layer, 82: insulating layer, 83: metal oxide layer, 84: insulating layer, 85: conductive layer, 86a: conductive layer, 86b: conductive layer, 86c: conductive layer, 91: formation substrate, 92: metal oxide layer, 93: resin layer, 95: insulating layer, 96: partition, 97: coloring layer, 98: light-blocking layer, 99: adhesive layer, 112: liquid crystal layer, 113 electrode, 115: insulating layer, 117: insulating layer, 121: insulating layer, 131: coloring layer, 132: light-blocking layer, 133a: alignment film, 133b: alignment film, 134: coloring layer, 135: polarizing plate, 140: transistor, 141: adhesive layer, 142: adhesive layer, 170 light-emitting element, 180: liquid crystal element, 191: electrode, 192: EL layer, 193: electrode, 194: insulating layer, 201: transistor, 203: transistor, 204: connection portion, 205: transistor, 206: transistor, 207: connection portion, 211: insulating layer, 212: insulating layer, 213: insulating layer, 214: insulating layer, 215: insulating layer, 216: insulating layer, 217: insulating layer, 220: insulating layer, 220a: insulating layer, 220b: insulating layer, 221a: conductive layer, 221b: conductive layer, 222a: conductive layer, 222b: conductive layer, 223: conductive layer, 224: conductive layer, 225: insulating layer, 226: covering film, 227: lens, 228: conductive layer, 231: semiconductor layer, 232 insulating layer, 233: diffusion film, 234a: conductive layer, 234b: conductive layer, 234c: insulating layer, 234d: insulating layer, 235: substrate, 242: connection layer, 243: connector, 252: connection portion, 300A: display device, 310A: input/output device, 311a: electrode, 311b: electrode, 311c: electrode, 351: substrate, 361: substrate, 362: display portion, 364: circuit, 365: wiring, 372: FPC, 373: IC, 381: display portion, 382: driver circuit portion, 451: opening, 640: processing region, 800: portable information terminal, 801: housing, 802: housing, 803: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 9000: housing, 9001: display portion, 9003: speaker, 9005: operation key, 9006: connection terminal, 9007: sensor, 9008: microphone, 9055: hinge, 9200: portable information terminal, 9201: portable information terminal, and 9202: portable information terminal.

This application is based on Japanese Patent Application Serial No. 2016-215737 filed with Japan Patent Office on Nov. 3, 2016, the entire contents of which are hereby incorporated by reference.

The invention claimed is:

1. A method for manufacturing a semiconductor device, comprising the steps of:
    forming a metal oxide layer over a first substrate;
    forming a resin layer over and in contact with the metal oxide layer to cover end portions of the metal oxide layer;
    forming an insulating layer over the resin layer to cover end portions of the resin layer, wherein the insulating layer has a first part being in contact with the first substrate and a second part being in contact with the resin layer; and
    separating a stack including the resin layer and the second part of the insulating layer from the metal oxide layer by performing irradiation with light.

2. The method for manufacturing a semiconductor device according to claim 1, further comprising the step of:
    forming an adhesive layer over the insulating layer to overlap with the metal oxide layer and the resin layer and to have an end portion located inward from the end portion of the metal oxide layer before the step of separating the stack.

3. The method for manufacturing a semiconductor device, according to claim 2, further comprising the step of:
    forming a partition having a frame shape over the resin layer before forming the adhesive layer, wherein the adhesive layer is formed to be located inward from the partition.

4. The method for manufacturing a semiconductor device, according to claim 1, wherein the resin layer comprises a region with a thickness of greater than or equal to 0.1 μm and less than or equal to 5 μm.

5. The method for manufacturing a semiconductor device, according to claim 1,
wherein the light is a laser light, and
wherein an interface between the metal oxide layer and the resin layer is irradiated with the laser light in the step of separating the stack.

6. The method for manufacturing a semiconductor device, according to claim 1, wherein the light has a wavelength of greater than or equal to 180 nm and less than or equal to 450 nm.

7. The method for manufacturing a semiconductor device, according to claim 1, wherein the light has a wavelength of 308 nm.

8. The method for manufacturing a semiconductor device, according to claim 1, wherein the light is a linear laser light.

9. The method for manufacturing a semiconductor device, according to claim 1, wherein the irradiation with the light is performed at an energy density of greater than or equal to 250 mJ/cm$^2$ and less than or equal to 360 mJ/cm$^2$.

10. The method for manufacturing a semiconductor device, according to claim 1, wherein the metal oxide layer comprises one or more of titanium, molybdenum, aluminum, tungsten, silicon, indium, zinc, gallium, tantalum, and tin.

11. The method for manufacturing a semiconductor device, according to claim 1, wherein the metal oxide layer comprises titanium.

12. A method for manufacturing a semiconductor device, comprising the steps of:
forming a first metal oxide layer and a second metal oxide layer over a first substrate;
forming a first resin layer over and in contact with the first metal oxide layer to cover end portions of the first metal oxide layer and a second resin layer over and in contact with the second metal oxide layer to cover end portions of the second metal oxide layer;
forming an insulating layer over the first resin layer and the second resin layer to cover end portions of the first resin layer and end portions of the second resin layer,
wherein the insulating layer has a first part being in contact with the first substrate, a second part being in contact with the first resin layer, a third part being in contact with the second resin layer; and
separating a first stack including the first resin layer and the second part of the insulating layer from the first metal oxide layer and a second stack including the second resin layer and the third part of the insulating layer from the second metal oxide layer by performing irradiation with light.

13. The method for manufacturing a semiconductor device, according to claim 12, wherein the first resin layer and the second resin layer each comprise a region with a thickness of greater than or equal to 0.1 μm and less than or equal to 5 μm.

14. The method for manufacturing a semiconductor device, according to claim 12,
wherein the light is a laser light, and
wherein an interface between the first metal oxide layer and the first resin layer is irradiated with the laser light in the step of separating the first stack.

15. The method for manufacturing a semiconductor device, according to claim 12, wherein the light has a wavelength of greater than or equal to 180 nm and less than or equal to 450 nm.

16. The method for manufacturing a semiconductor device, according to claim 12, wherein the light has a wavelength of 308 nm.

17. The method for manufacturing a semiconductor device, according to claim 12, wherein the light is a linear laser light.

18. The method for manufacturing a semiconductor device, according to claim 12, wherein the irradiation with the light is performed at an energy density of greater than or equal to 250 mJ/cm$^2$ and less than or equal to 360 mJ/cm$^2$.

19. The method for manufacturing a semiconductor device, according to claim 12, wherein the first metal oxide layer and the second metal oxide layer each comprise one or more of titanium, molybdenum, aluminum, tungsten, silicon, indium, zinc, gallium, tantalum, and tin.

20. The method for manufacturing a semiconductor device, according to claim 12, wherein the first metal oxide layer and the second metal oxide layer each comprise titanium.

* * * * *